US012528652B2

(12) United States Patent
Sung

(10) Patent No.: US 12,528,652 B2
(45) Date of Patent: Jan. 20, 2026

(54) PRE-JIG WAFER CARRIER DISC INSTALLATION/UNINSTALLATION DEVICE AND METHOD THEREOF

(71) Applicant: KINGTEK ELECTRONICS TECHNOLOGY CORP., Zhubei (TW)

(72) Inventor: Mao-Yen Sung, Zhubei (TW)

(73) Assignee: Kingtek Elec-Technology Co., Ltd., Zhubei (TW)

( * ) Notice: Subject to any disclaimer, the term of this patent is extended or adjusted under 35 U.S.C. 154(b) by 791 days.

(21) Appl. No.: 17/812,187

(22) Filed: Jul. 13, 2022

(65) Prior Publication Data

US 2023/0016132 A1    Jan. 19, 2023

(30) Foreign Application Priority Data

Jul. 15, 2021   (TW) ................................. 110126134
Jul. 15, 2021   (TW) ................................. 110126135

(51) Int. Cl.
*B65G 47/90*      (2006.01)
*H01L 21/67*      (2006.01)
*H01L 21/673*     (2006.01)
*H01L 21/68*      (2006.01)

(52) U.S. Cl.
CPC ........ *B65G 47/90* (2013.01); *H01L 21/67265* (2013.01); *H01L 21/67346* (2013.01); *H01L 21/681* (2013.01)

(58) Field of Classification Search
CPC .............. B65G 47/90; H01L 21/67265; H01L 21/67346; H01L 21/681
See application file for complete search history.

(56) References Cited

U.S. PATENT DOCUMENTS

| | | | | |
|---|---|---|---|---|
| 5,174,067 A | * | 12/1992 | Hasegawa | ......... H01L 21/67023 414/217 |
| 9,026,244 B1 | * | 5/2015 | Mazzocco | ................. G06T 7/66 700/229 |
| D767,233 S | * | 9/2016 | Raschke | ........................ D34/29 |
| 10,847,347 B2 | * | 11/2020 | Noorbakhsh | ..... H01L 21/68735 |
| 2007/0283884 A1 | * | 12/2007 | Tiller | ................ H01J 37/32623 118/715 |

(Continued)

*Primary Examiner* — Kyle O Logan

(74) *Attorney, Agent, or Firm* — Rosenberg, Klein & Lee

(57) ABSTRACT

A pre-jig wafer carrier disc installation/uninstallation device and a method thereof, including a first displacement mechanism, a wafer frame installation/uninstallation mechanism, a wafer installation/uninstallation mechanism, a mask installation/uninstallation mechanism and a robotic arm arranged around the first displacement mechanism. The said mechanisms sequentially stack the wafer frame, the wafer and the mask on the first displacement mechanism to form an assembly. An installation/uninstallation mechanism is disposed at a movable end of the robotic arm. The robotic arm drives the installation/uninstallation mechanism to remove and lock the assembly on an assembly carrier section of a carrier disc for successive processing. After the wafers are processed, the robotic arm drives the installation/uninstallation mechanism to move the assembly back onto the first displacement mechanism. The said mechanisms sequentially disassemble the assembly and recover the mask, the wafer and the wafer frame.

21 Claims, 43 Drawing Sheets

(56) References Cited

U.S. PATENT DOCUMENTS

| | | | |
|---|---|---|---|
| 2015/0314971 A1* | 11/2015 | Mazzocco | B65G 65/00 |
| | | | 414/222.01 |
| 2015/0334812 A1* | 11/2015 | Mazzocco | H01L 21/67742 |
| | | | 414/800 |
| 2019/0043697 A1* | 2/2019 | Joubert | H01J 37/32642 |
| 2021/0183629 A1* | 6/2021 | Oshima | H01J 37/32715 |
| 2023/0016132 A1* | 1/2023 | Sung | H01L 21/67265 |

* cited by examiner

PRE-JIG WAFER CARRIER DISC INSTALLATION/UNINSTALLATION DEVICE AND METHOD THEREOF

BACKGROUND OF THE INVENTION

1. Field of the Invention

The present invention relates generally to a pre-jig wafer carrier disc installation/uninstallation device and a method thereof, and more particularly to an installation/uninstallation device and a method thereof, which utilizes simple mechanisms and operation to respectively assemble the wafer frame, the wafer and the mask into an assembly. The assembly is accurately moved and secured on a carrier disc in different positions. After the wafer is completely processed, assembly on the carrier disc is moved back and disassembled into the wafer frame, the wafer and the mask, which are respectively recovered.

2. Description of the Related Art

In general, the manufacturing process of integrated circuit (IC) includes two major parts: manufacturing of silicon wafer, manufacturing of integrated circuit and packaging of integrated circuit. After the silicon ingot is cut into wafers, the wafer must experience multiple complicated procedures of lithography, crystal growth, etching, mechanical grinding, etc. to complete the manufacturing of the integrated circuit. In the above manufacturing process, when the wafer goes through the procedures of test, washing, evaporation, drying and organic solvent soaking, in order to effectively secure the wafer for easy processing and mass-process the wafers at higher processing efficiency, generally multiple wafers are secured on a large-area carrier disc. The carrier disc bears the respective wafers to perform the aforesaid processing operations at the same time.

The basic structure of a common carrier disc is a convex (or concave) disc body structure with a large area. Multiple hollow sections are formed on the carrier disc for receiving wafers. In addition, multiple holders are disposed around the hollow sections for securing the wafers. When the wafers are held and secured by the holders on the upper sides of the hollow sections (the outward convex surface of the convex face or the inward concave surface of the concave face), the sections of the wafers to be processed are exposed to outer sides through the hollow sections. Therefore, multiple wafers can be received in the carrier disc and moved at the same time for different processing procedures so as to effectively enhance the processing efficiency of the wafers as a whole.

With the gradual popularization of automatic mechanical processing, various automatic machines are used to perform the taking/placing operation of the wafers on the carrier disc. This not only greatly saves labor, but also lowers the production cost and enhances the processing efficiency. There is a trend to utilize the automatic machines to perform the taking/placing operation of the wafers.

However, the wafer itself is extremely fragile and requires very high processing precision. Therefore, the operation precision of the relevant removing mechanisms for taking/placing the wafers is extremely highly required. Also, when multiple removing mechanisms are used to respectively perform the assembling/disassembling operations of the wafers and the relevant components, the respective removing mechanisms must be precisely connected with each other. Otherwise, the assembling precision of the entire removing mechanisms and the quality of the products will be greatly affected. In some serious cases, the semi-products are even damaged. Therefore, it is critical how to effectively correct the respective removing mechanisms so as to ensure that any single removing mechanism can keep excellent precision in removing operation of different articles as well as the different removing mechanisms are excellently relatively movably connected with each other. This can ensure the precision of the operational connection between the respective removing mechanisms when removing the same article.

It is therefore tried by the applicant to provide a pre-jig wafer carrier disc installation/uninstallation device and a method thereof to satisfy the above practical requirements for removing the wafers and relevant components on the carrier disc and disassembling and recovering the assembly on the carrier disc.

SUMMARY OF THE INVENTION

It is therefore a primary object of the present invention to provide a pre-jig wafer carrier disc installation/uninstallation device and a method thereof. The pre-jig wafer carrier disc installation/uninstallation device includes a first displacement mechanism, a wafer frame installation/uninstallation mechanism, a wafer installation/uninstallation mechanism, a mask installation/uninstallation mechanism and a second displacement mechanism arranged around the first displacement mechanism. A robotic arm is disposed between the first and second displacement mechanisms. The first displacement mechanism has a reciprocally movable first seat body. A pre-jig uninstallation section is disposed on the first seat body. A movable carrier disc is disposed on the second displacement mechanism. Multiple assembly carrier sections are disposed on the carrier disc. An installation/uninstallation mechanism is disposed at a movable end of the robotic arm. The wafer frame installation/uninstallation mechanism serves to place a wafer frame in the pre-jig uninstallation section. The wafer installation/uninstallation mechanism serves to place a wafer in the wafer frame. The mask installation/uninstallation mechanism serves to place a mask in the wafer frame and overlay the mask on the wafer to form an assembly. The circumference of the wafer is securely held between the circumferences of the wafer frame and the mask so that the wafer can keep a good plainness in the assembly. The robotic arm serves to drive the installation/uninstallation mechanism to remove the assembly from the first seat body and lock the assembly on the assembly carrier section on the carrier disc to be assembled for successive processing. After the wafers are completely processed, the robotic arm drives the installation/uninstallation mechanism to move the assembly on the carrier disc back to the first seat body. The mask installation/uninstallation mechanism, the wafer installation/uninstallation mechanism and the wafer frame installation/uninstallation mechanism sequentially disassemble the assembly and recover the mask, the wafer and the wafer frame. The above structure is simplified and the cost for the structure is lowered so that the cost for establishing the device is effectively lowered and the assembling efficiency is enhanced.

It is a further object of the present invention to provide the above pre-jig wafer carrier disc installation/uninstallation device and the method thereof. An image capturing assembly is additionally disposed at the movable end of the robotic arm for capturing image. Multiple rangefinder components are arranged around the installation/uninstallation mechanism. The installation/uninstallation mechanism approaches the assembly carrier section to be assembled by the direction and angle of a preset installation/uninstallation standard value to adjust the position of the installation/uninstallation mechanism. The respective rangefinder components are used to measure the distances between the rangefinder components and the circumference of the assembly carrier sections to be assembled and ensure the distances are equal to each other so as to correct the inclination angle of the installation/uninstallation operation face of the installation/ uninstallation mechanism. Accordingly, the installation/uninstallation mechanism can correspond to the assembly carrier section to be assembled in parallel thereto (with the same inclination angle). The image capturing assembly approaches the assembly carrier section to be assembled by a direction and inclination angle identical to the direction and inclination angle and direction of the installation/uninstallation operation face after corrected and directly captures images. Then the position of the image capturing assembly is adjusted to forward accurately correspond to the assembly carrier section to be assembled so as to correct the position of the image capturing face of the image capturing assembly. Also, by means of the data of the position of the image capturing face after corrected, the position of the installation/uninstallation mechanism is corrected, whereby the installation/uninstallation operation face of the installation/uninstallation mechanism can forward accurately correspond to the assembly carrier section to be assembled and the peripheral components thereof.

It is still a further object of the present invention to provide the above pre-jig wafer carrier disc installation/uninstallation device and the method thereof. Multiple oppositely movable holding slide seats are disposed on a top face of the first seat body around the pre-jig uninstallation section. Each holding slide seat has a poor-light surface. In addition, a recessed arcuate section is disposed on one side of each holding slide seat, which side is directed to the pre-jig uninstallation section. Moreover, an image capturing unit is disposed beside the first displacement mechanism. When the image capturing unit obtains the image of the wafer moved to upper side of the wafer frame, the two holding slide seats are cooperatively moved toward each other, whereby the two recessed arcuate sections are combined to form a hole with poor-light effect. Accordingly, the wafer can be easily corrected to correspond to the wafer frame to facilitate the successive operation of precisely placing the wafer into the wafer frame.

It is still a further object of the present invention to provide the above pre-jig wafer carrier disc installation/uninstallation device and the method thereof. The second displacement mechanism is disposed beside the first displacement mechanism and drivable by the control module. The second displacement mechanism serves to drive the carrier disc to reciprocally move and pivotally rotate, whereby the carrier disc can be moved from a position where the assembly can be easily placed to a fixed removing operation position near the first displacement mechanism. In addition, the respective assemblies on the carrier disc can be respectively moved to a position to be removed near the moving range of the robotic arm so as to enhance the operation efficiency as a whole.

The present invention can be best understood through the following description and accompanying drawings, wherein:

DETAILED DESCRIPTION OF THE PREFERRED EMBODIMENTS

Figure 1:
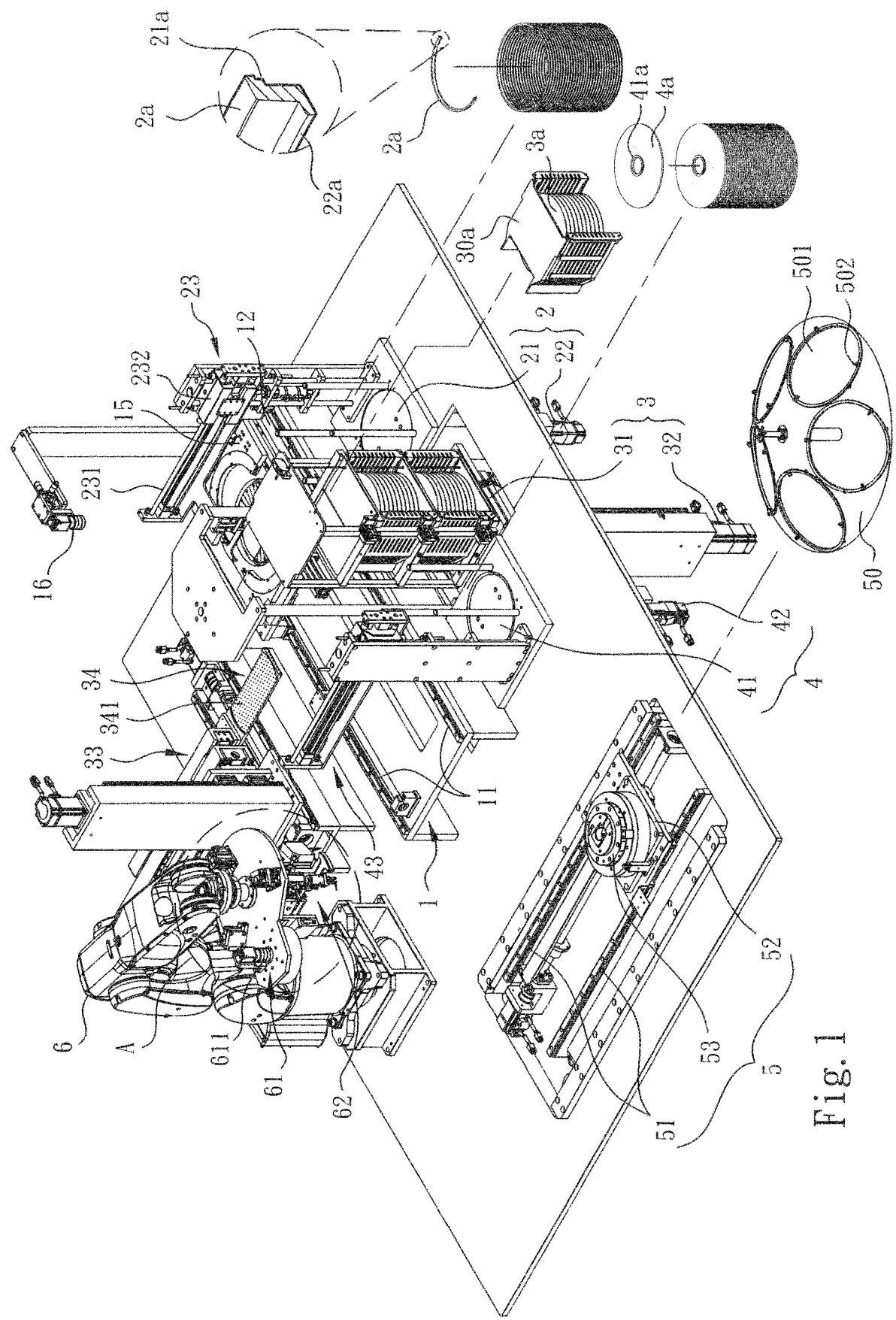
FIG. 1 is a perspective exploded view of the entire structure and relevant components of the present invention.
Figure 2:
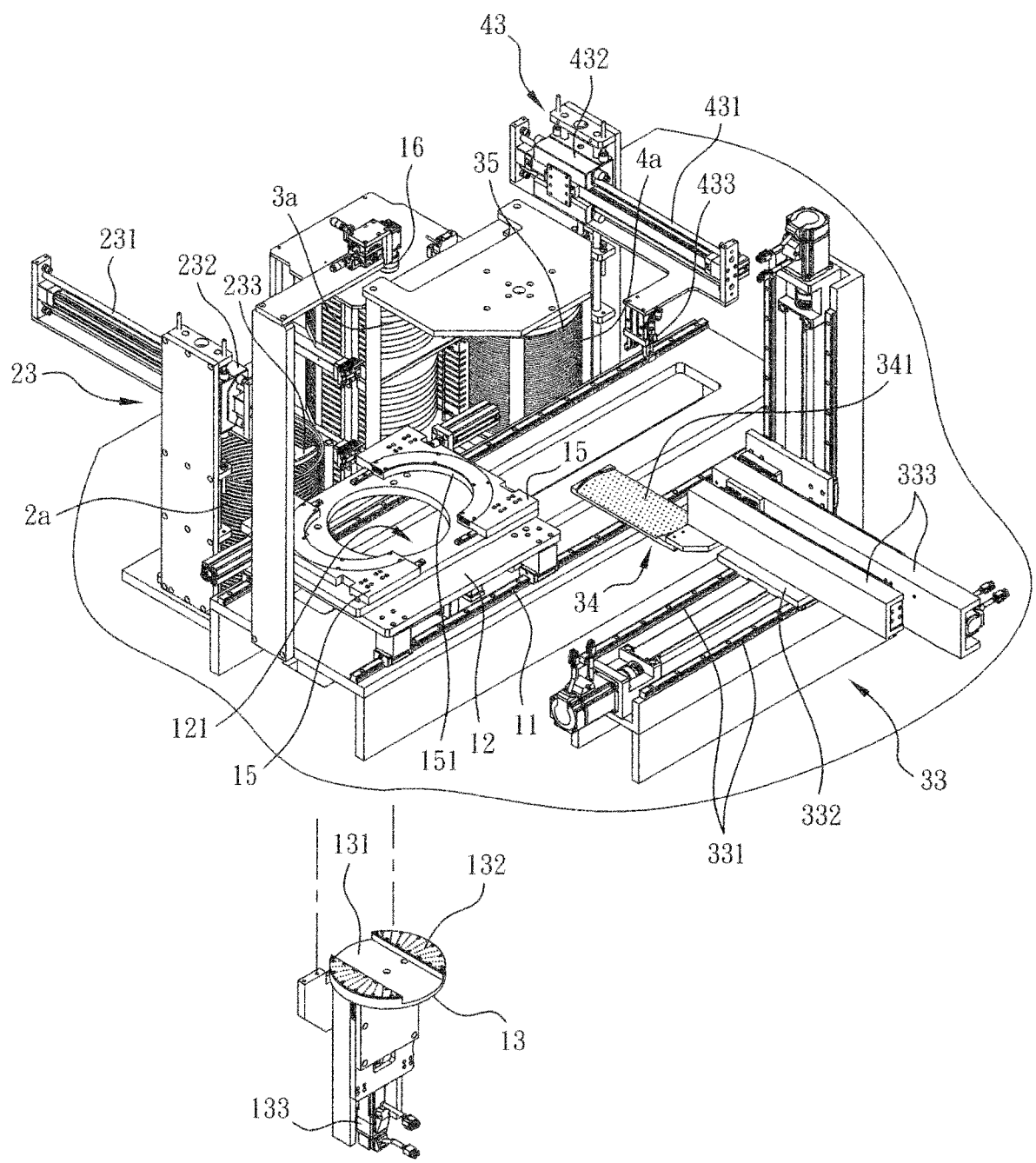
FIG. 2 is a perspective view of a part of the structure of the present invention, showing the structures of the first seat body and the relevant support seat.
Figure 3:
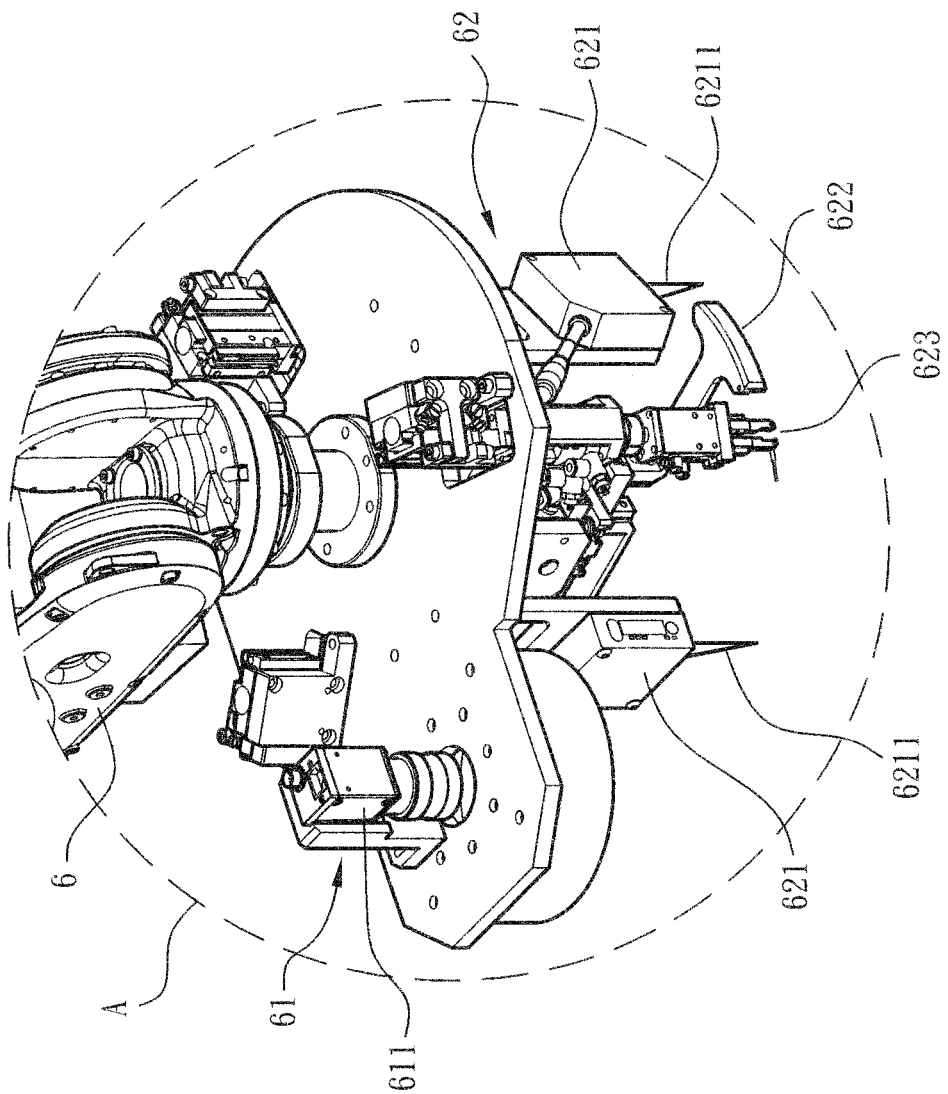
FIG. 3 is an enlarged view of circled area A of FIG. 1, showing the structures of the image capturing assembly and the installation/uninstallation mechanism disposed on the robotic arm.

Please refer to FIGS. 1 to 3. The main structure of the present invention includes a first displacement mechanism 1, a wafer frame installation/uninstallation mechanism 2, a wafer installation/uninstallation mechanism 3, a mask installation/uninstallation mechanism 4, a second displacement mechanism 5 and a robotic arm 6. The first displacement mechanism 1 is connected with and drivable by a control module, (which can be a computer with operation function, not shown). The first displacement mechanism 1 has multiple first guide rails 11 extending in parallel to each other and a first seat body 12 reciprocally movably disposed on the first guide rails 11. A pre-jig uninstallation section 121, (which can be a hollow hole), is disposed on the first seat body 12. A support seat 13 is disposed in the pre-jig uninstallation section 121. The support seat 13 is drivable by a support seat lifting assembly 133 to ascend/descend. A channel 131 is formed on atop face of the support seat 13. Multiple air-sucking orifices 132 are arranged on two sides of the channel 131 for sucking air.

In a preferred embodiment, multiple oppositely reciprocally movable holding slide seats 15 are disposed on a top face of the first seat body 12 around the pre-jig uninstallation section 121. Each holding slide seat 15 has a poor-light surface on top side. In addition, a recessed arcuate section 151 is disposed on one side of each holding slide seat 15, which side is directed to the pre-jig uninstallation section 121. Moreover, an image capturing unit 16 is disposed above the first guide rails 11 for capturing images.

The wafer frame installation/uninstallation mechanism 2 is disposed on one side of the first guide rails 11. The wafer frame installation/uninstallation mechanism 2 is connected with and drivable by the control module (not shown). The wafer frame installation/uninstallation mechanism 2 has a wafer frame rest seat 21 for supporting a stack of wafer frames 2a. The wafer frame installation/uninstallation mechanism 2 further has a wafer frame lifting assembly 22 disposed under the wafer frame rest seat 21 for supporting the wafer frame rest seat 21. The wafer frame lifting assembly 22 serves to drive the wafer frame rest seat 21 to ascend/descend. A wafer frame removing assembly 23 is disposed on one side of the wafer frame rest seat 21. The wafer frame removing assembly 23 has a wafer frame removing slide seat 232, which can ascend/descend. A transversely reciprocally movable wafer frame removing guide rail 231 is disposed on the wafer frame removing slide seat 232. A set of holding components 233, which can be oppositely opened and closed, are disposed on the wafer frame removing guide rail 231.

In a preferred embodiment, an outer flange 21a is annularly disposed on upper side of outer circumference of the wafer frame 2a and an inner flange 22a is annularly disposed on lower side of inner circumference of the wafer frame 2a.

The wafer installation/uninstallation mechanism 3 is disposed on one side of the first guide rails 11. The wafer installation/uninstallation mechanism 3 is connected with and drivable by the control module (not shown). The wafer installation/uninstallation mechanism 3 has a wafer rest seat 31 for supporting multiple wafers 3a. The wafer installation/uninstallation mechanism 3 further has a wafer lifting assembly 32 disposed under the wafer rest seat 31 for supporting the wafer rest seat 31. The wafer lifting assembly 32 serves to drive the wafer rest seat 31 to ascend/descend. An air nozzle 35 is disposed above the wafer rest seat 31. The air nozzle 35 has an air jet hole 351 for downward jetting air. In addition, a wafer removing assembly 33 is disposed on one side of the wafer rest seat 31. The wafer removing assembly 33 has multiple wafer removing guide rails 331 in parallel to the first guide rails 11 and a wafer removing slide seat 332 reciprocally movably disposed on the wafer removing guide rails 331. A vertically movable telescopic assembly 333 is disposed on the wafer removing slide seat 332. A wafer bracket 34 is disposed at a movable end of the telescopic assembly 333. Multiple air sucking orifices 341 are disposed on a top face of the wafer bracket 34 for sucking air.

In a preferred embodiment, the outer diameter of the wafer 3a is slightly smaller than the inner diameter of the wafer frame 2a. A predetermined number of wafers 3a can be previously received in a wafer cartridge 30a at intervals. Then the wafer cartridge 30a is placed on the wafer rest seat 31 for easily removing the wafers 3a.

The mask installation/uninstallation mechanism 4 is disposed on one side of the first guide rails 11. The mask installation/uninstallation mechanism 4 is connected with and drivable by the control module (not shown). The mask installation/uninstallation mechanism 4 has a mask rest seat 41 for supporting a stack of masks 4a and a mask lifting assembly 42 disposed under the mask rest seat 41 for supporting the mask rest seat 41. The mask lifting assembly 42 serves to drive the mask rest seat 41 to ascend/descend. A mask removing assembly 43 is disposed on one side of the mask rest seat 41. The mask removing assembly 43 has a vertically movable mask removing slide seat 432. A transversely reciprocally movable mask removing guide rail 431 is disposed on the mask removing slide seat 432. A set of holding claws 433, which can be oppositely opened and closed, are disposed on the mask removing guide rail 431.

In a preferred embodiment, the mask 4a is a plate-shaped body with an outer diameter approximately equal to the outer diameter of the wafer 3a. The mask 4a has an annular raised section 41a at the center for the holding claws 433 to hold.

The second displacement mechanism 5 is transversely disposed beside an end section of the first guide rails 11. The second displacement mechanism 5 is connected with and drivable by the control module (not shown). The second displacement mechanism 5 has multiple second guide rails 51 extending in parallel to each other and a second seat body 52 reciprocally movably disposed on the second guide rails 51. A pivotally rotatable assembly 53 is disposed on the second seat body 52. A carrier disc 50 is connected and positioned on the pivotally rotatable assembly 53.

In a preferred embodiment, the carrier disc 50 is a disc-shaped structure body with a convex face. Multiple assembly carrier sections 501, (which can be hollow sections), are disposed on a surface of the carrier disc 50. Multiple holders 502 are respectively disposed on the circumferences of the assembly carrier sections 501 (the hollow sections).

The robotic arm 6 is disposed between the first and second displacement mechanisms 1, 5. The robotic arm 6 is connected with and drivable by the control module (not shown). An image capturing assembly 61 and an installation/uninstallation mechanism 62 are disposed at a movable end of the robotic arm 6. The image capturing assembly 61 has an image capturing component 611 for capturing images. The installation/uninstallation mechanism 62 has two holding components 622, which can be oppositely opened and closed, multiple holder operation components 623 corresponding to the holders 502 and multiple rangefinder components 621. The multiple rangefinder components 621 can be respectively disposed at at least three points of the circumference of the installation/uninstallation mechanism 62 to generate range finding laser beams 6211.

Figure 4:
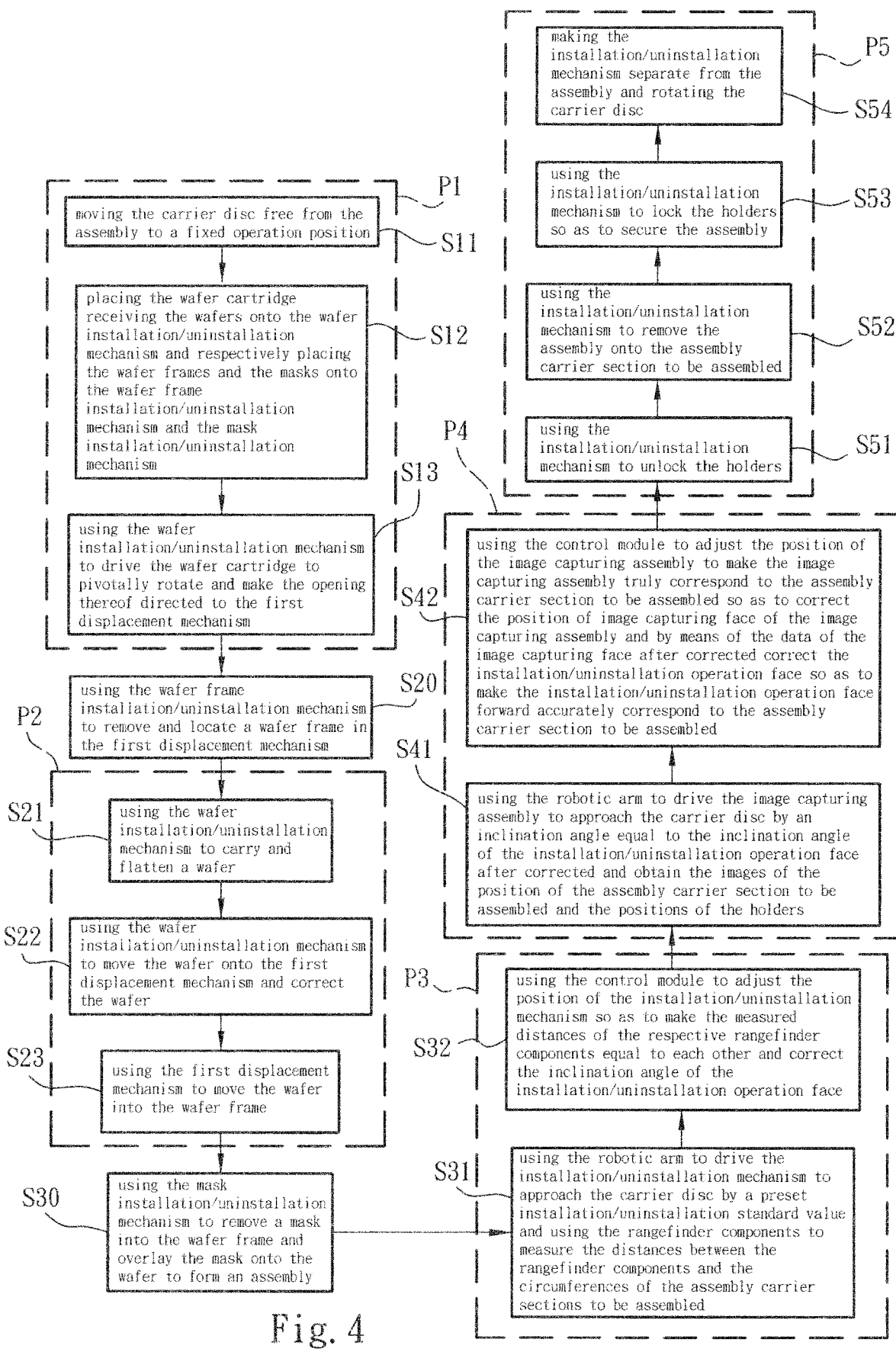
FIG. 4 is a flow chart of the installation method of the present invention.

Please refer to FIG. 4. The installation operation method of the present invention includes procedure P1 of respectively positioning the carrier disc, the wafer frames, the wafers and the masks infixed positions, step S20 of using the wafer frame installation/uninstallation mechanism to remove and locate a wafer frame in the first displacement mechanism, procedure P2 of using the wafer installation/uninstallation mechanism to remove a wafer into the wafer frame, step S30 of using the mask installation/uninstallation mechanism to remove a mask into the wafer frame and overlay the mask onto the wafer to form an assembly, procedure P3 of using the installation/uninstallation mechanism to correct the installation/uninstallation operation face, procedure P4 of using the image capturing assembly to check the image of the circumference of the assembly carrier section on the carrier disc, which is to be assembled and correct the image capturing face and procedure P5 of using the installation/uninstallation mechanism to remove and lock the assembly on the assembly carrier section to be assembled, wherein:

In procedure P1 of respectively positioning the carrier disc, the wafer frames, the wafers and the masks in fixed positions, a vacant carrier disc 50 is disposed in a fixed predetermined operation (assembling) position and the wafer frames 2a, wafers 3a and masks 4a are respectively disposed in a fixed predetermined material supply position. Procedure P1 sequentially includes step S11 of moving the carrier disc free from the assembly to a fixed operation position, step S12 of placing the wafer cartridge receiving the wafers onto the wafer installation/uninstallation mechanism and respectively placing the wafer frames and the masks onto the wafer frame installation/uninstallation mechanism and the mask installation/uninstallation mechanism and step S13 of using the wafer installation/uninstallation mechanism to drive the wafer cartridge to pivotally rotate and make the opening thereof directed to the first displacement mechanism.

In step S20 of using the wafer frame installation/uninstallation mechanism to remove and locate a wafer frame in the first displacement mechanism, the control module drives the wafer frame installation/uninstallation mechanism 2 to remove a wafer frame 2a from the fixed material supply position into the pre-jig uninstallation section 121 of the first seat body 12, which supports the wafer frame 2a.

In procedure P2 of using the wafer installation/uninstallation mechanism to remove a wafer into the wafer frame, the control module drives the wafer installation/uninstallation mechanism 3 to move a wafer 3a onto the first displacement mechanism 1 for correction and then place the wafer 3*a* into the wafer frame 2*a*. Procedure P2 sequentially includes step S21 of using the wafer installation/uninstallation mechanism to carry and move a wafer and flatten the wafer in the moving process, step S22 of using the wafer installation/uninstallation mechanism to move the wafer onto the first displacement mechanism and correct the wafer and S23 of using the first displacement mechanism to move the wafer into the wafer frame.

In step S30 of using the mask installation/uninstallation mechanism to remove a mask into the wafer frame and overlay the mask onto the wafer to form an assembly, the control module drives the mask installation/uninstallation mechanism 4 to move a mask 4*a* into the wafer frame 2*a* and overlay the mask 4*a* onto the wafer 3*a*, whereby the wafer frame 2*a*, the wafer 3*a* and the mask 4*a* are stacked to form an assembly 20*a*. The circumference of the wafer 3*a* is securely held between the circumferences of the wafer frame 2*a* and the mask 4*a* so that the wafer 3*a* can keep a good plainness in the assembly 20*a*.

In procedure P3 of using the installation/uninstallation mechanism to correct the installation/uninstallation operation face, the control module drives the installation/uninstallation mechanism 62 on the robotic arm 6 to adjust the position and makes the respective rangefinder components 621 measure the distances between the rangefinder components 621 and the circumference of the assembly carrier sections 501 on the carrier disc 50 in a position to be assembled and ensure the distances are equal to each other, whereby the installation/uninstallation mechanism 62 can forward correspond to the assembly carrier sections 501 to be assembled in parallel thereto (with the same inclination angle) so as to correct the inclination angle of the installation/uninstallation operation face of the installation/uninstallation mechanism 62. In addition, the control module stores the data of the installation/uninstallation operation face after corrected. Procedure P3 sequentially includes step S31 of using the robotic arm to drive the installation/uninstallation mechanism to approach the carrier disc by a preset installation/uninstallation standard value and using the rangefinder components to measure the distances between the rangefinder components and the circumferences of the assembly carrier sections to be assembled and step S32 of using the control module to adjust the position of the installation/uninstallation mechanism so as to make the measured distances of the respective rangefinder components equal to each other and correct the inclination angle of the installation/uninstallation operation face of the installation/uninstallation mechanism.

In procedure P4 of using the image capturing assembly to check the image of the circumference of the assembly carrier section on the carrier disc, which is to be assembled and correct the image capturing face, the control module drives the image capturing assembly 61 on the robotic arm 6 to check the images of the circumferences of the assembly carrier sections 501 to be assembled and the images of the respective holders 502 in accordance with the inclination angle and direction of the installation/uninstallation operation face after corrected and adjust the image capturing assembly 61 to truly correspond to the positions of the assembly carrier sections 501 to be assembled and the positions of the holders 502 of the assembly carrier sections 501 so as to correct the positions of the image capturing face of the image capturing assembly 61. In addition, the control module stores the data of the image capturing face after corrected. Also, by means of the data of the image capturing face after corrected, the control module further correct the relative position of the installation/uninstallation operation face so as to make the installation/uninstallation operation face accurately correspond to the positions of the assembly carrier sections 501 to be assembled and the positions of the holders 502 of the assembly carrier sections 501. Procedure P4 sequentially includes step S41 of using the robotic arm to drive the image capturing assembly to approach the carrier disc by an inclination angle equal to the inclination angle of the installation/uninstallation operation face after corrected and obtain the images of the positions of the assembly carrier sections to be assembled and the positions of the holders and step S42 of using the control module to adjust the position of the image capturing assembly to make the image capturing assembly truly correspond to the assembly carrier sections to be assembled so as to correct the position of image capturing face of the image capturing assembly and by means of the data of the image capturing face after corrected to correct the installation/uninstallation operation face so as to make the installation/uninstallation operation face forward accurately correspond to the assembly carrier sections to be assembled.

In procedure P5 of using the installation/uninstallation mechanism to remove and lock the assembly on the assembly carrier section to be assembled, the control module drives the installation/uninstallation mechanism 62 on the robotic arm 6 to remove and lock the assembly 20*a* on the assembly carrier section 501 to be assembled. Procedure P5 sequentially includes step S51 of using the installation/uninstallation mechanism to unlock the holders, step S52 of using the installation/uninstallation mechanism to remove the assembly onto the assembly carrier section to be assembled, step S53 of using the installation/uninstallation mechanism to lock the holders so as to secure the assembly and step S54 of making the installation/uninstallation mechanism separate from the assembly and rotating the carrier disc.

Figure 5:
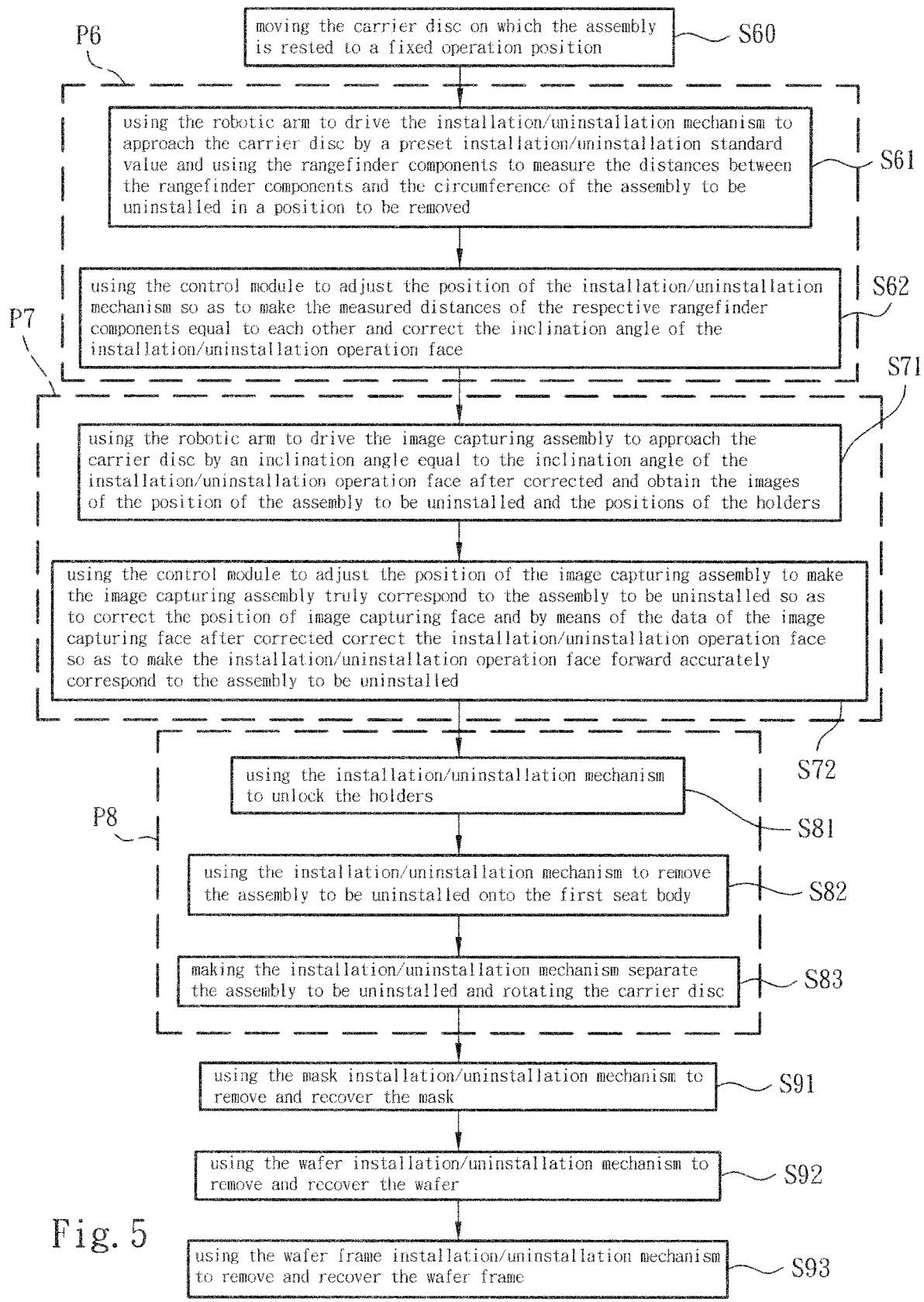
FIG. 5 is a flow chart of the uninstallation method of the present invention.

Please refer to FIG. 5. The uninstallation operation method of the present invention includes step S60 of moving the carrier disc on which the assembly is rested to a fixed operation position, procedure P6 of using the installation/uninstallation mechanism to correct the installation/uninstallation operation face, procedure P7 of using the image capturing assembly to check the image of the assembly on the carrier disc to be uninstalled and correct the image capturing face, procedure P8 of using the installation/uninstallation mechanism to remove the assembly to be uninstalled onto the first displacement mechanism, step S91 of using the mask installation/uninstallation mechanism to remove and recover the mask, step S92 of using the wafer installation/uninstallation mechanism to remove and recover the wafer and step S93 of using the wafer frame installation/uninstallation mechanism to remove and recover the wafer frame, wherein:

In procedure P6 of using the installation/uninstallation mechanism to correct the installation/uninstallation operation face, the control module drives the installation/uninstallation mechanism 62 on the robotic arm 6 to adjust the position and makes the respective rangefinder components 621 measure the distances between the rangefinder components 621 and the circumference of the assembly 20*a* to be uninstalled, which is placed on the carrier disc 50 in a position to be removed and ensure the distances are equal to each other, whereby the installation/uninstallation mechanism 62 can forward correspond to the assembly 20*a* to be uninstalled in parallel thereto (with the same inclination angle) so as to correct the inclination angle of the installation/uninstallation operation face of the installation/uninstallation mechanism 62. In addition, the control module stores the data of the installation/uninstallation operation face after corrected. Procedure P6 sequentially includes step S61 of using the robotic arm to drive the installation/uninstallation mechanism to approach the carrier disc by a preset installation/uninstallation standard value and using the rangefinder components to measure the distances between the rangefinder components and the circumferences of the assembly to be uninstalled in a position to be removed and step S62 of using the control module to adjust the position of the installation/uninstallation mechanism via the robotic arm so as to make the measured distances of the respective rangefinder components equal to each other and correct the inclination angle of the installation/uninstallation operation face of the installation/uninstallation mechanism.

In procedure P7 of using the image capturing assembly to check the image of the assembly on the carrier disc to be uninstalled and correct the image capturing face, the control module drives the image capturing assembly 61 on the robotic arm 6 to check the images of the assembly 20*a* to be uninstalled and the images of the respective holders 502 in accordance with the inclination angle and direction of the installation/uninstallation operation face after corrected and adjust the image capturing assembly 61 to truly correspond to the positions of the assembly 20*a* to be uninstalled and the positions of the holders 502 of the assembly 20*a* so as to correct the positions of the image capturing face of the image capturing assembly 61. In addition, the control module stores the data of the image capturing face after corrected. Also, by means of the data of the image capturing face after corrected, the control module further correct the relative position of the installation/uninstallation operation face so as to make the installation/uninstallation operation face accurately correspond to the positions of the assembly 20*a* to be uninstalled and the positions of the holders 502 of the assembly 20*a*. Procedure P7 sequentially includes step S71 of using the robotic arm to drive the image capturing assembly to approach the carrier disc by an inclination angle equal to the inclination angle of the installation/uninstallation operation face after corrected and obtain the images of the positions of the assembly to be uninstalled and the positions of the holders and step S72 of using the control module to adjust the position of the image capturing assembly via the robotic arm to make the image capturing assembly truly correspond to the assembly to be uninstalled so as to correct the position of image capturing face of the image capturing assembly and by means of the data of the image capturing face after corrected to correct the installation/uninstallation operation face so as to make the installation/uninstallation operation face forward accurately correspond to the assembly to be uninstalled.

In procedure P8 of using the installation/uninstallation mechanism to remove the assembly to be uninstalled onto the first displacement mechanism, the control module drives the installation/uninstallation mechanism 62 on the robotic arm 6 to remove the assembly 20*a* to be uninstalled onto the first seat body 12. Procedure P8 sequentially includes step S81 of using the installation/uninstallation mechanism to unlock the holders, step S82 of using the installation/uninstallation mechanism to remove the assembly to be uninstalled onto the first seat body and step S83 of making the installation/uninstallation mechanism separate the assembly to be uninstalled and rotating the carrier disc.

The above steps will be respectively described hereinafter with reference to FIGS. 6 to 43 to form a practicable embodiment.

First, in step S11 of moving the carrier disc free from the assembly to a fixed operation position, the control module drives the second displacement mechanism 5 to move the second seat body 52 to one end of the respective second guide rails 51 distal from the first displacement mechanism 1 so as to place a vacant carrier disc 50 onto the second seat body 52.

Figure 6:
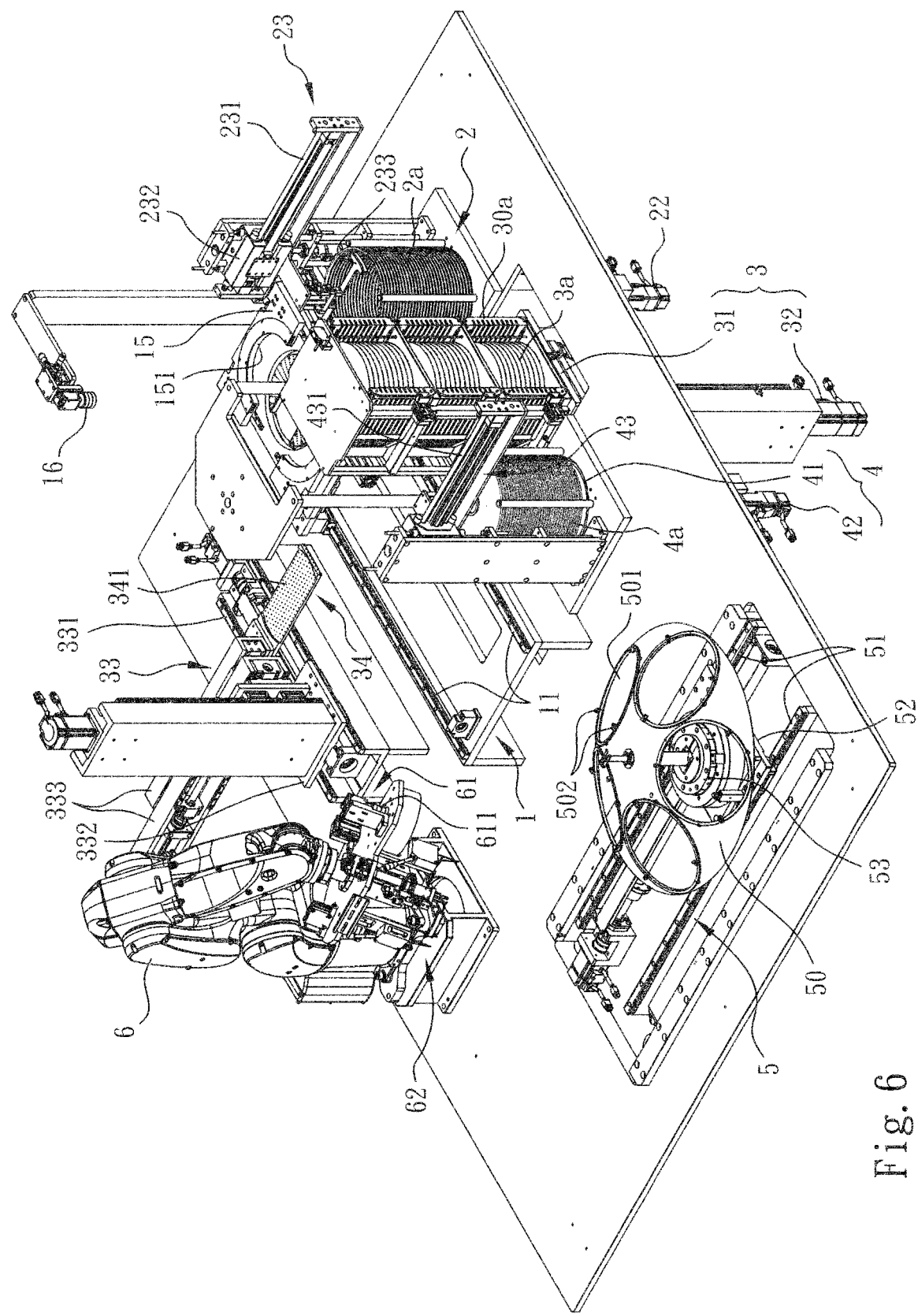
FIG. 6 is a perspective view of the present invention, showing a state that the wafer frame, the wafer and the mask are respectively positioned in a material supply position.

In step S12 of placing the wafer cartridge receiving the wafers onto the wafer installation/uninstallation mechanism and respectively placing the wafer frames and the masks onto the wafer frame installation/uninstallation mechanism and the mask installation/uninstallation mechanism, multiple wafer frames 2*a* are stacked and placed on the wafer frame rest seat 21, (that is, the supply position of the wafer frame 2*a*) of the wafer frame installation/uninstallation mechanism 2 and multiple wafer cartridges 30*a* in which multiple wafers 3*a* are received at intervals are placed on the wafer rest seat 31, (that is, the supply position of the wafer 3*a*) of the wafer installation/uninstallation mechanism 3 and multiple masks 4*a* are stacked and placed on the mask rest seat 41, (that is, the supply position of the mask 4*a*) of the mask installation/uninstallation mechanism 4. Then the first seat body 12 is moved to the respective first guide rails 11 as necessary in a position near one side of the wafer frame installation/uninstallation mechanism 2 (as shown in FIG. 6).

Figure 7:
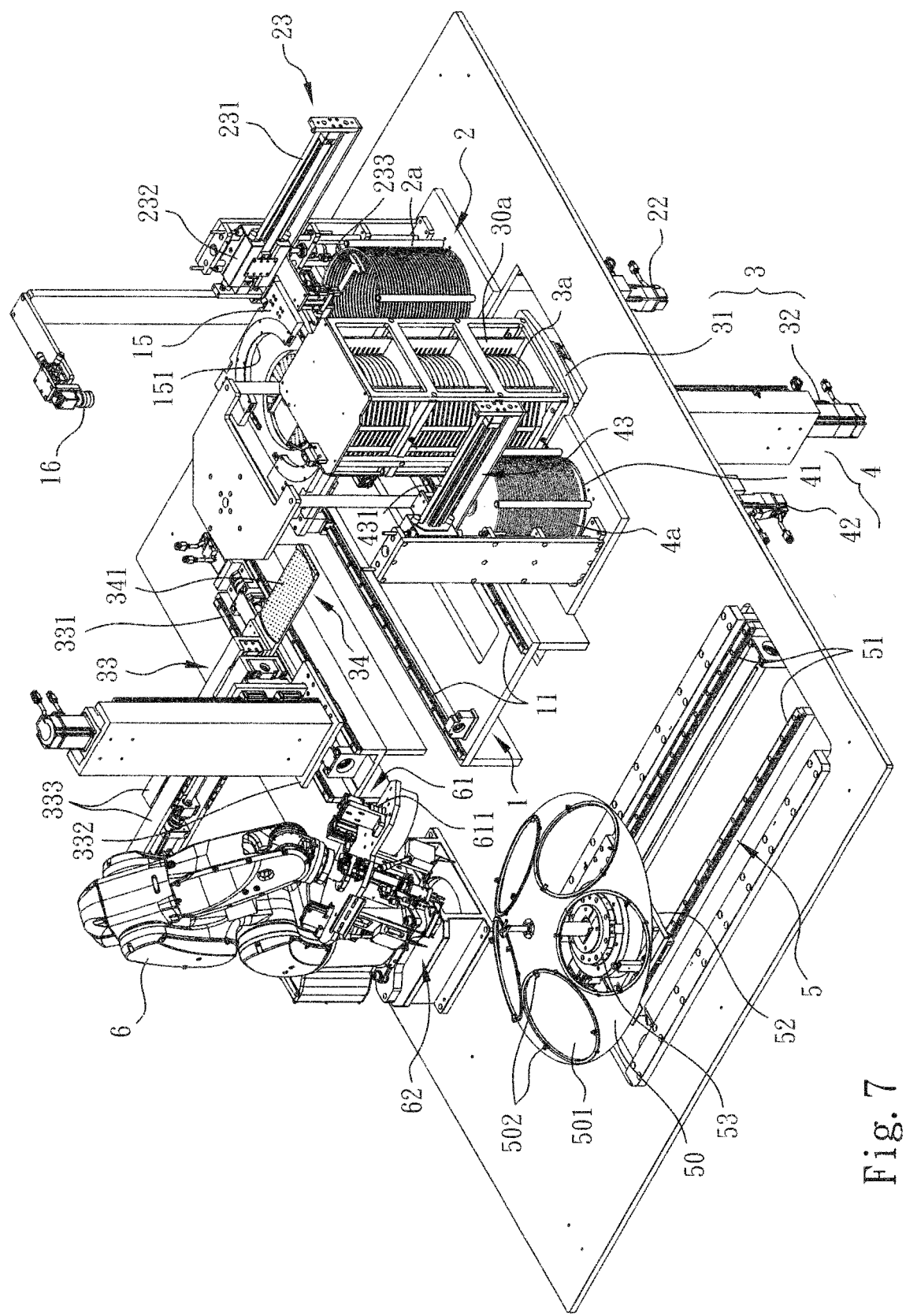
FIG. 7 is a perspective view of the present invention, showing the operation that the wafer installation/uninstallation mechanism drives the respective wafer cartridges to pivotally rotate toward the first displacement mechanism.

In step S13 of using the wafer installation/uninstallation mechanism to drive the wafer cartridge to pivotally rotate and make the opening thereof directed to the first displacement mechanism, the openings of the respective wafer cartridges 30*a* on the wafer rest seat 31 are rotated as necessary and directed to one side of the first displacement mechanism 1. In addition, the second seat body 52 carries the rotary disc 50 to move along the respective second guide rails 51 to a position near the preset fixed operation position of the first displacement mechanism 1 (as shown in FIG. 7).

Figure 8:
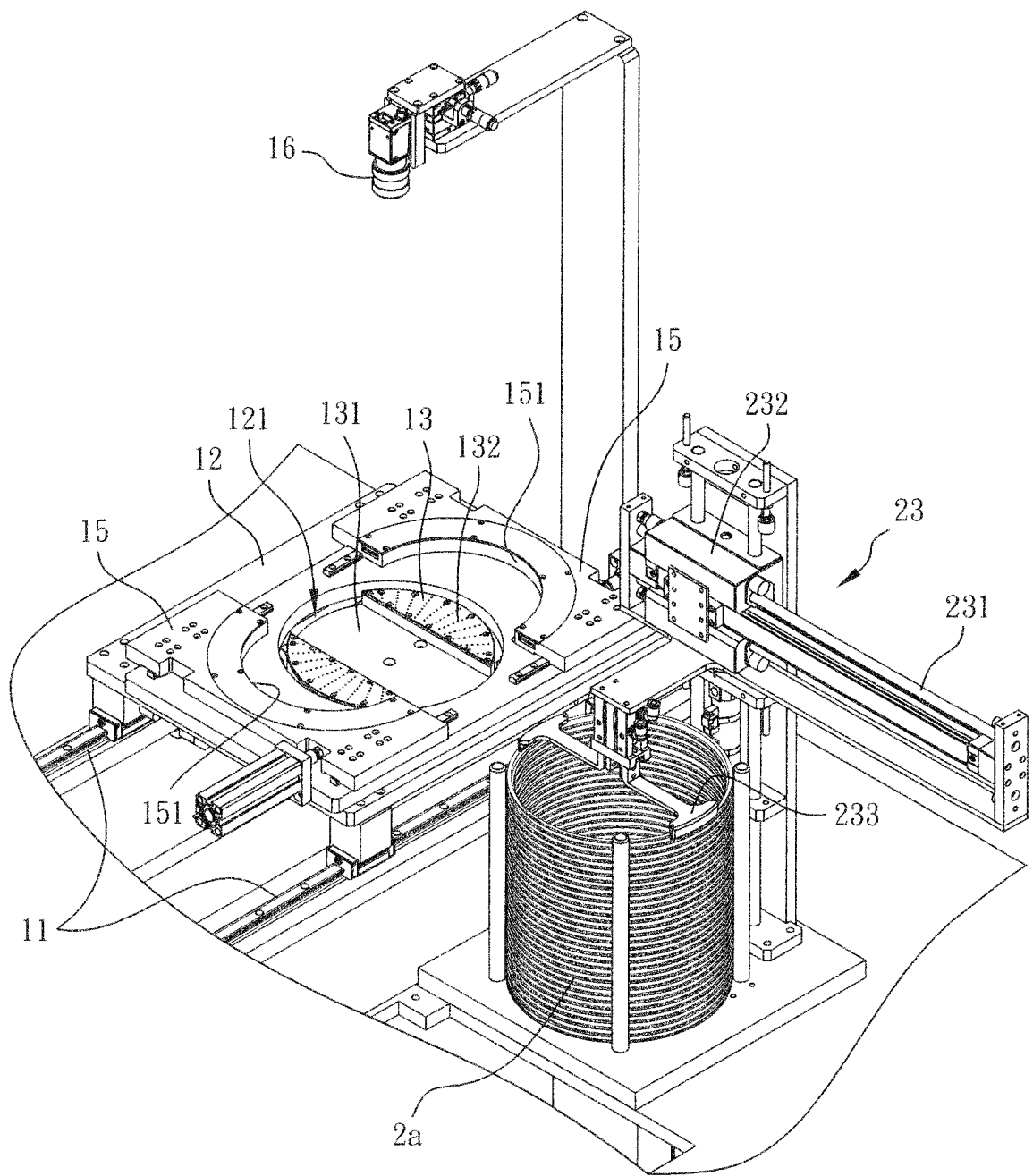
FIG. 8 is a perspective view of the present invention, showing the first operation that the wafer frame removing assembly removes the wafer frame.
Figure 9:
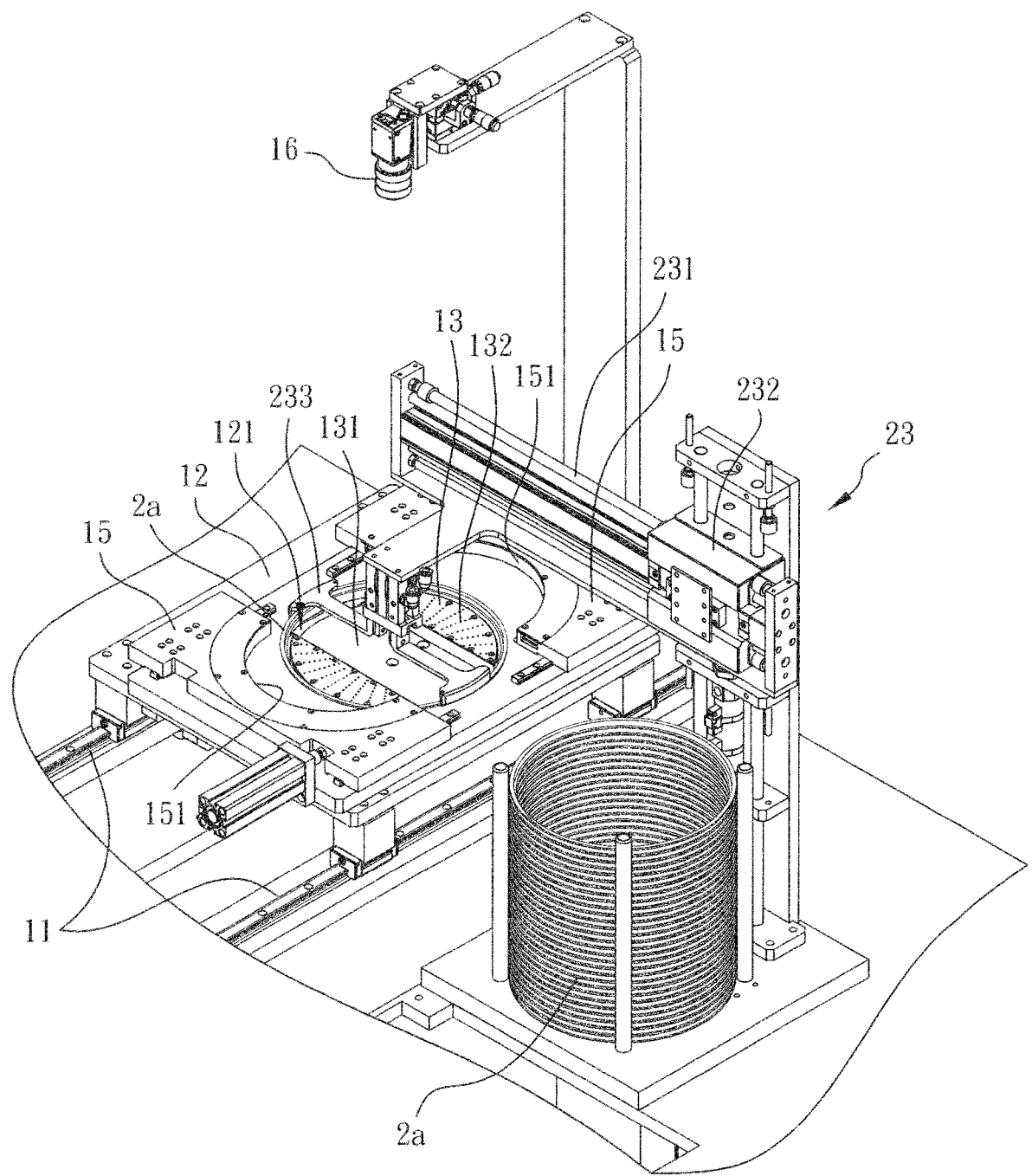
FIG. 9 is a perspective view of the present invention, showing the second operation that the wafer frame removing assembly removes the wafer frame.

In step S20 of using the wafer frame installation/uninstallation mechanism to remove and locate a wafer frame in the first displacement mechanism, the control module drives the wafer frame installation/uninstallation mechanism 2 to make the holding components 233 of the wafer frame removing assembly 23 hold a wafer frame 2*a* on the wafer frame rest seat 21. In addition, the wafer frame removing slide seat 232 ascends/descends and the wafer frame removing guide rail 231 is transversely slid to move the wafer frame 2*a* into the pre-jig uninstallation section 121 of the first seat body 12 (as shown in FIGS. 8 and 9). Then the holding components 233 separate from the wafer frame 2*a*, whereby the outer flange 21*a* of the wafer frame 2*a* is leant against the edge of the pre-jig uninstallation section 121 and located.

In practice, the wafer frame lifting assembly 22 can cooperatively drive the wafer frame rest seat 21 to ascend/descend, whereby the wafer frame removing assembly 23 can more easily hold the wafer frame 2*a* in a proper position.

Figure 10:
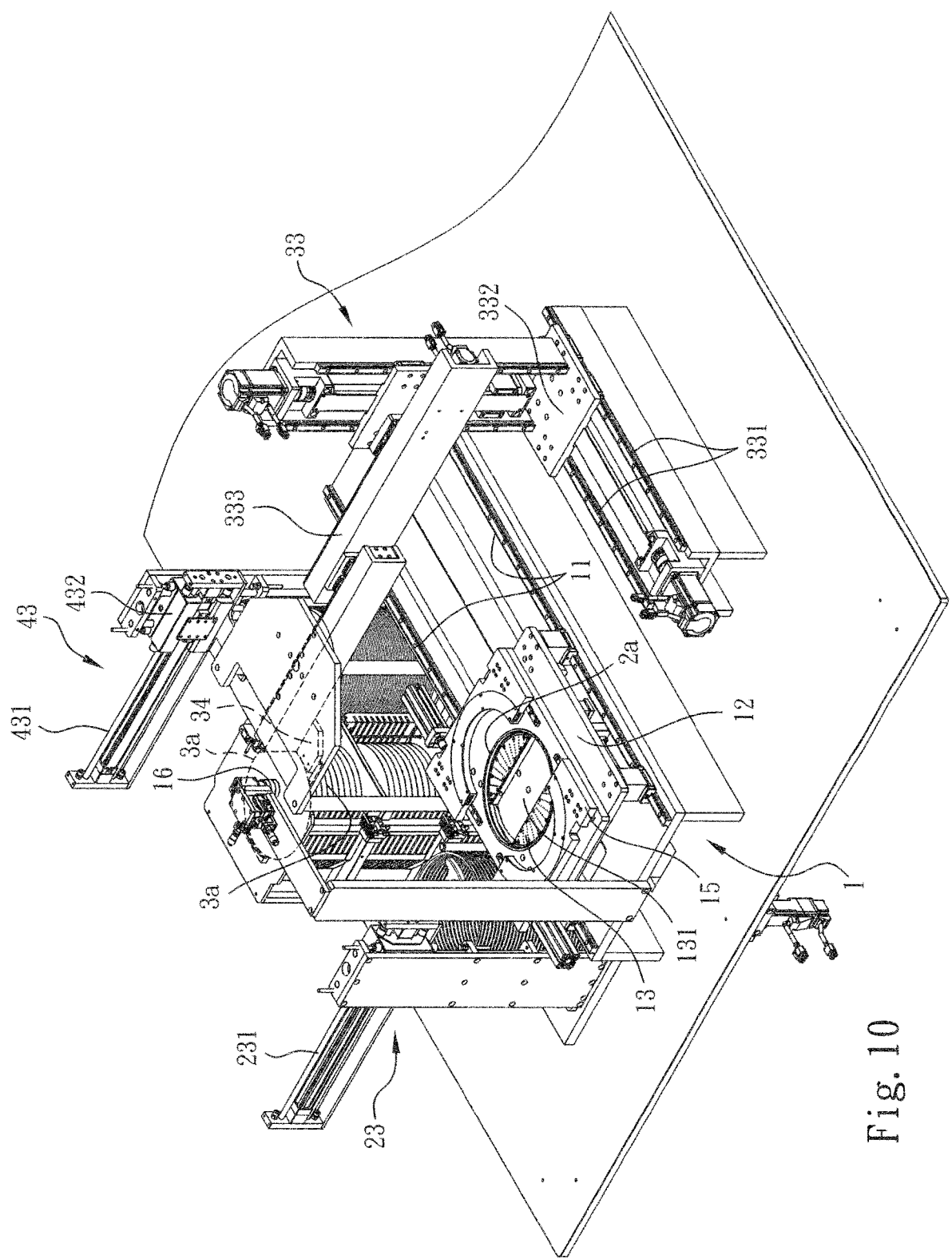
FIG. 10 is a perspective view of the present invention, showing the first operation that the wafer removing assembly removes the wafer.
Figure 11:
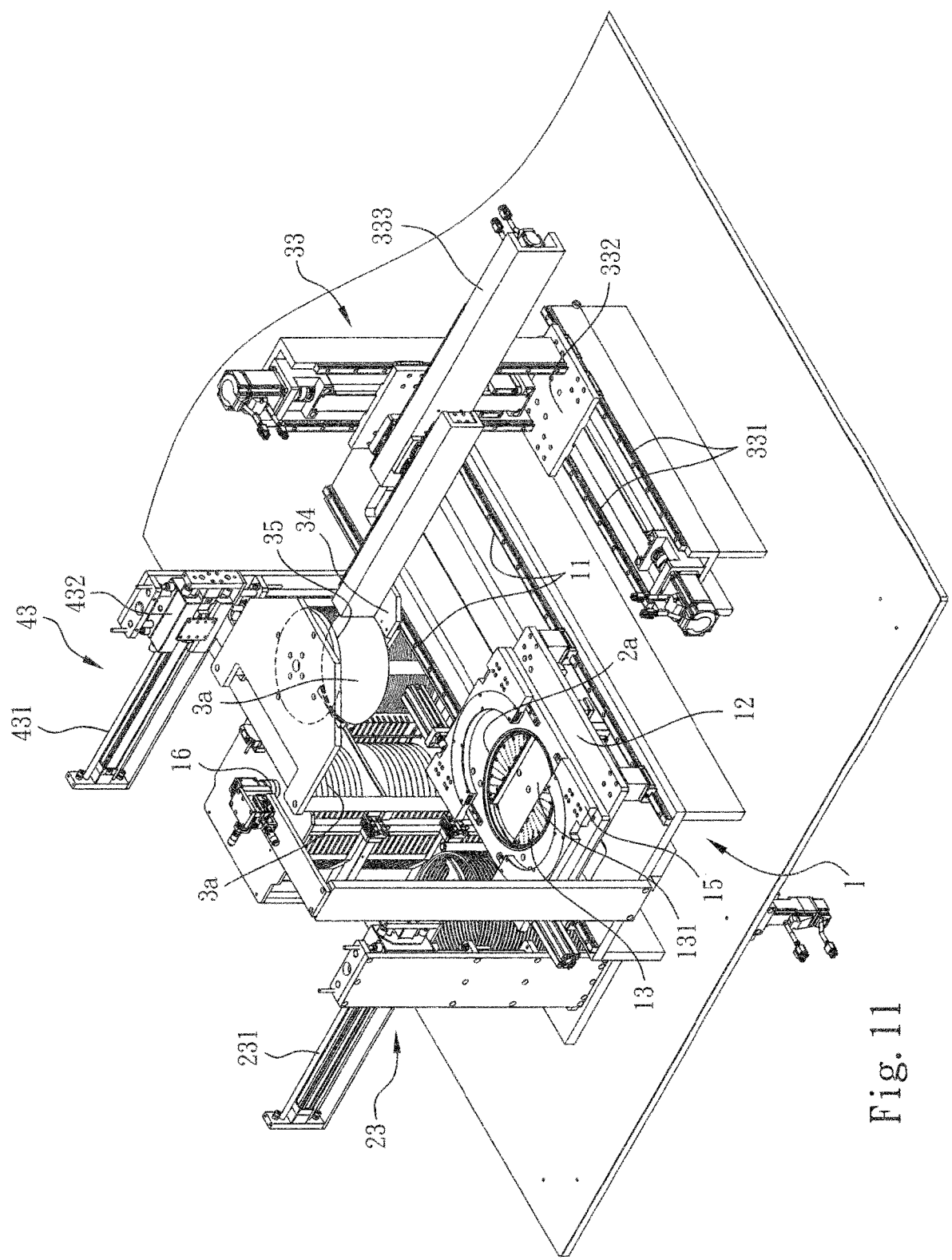
FIG. 11 is a perspective view of the present invention, showing the second operation that the wafer removing assembly removes the wafer.
Figure 12:
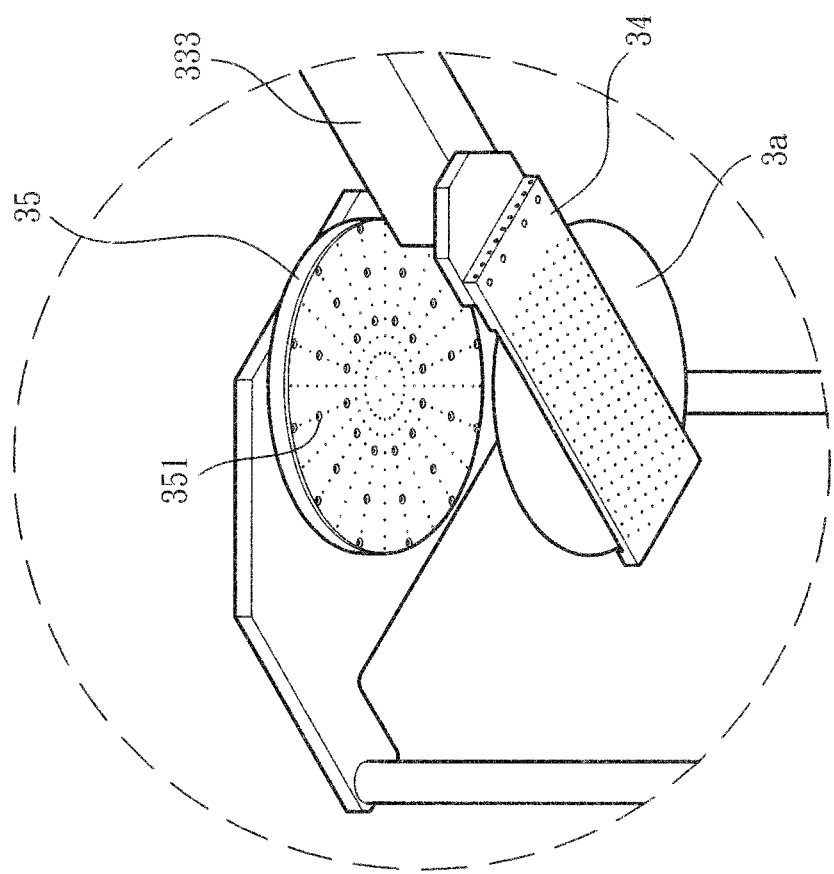
FIG. 12 is a perspective view of the present invention, showing that air is jetted from the air nozzle to flatten the wafer on the wafer bracket.

In step S21 of using the wafer installation/uninstallation mechanism to carry and move a wafer and flatten the wafer in the moving process, the control module drives the wafer installation/uninstallation mechanism 3 to move the wafer removing slide seat 332 of the wafer removing assembly 33. The telescopic assembly 333 cooperatively extends, whereby the wafer bracket 34 extends into a wafer cartridge 30*a* to bear a wafer 3*a* (as shown in FIG. 10) and move the wafer 3*a* out of the wafer cartridge 30*a* (as shown in FIG. 11) to get close to the air nozzle 35. Air is jetted from the air jet hole 351 of the air nozzle 35 to blow the wafer 3*a* (as shown in FIG. 12) so as to flatten the wafer 3*a*. Then the air sucking orifices 341 suck air to securely locate the wafer 3*a* on the wafer bracket 34 in a true position without warping.

In practice, the wafer lifting assembly 32 can cooperatively drive the wafer rest seat 31 to ascend/descend so that the wafer bracket 34 can more easily bear the wafer 3*a* in the wafer cartridge 30*a* in a proper position.

Figure 13:
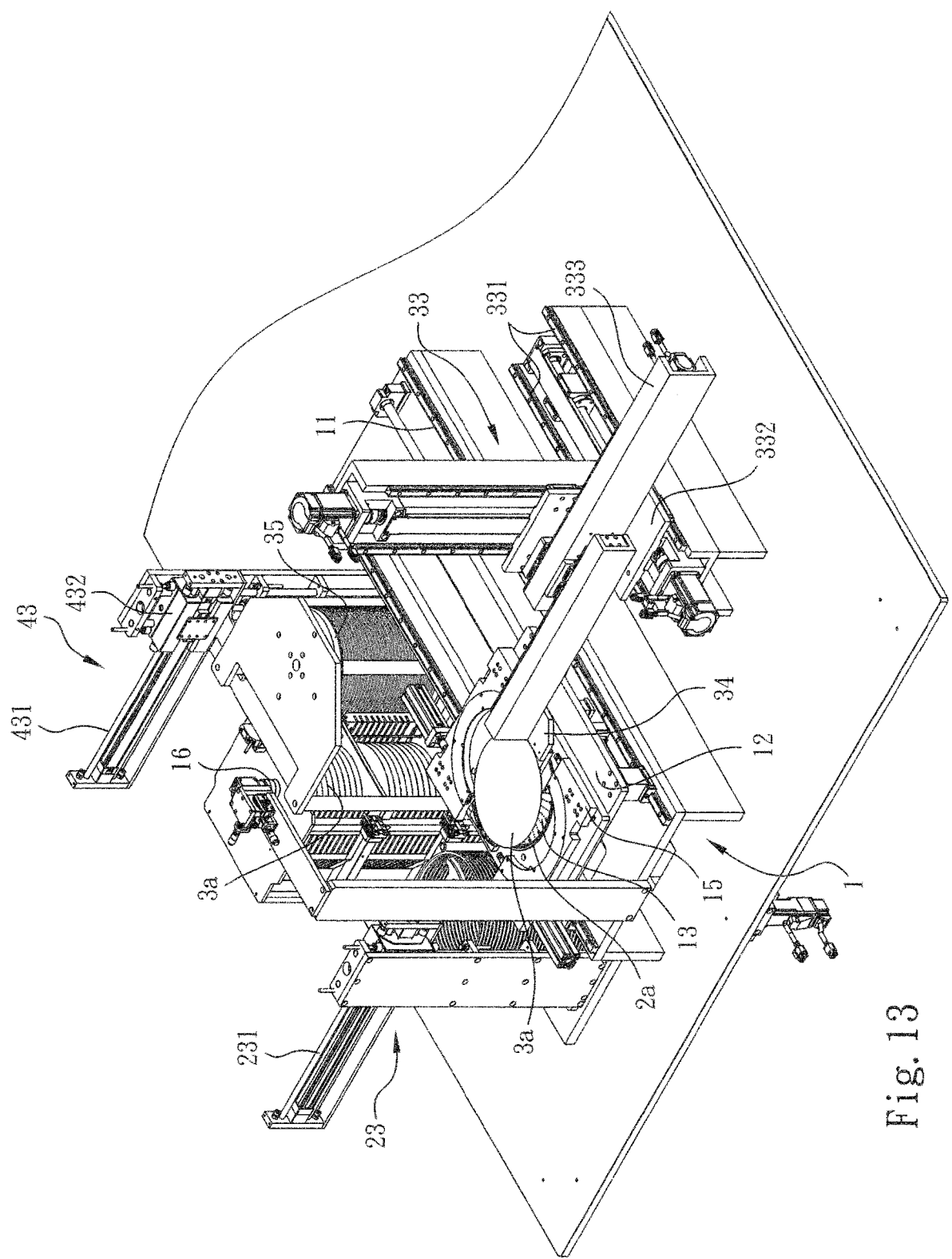
FIG. 13 is a perspective view of the present invention, showing the third operation that the wafer removing assembly removes the wafer.
Figure 14:
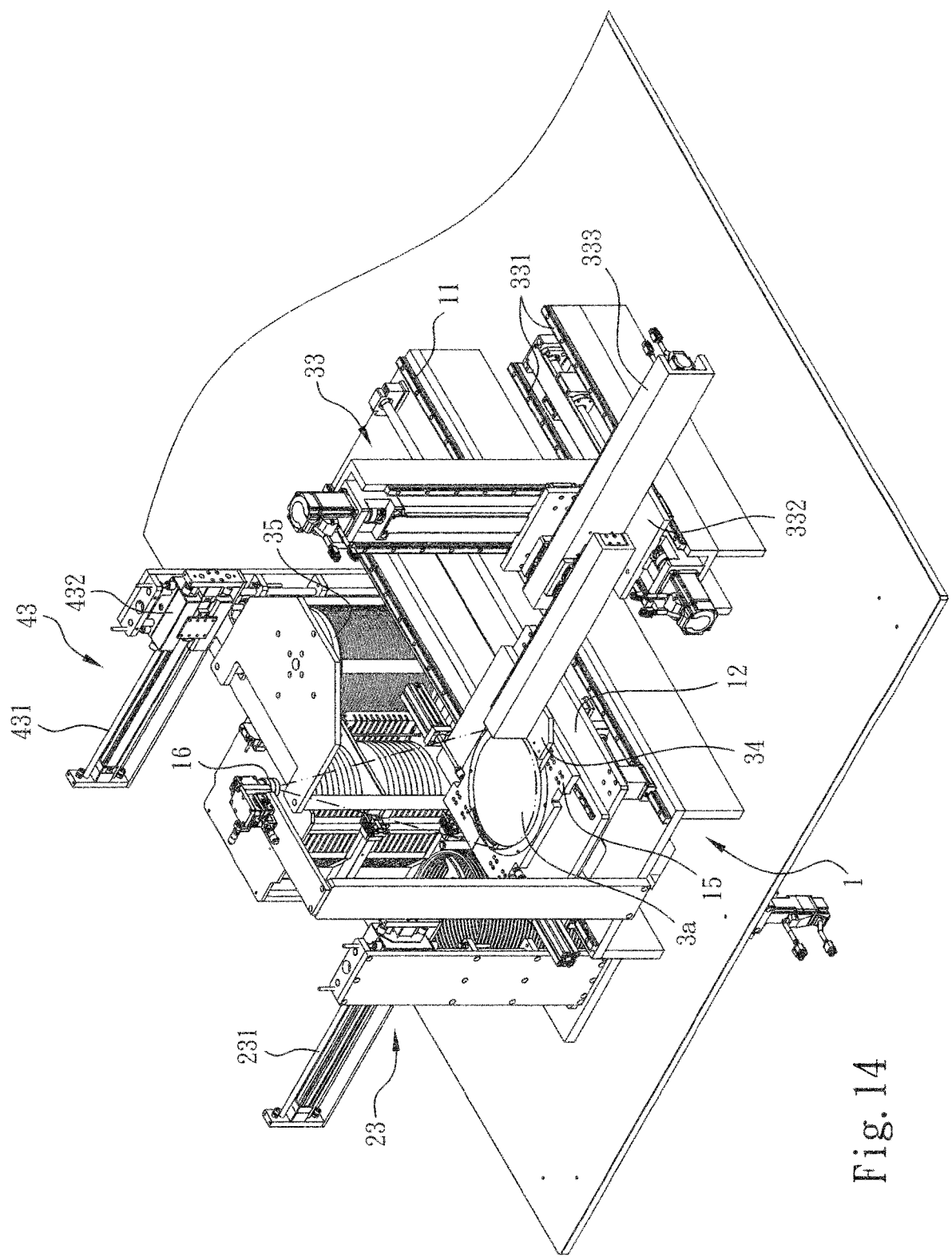
FIG. 14 is a perspective view of the present invention, showing the operation that an image capturing unit is used to check the wafer on the first seat body and two holding slide seats correct the position of the wafer.

In step S22 of using the wafer installation/uninstallation mechanism to move the wafer onto the first displacement mechanism and correct the wafer, the control module drives the wafer installation/uninstallation mechanism 3 to make the wafer removing assembly 33 drive the wafer bracket 34 to move the wafer 3*a* to upper side of the pre-jig uninstallation section 121 of the first seat body 12 (as shown in FIG. 13). The image capturing unit 16 is used to obtain the image of the wafer 3*a* so as to check whether the wafer 3*a* is positioned in a true position. In addition, the two holding slide seats 15 having poor-light surfaces are cooperatively moved toward each other, whereby the two recessed arcuate sections 151 are combined to form a circular hole corresponding to the pre-jig uninstallation section 121 (as shown in FIG. 14). Then, the wafer removing assembly 33 drives the wafer bracket 34 to correct the position, whereby the wafer 3*a* is corrected and positioned in a true position corresponding to the center of the recessed arcuate sections 151 of the two holding slide seats 15, (that is, the center of the wafer frame 2*a*).

Figure 15:
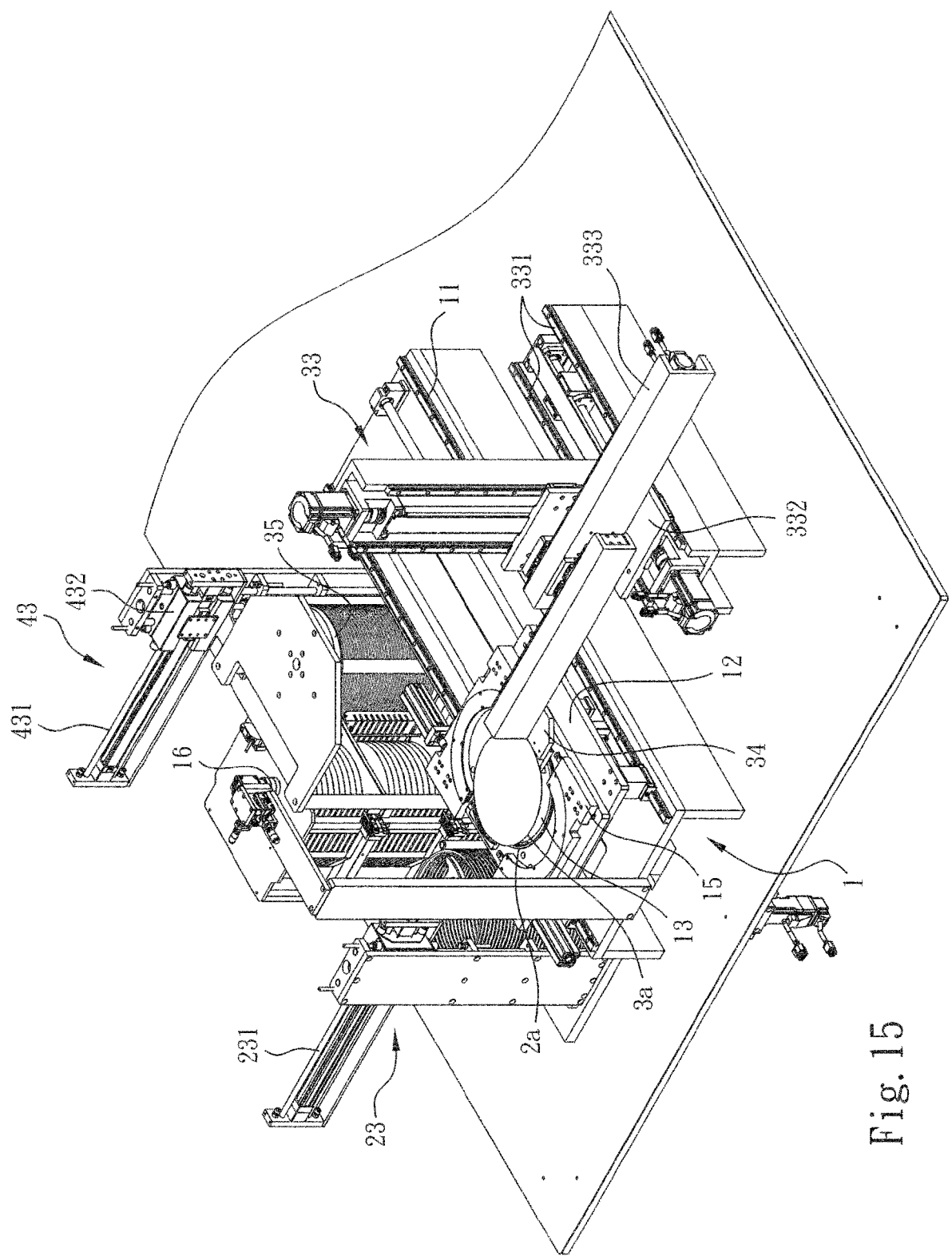
FIG. 15 is a perspective view of the present invention, showing the operation that the support seat ascends to support the wafer.
Figure 16:
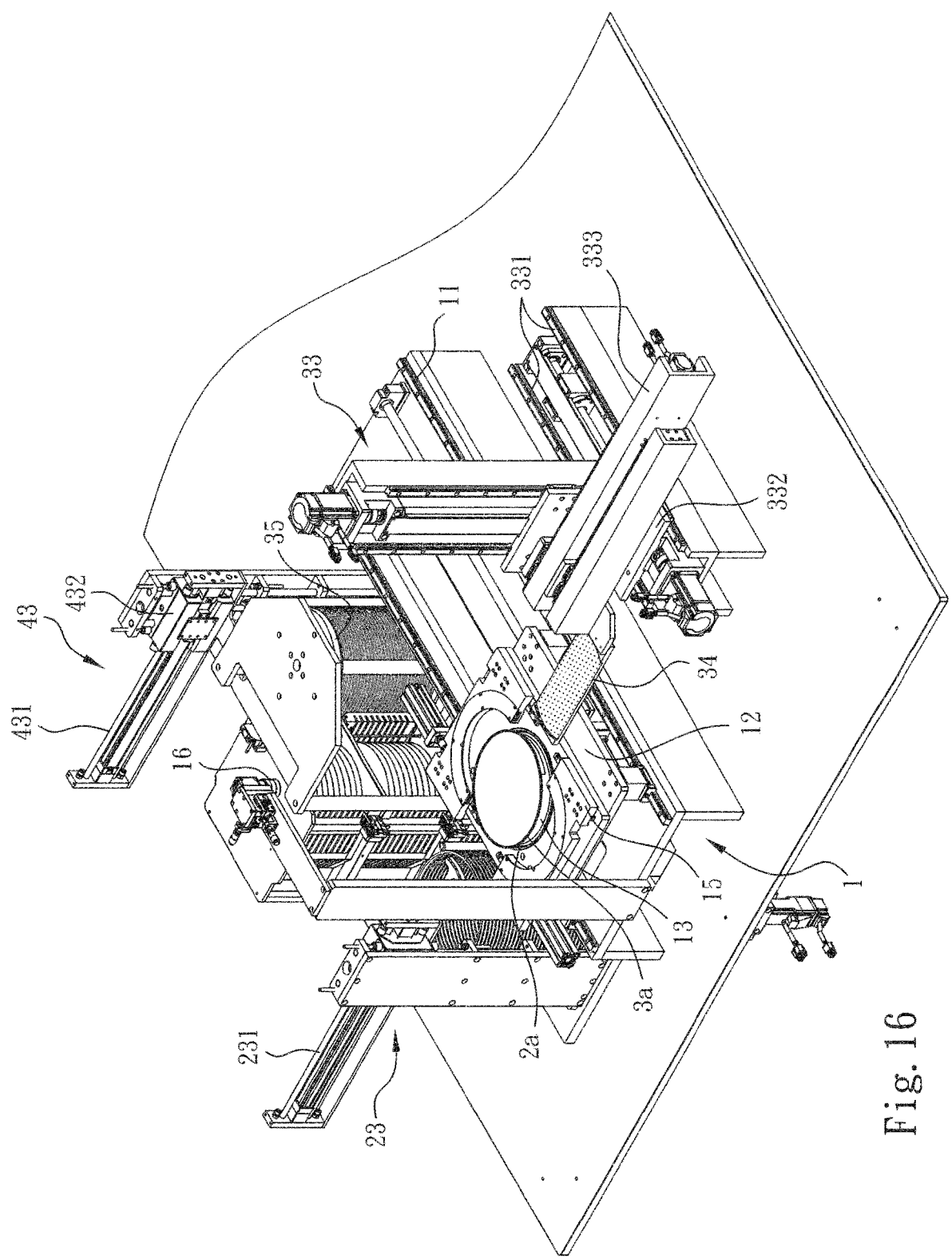
FIG. 16 is a perspective view of the present invention, showing the operation that the wafer bracket is moved out.
Figure 17:
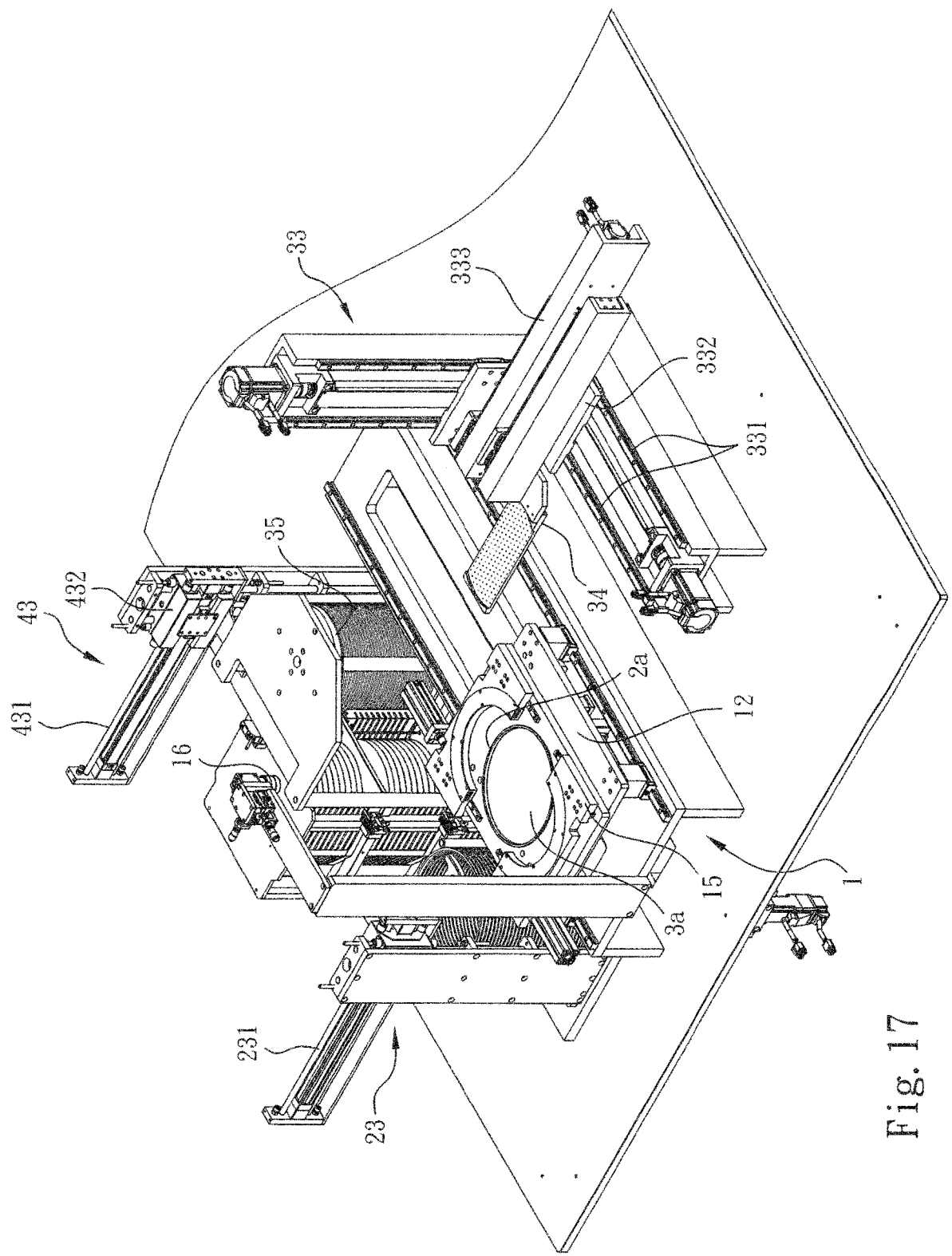
FIG. 17 is a perspective view of the present invention, showing the operation that the support seat descends to place the wafer into the wafer frame.

In step S23 of using the first displacement mechanism to move the wafer into the wafer frame, the two holding slide seats 15 are separated and the support seat lifting assembly 133 drives the support seat 13 to ascend. At the same time, the air-sucking orifices 132 suck air, whereby the wafer 3*a* is sucked and attached to the support seat 13. At this time, the respective air sucking orifices 341 of the wafer bracket 34 stop sucking air and the wafer bracket 34 in the channel 131 is separated from the bottom face of the wafer 3*a* (as shown in FIG. 15). Then the telescopic assembly 333 retracts to move the wafer bracket 34 from the upper side of the first seat body 12 (as shown in FIG. 16). Then the support seat lifting assembly 133 drives the support seat 13 to descend to downward move the wafer 3*a* onto the inner flange 22*a* of the inner circumference of the wafer frame 2*a* (as shown in FIG. 17) and the wafer 3*a* keeps in a state of being sucked by the support seat 13.

Figure 18:
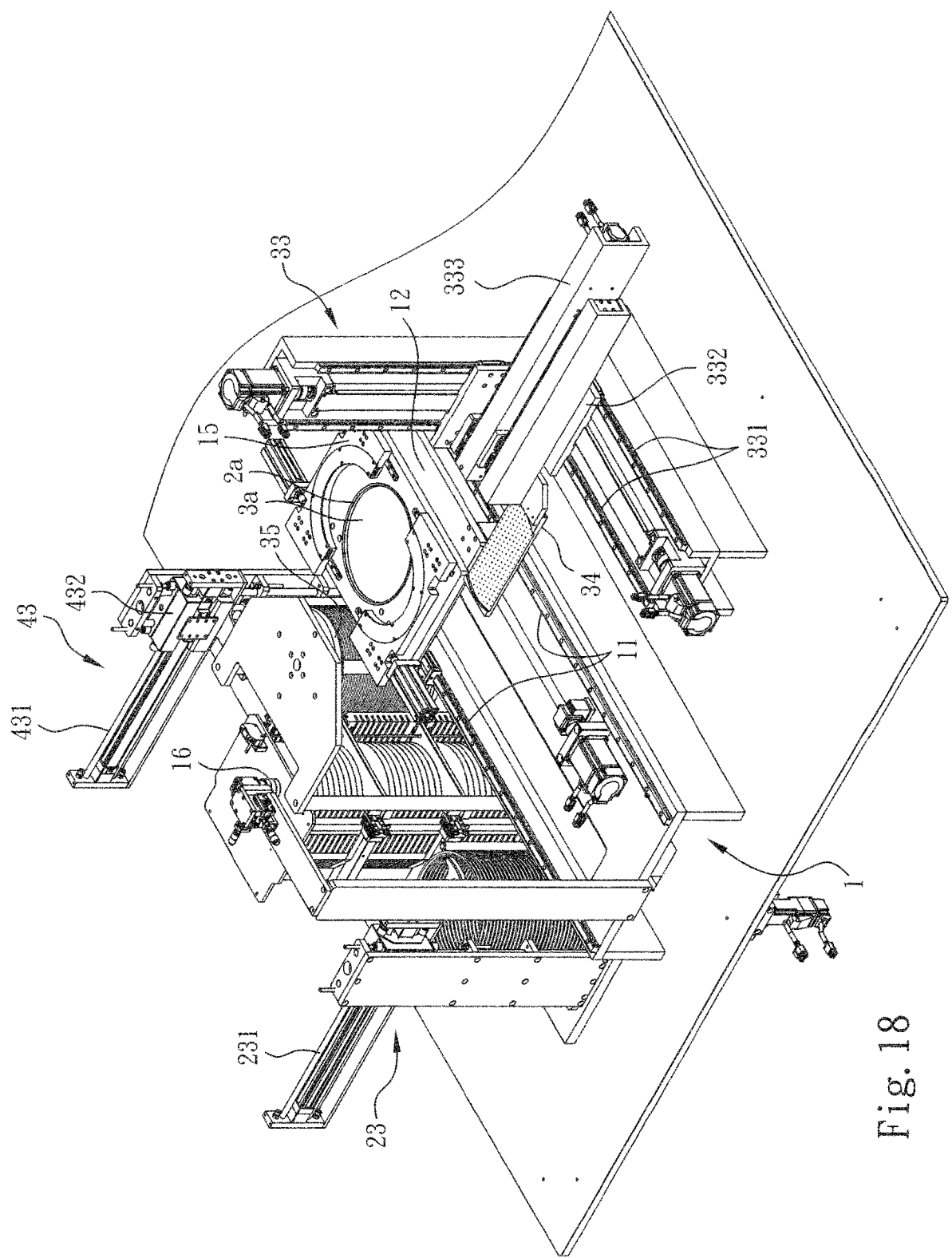
FIG. 18 is a perspective view of the present invention, showing the operation that the first seat body is moved to a position beside the mask installation/uninstallation mechanism.
Figure 19:
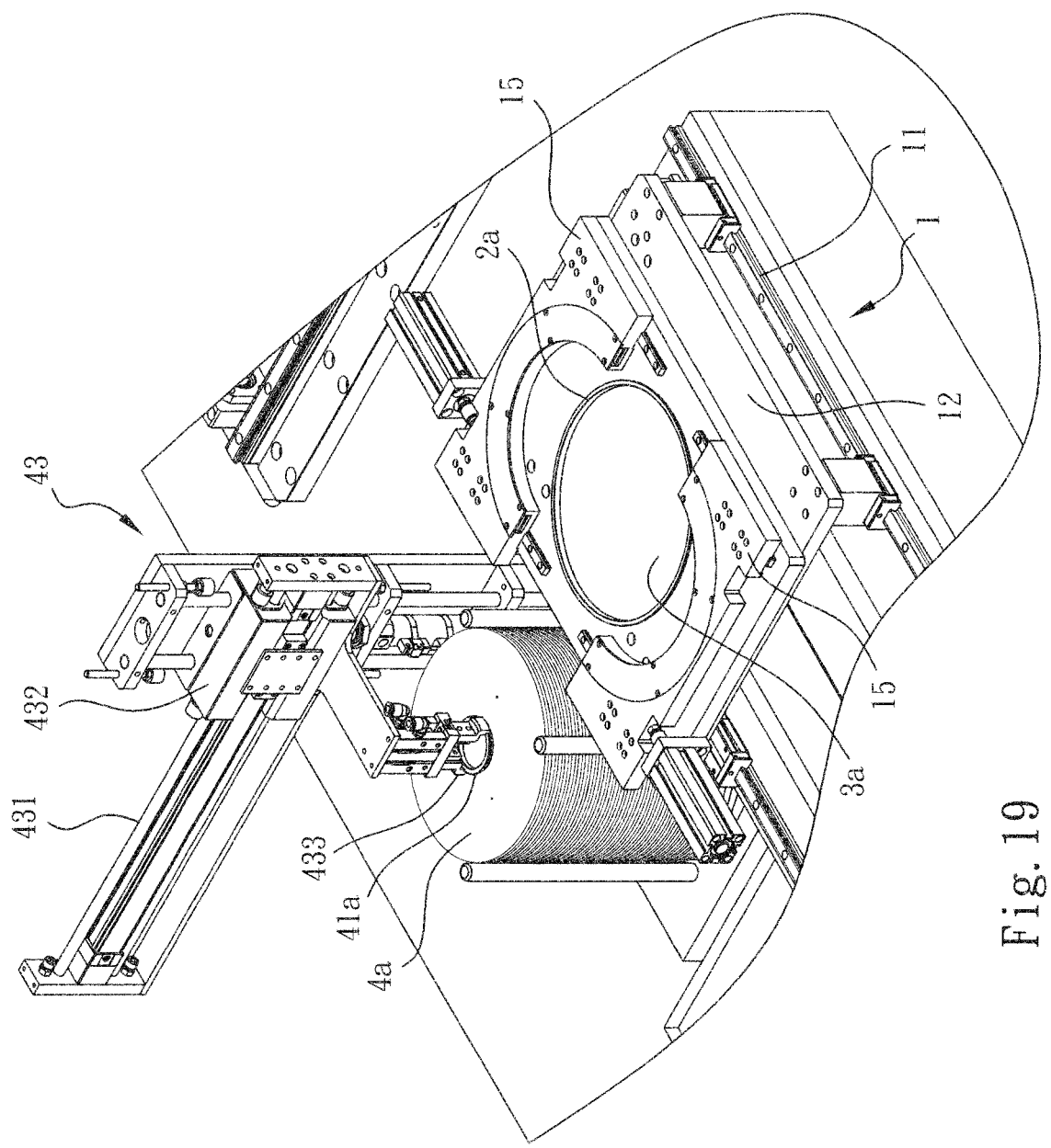
FIG. 19 is a perspective view of the present invention, showing the first operation that the mask removing assembly removes the mask.
Figure 20:
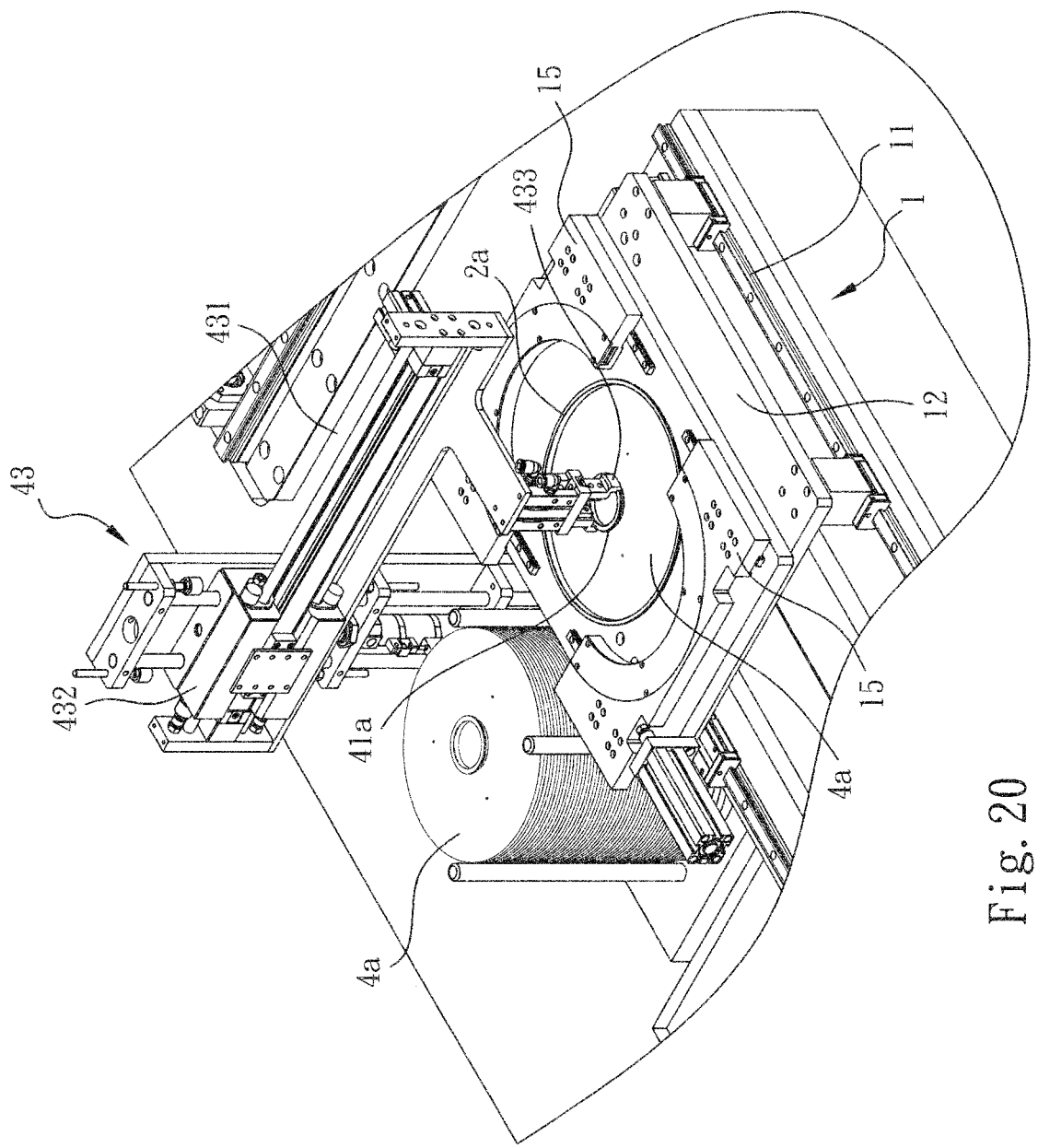
FIG. 20 is a perspective view of the present invention, showing the second operation that the mask removing assembly removes the mask.
Figure 21:
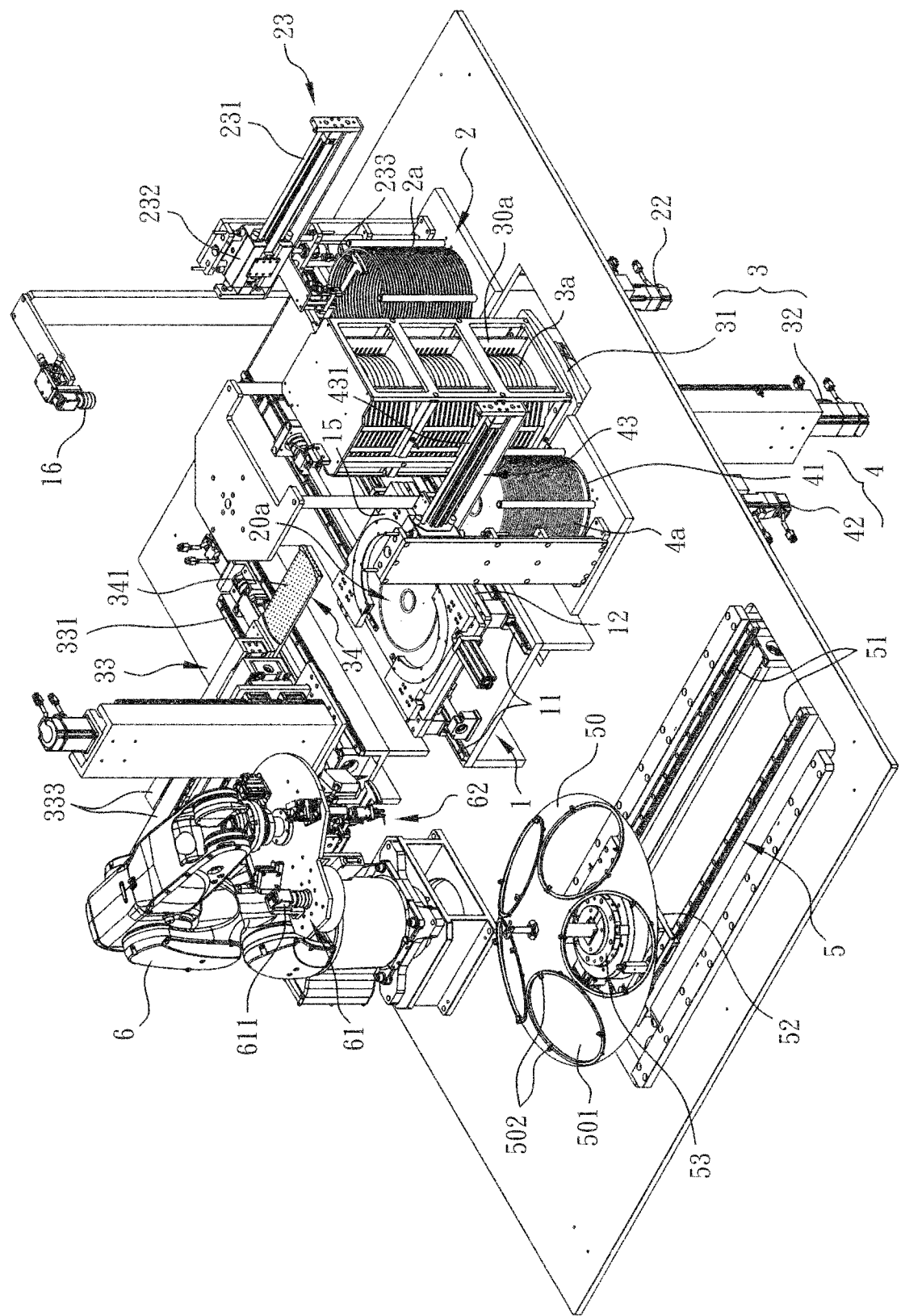
FIG. 21 is a perspective view of the present invention, showing a state that the mask removing assembly has removed the mask, while the robotic arm has not yet operated.

In step S30 of using the mask installation/uninstallation mechanism to remove a mask into the wafer frame and overlay the mask onto the wafer to form an assembly, the first seat body 12 is first moved along the first guide rails 11 to a position near one side of the mask installation/uninstallation mechanism 4 as necessary (as shown in FIG. 18). Then the control module drives the mask installation/uninstallation mechanism 4 to make the set of holding claws 433 of the mask removing assembly 43 hold the annular raised section 41*a* of a mask 4*a* on the mask rest seat 41 (as shown in FIG. 19). Then the mask removing slide seat 432 ascends/descends and the mask removing guide rail 431 is transversely slid to move the mask 4*a* into the pre-jig uninstallation section 121 and overlay the mask 4*a* on the wafer 3*a* (as shown in FIG. 20). Then the set of holding claws 433 release the annular raised section 41*a*, whereby the wafer frame 2*a*, the wafer 3*a* and the mask 4*a* are stacked to form an assembly 20*a* (as shown in FIG. 21).

In practice, the mask lifting assembly 42 can cooperatively drive the mask rest seat 41 to ascend/descend, whereby the mask removing assembly 43 can more easily hold the mask 4*a* in a proper position.

Figure 22:
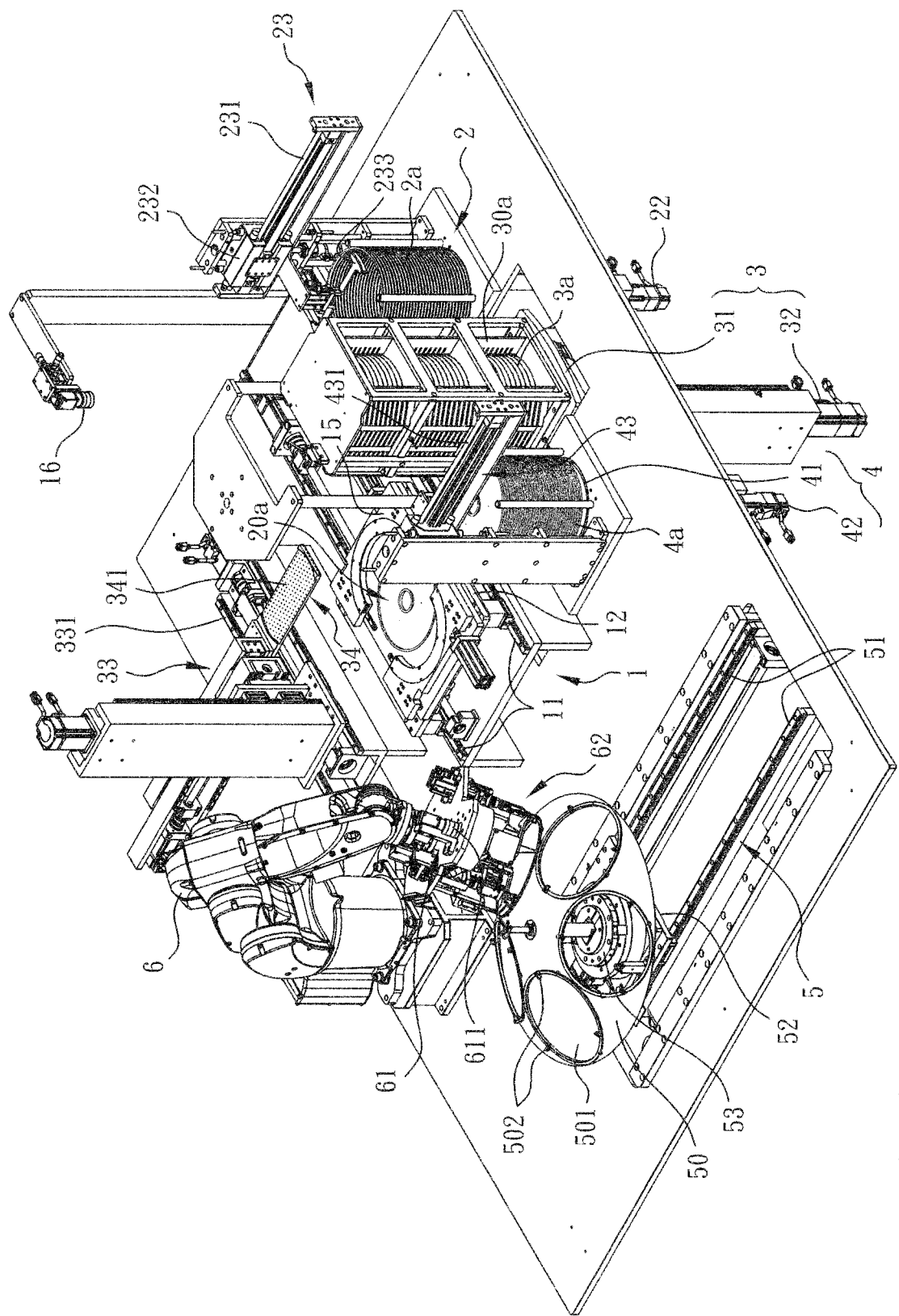
FIG. 22 is a perspective view of the present invention, showing the operation that by means of the rangefinder components, the installation/uninstallation mechanism forward corresponds to the assembly carrier section on the carrier disc to be assembled so as to correct the inclination angle of the installation/uninstallation operation face.

In step S31 of using the robotic arm to drive the installation/uninstallation mechanism to approach the carrier disc by a preset installation/uninstallation standard value and using the rangefinder components to measure the distances between the rangefinder components and the circumferences of the assembly carrier sections to be assembled, the control module drives the installation/uninstallation mechanism 62 on the robotic arm 6 to move to a position to be assembled on the carrier disc 50 by the direction and angle of the preset installation/uninstallation standard value and the rangefinder components 621 are used to measure the distances between the rangefinder components 621 and the circumferences of the assembly carrier sections 501 in the position to be assembled (as shown in FIG. 22).

In a preferred embodiment, the rangefinder components 621 are laser sources, which can emit range finding laser beams 6211 respectively onto the circumferences of the assembly carrier sections 501 to be assembled so as to measure the distances.

In step S32 of using the control module to adjust the position of the installation/uninstallation mechanism so as to make the measured distances of the respective rangefinder components equal to each other and correct the inclination angle of the installation/uninstallation operation face of the installation/uninstallation mechanism, according to the differences between the distances measured by the rangefinder components 621, (that is, the emission length of the range finding laser beams 6211), the control module drives the installation/uninstallation mechanism 62 on the robotic arm 6 to adjust the position and makes the respective rangefinder components 621 (laser sources) measure the distances (the range finding laser beams 6211) between the rangefinder components 621 and the circumferences of the assembly carrier sections 501 to be assembled and ensure the distances are equal to each other so as to correct the inclination angle of the installation/uninstallation operation face of the installation/uninstallation mechanism 62 and ensure that the surface (the installation/uninstallation operation face) of the bottom side of the installation/uninstallation mechanism 62 is in parallel to the assembly carrier sections 501 to be assembled. Also, the control module stores the data of the installation/uninstallation operation face after corrected.

Figure 23:
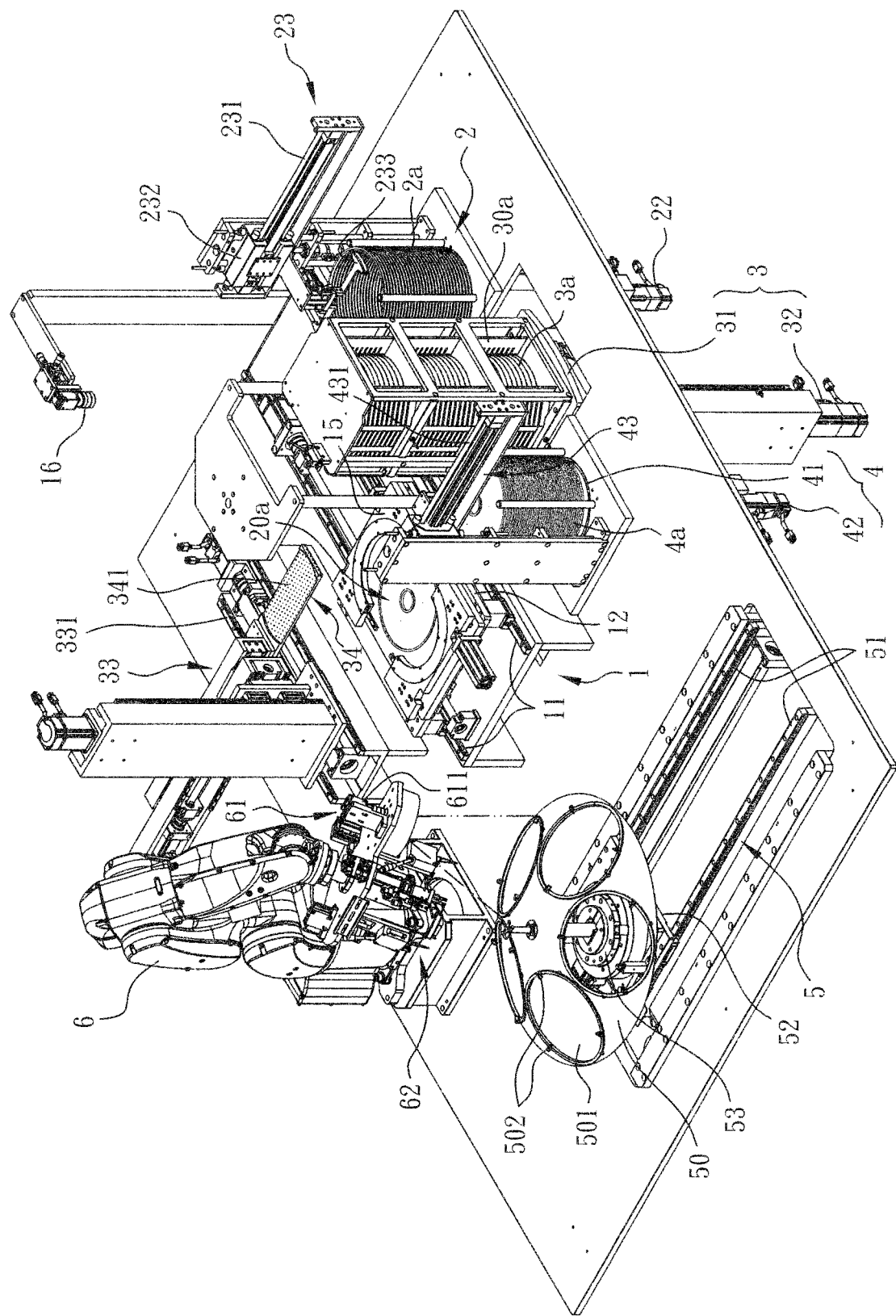
FIG. 23 is a perspective view of the present invention, showing the operation that the image capturing assembly obtains the images of the assembly carrier section to be assembled so as to correct the position of the image capturing face.

In step S41 of using the robotic arm to drive the image capturing assembly to approach the carrier disc by an inclination angle equal to the inclination angle of the installation/uninstallation operation face after corrected and obtain the images of the positions of the assembly carrier sections to be assembled and the positions of the holders, the control module drives the image capturing assembly 61 on the robotic arm 6 to move to the upper side of the assembly carrier sections 501 to be assembled by an inclination angle and direction identical to the inclination angle and direction of the installation/uninstallation operation face after corrected. The image capturing component 611 is used to obtain the images of the circumferences of the assembly carrier sections 501 to be assembled (as shown in FIG. 23) so as to ensure the positions of the assembly carrier sections 501 to be assembled and the positions of the respective holders 502.

In step S42 of using the control module to adjust the position of the image capturing assembly to make the image capturing assembly truly correspond to the assembly carrier sections to be assembled so as to correct the position of image capturing face of the image capturing assembly and by means of the data of the image capturing face after corrected to correct the installation/uninstallation operation face so as to make the installation/uninstallation operation face forward accurately correspond to the assembly carrier sections to be assembled, according to the differences between the aforesaid obtained image positions of the assembly carrier sections 501 to be assembled, the control module drives the image capturing assembly 61 on the robotic arm 6 to adjust the positions so as to correct the image capturing face of the image capturing assembly 61 and ensure that the image capturing assembly 61 truly corresponds to the assembly carrier sections 501 to be assembled and the respective holders 502. In addition, the control module stores the data of the image capturing face after corrected (as shown in FIG. 23).

In a preferred embodiment, positioning marks (not shown, can be cross scales or other marking structures) are disposed on predetermined sections of the circumferences of the holders 502. In addition, relative marks (not shown, can be cross scales or other marking structures) are disposed on the lens of the image capturing component 611 of the image capturing assembly 61 corresponding to the positioning marks of the holders 502. The image capturing assembly 61 can adjust the positions to make the relative marks coincide with the positioning marks. This can achieve the effect of correcting the image capturing face of the image capturing assembly 61.

The image capturing assembly 61 captures images by an inclination angle and direction identical to the inclination angle and direction of the installation/uninstallation operation face after corrected. Therefore, after the position of the image capturing face is corrected, the control module can calculate according to the corrected position of the image capturing face and store the data of the again corrected position needed by the installation/uninstallation mechanism 62. Accordingly, the control module can directly and quickly again drive the installation/uninstallation mechanism 62 via the robotic arm 6 to move to a position forward accurately corresponding to the assembly carrier section 501 to be assembled.

Figure 24:
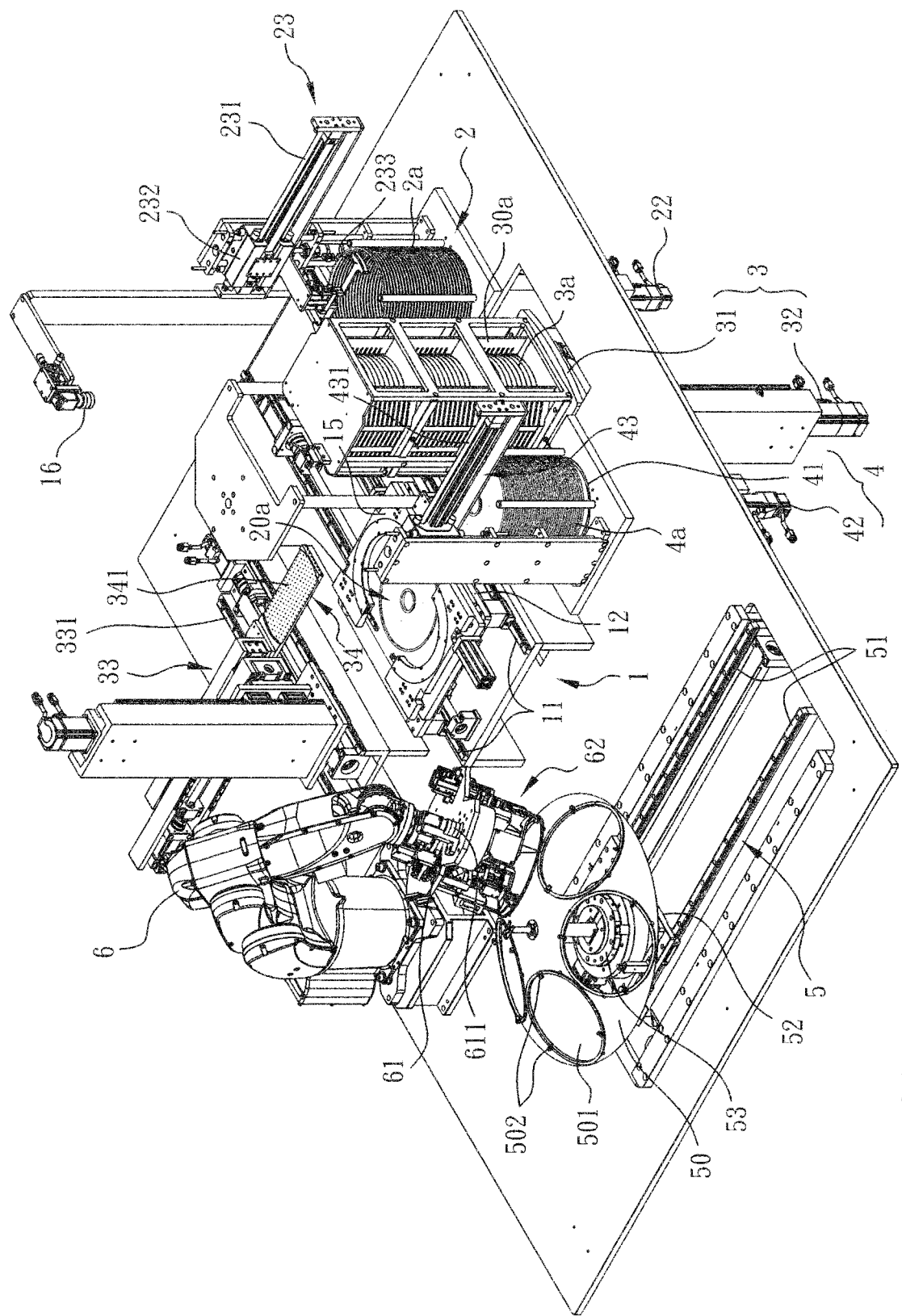
FIG. 24 is a perspective view of the present invention, showing the operation that the installation/uninstallation mechanism unlocks the holders around the assembly carrier section to be assembled.

In step S51 of using the installation/uninstallation mechanism to unlock the holders, the control module drives the installation/uninstallation mechanism 62 on the robotic arm 6 to move to the upper side of the assembly carrier sections 501 and use the holder operation components 623 to release the respective holders 502 (as shown in FIG. 24).

Figure 25:
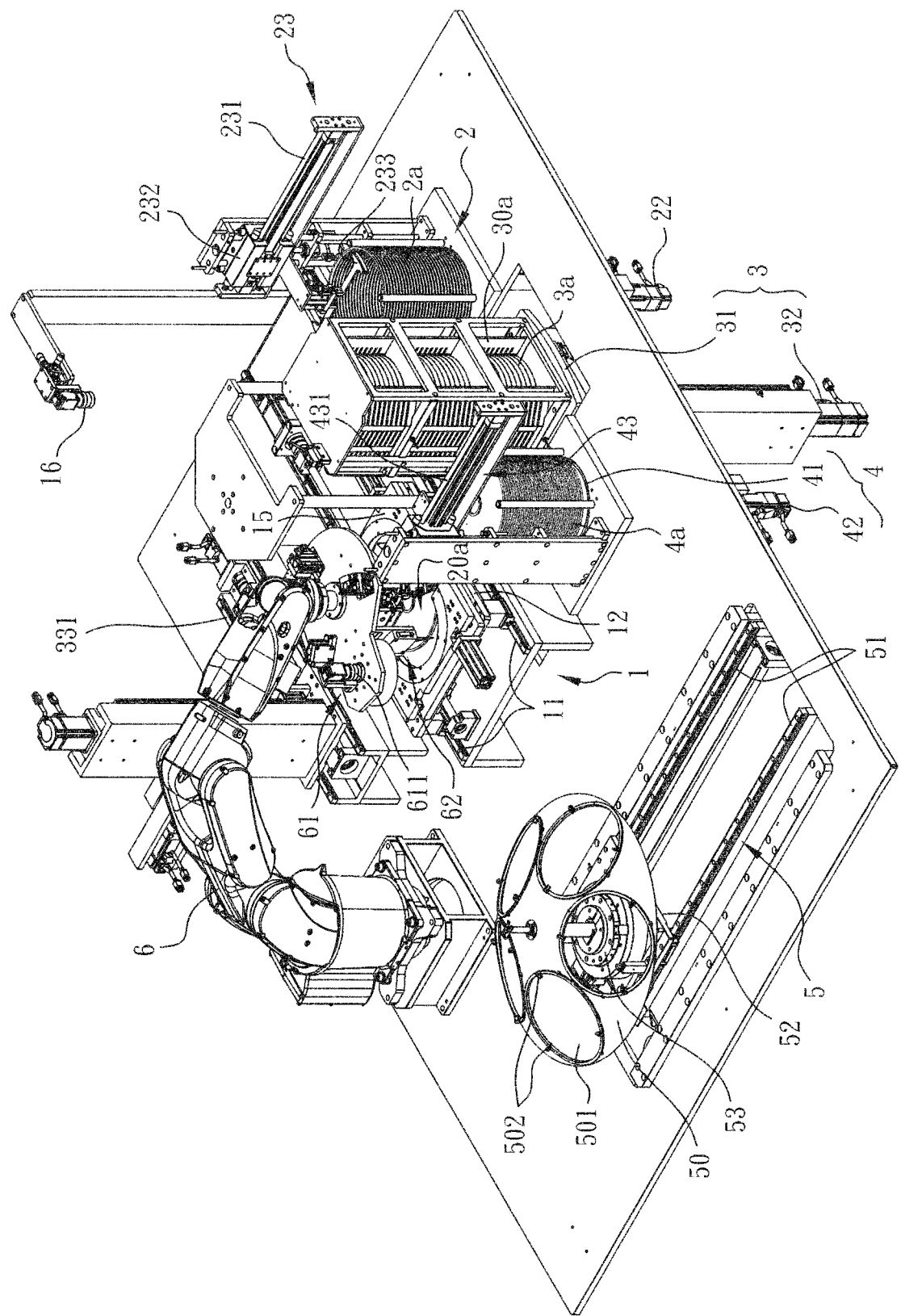
FIG. 25 is a perspective view of the present invention, showing the first operation that the installation/uninstallation mechanism moves the assembly from the first seat body to the assembly carrier section to be assembled.
Figure 26:
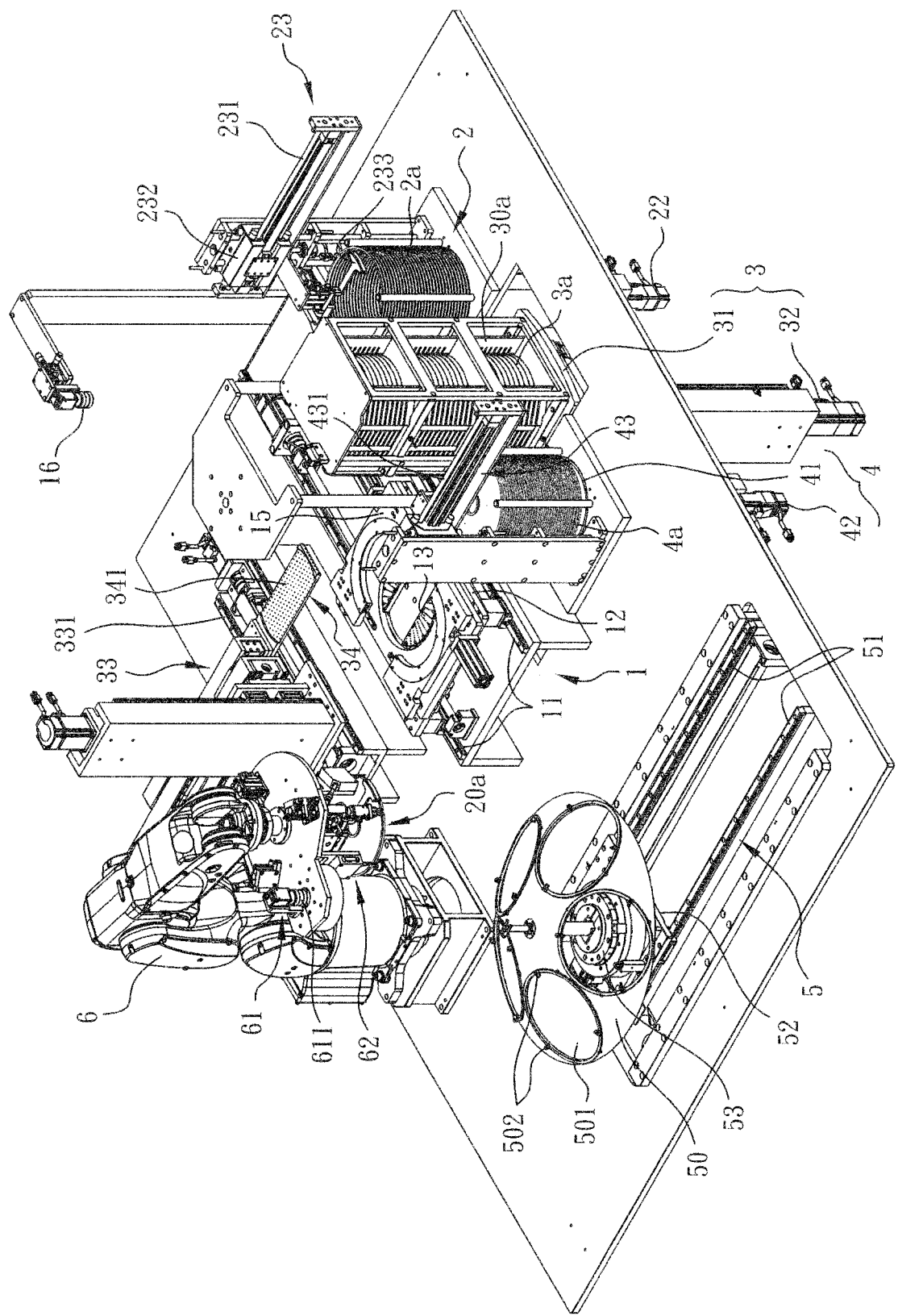
FIG. 26 is a perspective view of the present invention, showing the second operation that the installation/uninstallation mechanism moves the assembly from the first seat body to the assembly carrier section to be assembled.

In step S52 of using the installation/uninstallation mechanism to remove the assembly onto the assembly carrier section to be assembled, the control module drives the installation/uninstallation mechanism 62 on the robotic arm 6 to move to upper side of the pre-jig uninstallation section 121 of the first seat body 12. The holding components 622 are used to hold the assembly 20a (at this time, the air-sucking orifices 132 stop sucking air and the support seat 13 releases the wafer 3a from sucking state as shown in FIG. 25) and move the assembly 20a onto the assembly carrier sections 501 of the carrier disc 50 to be assembled (as shown in FIGS. 26 and 27).

Figure 27:
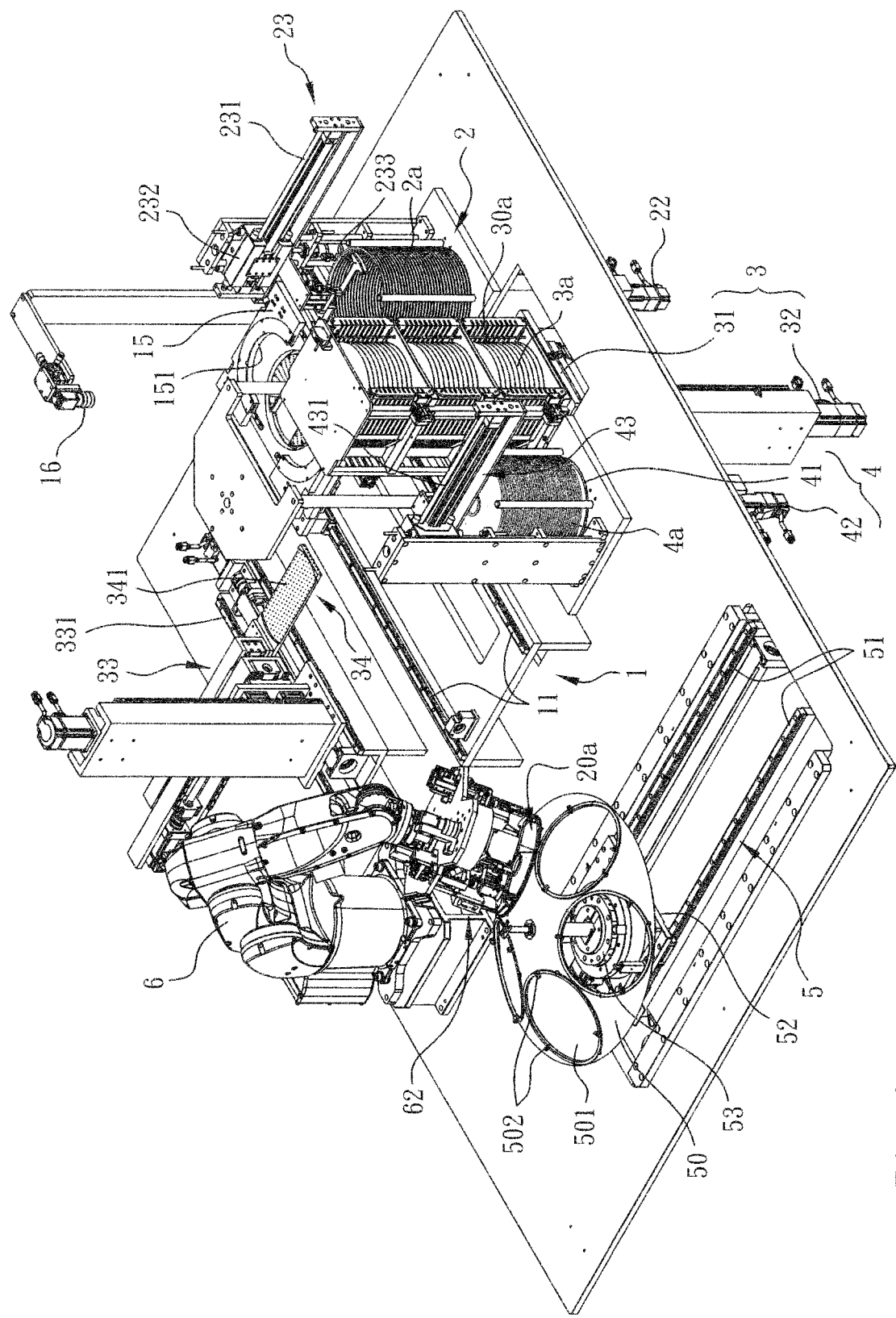
FIG. 27 is a perspective view of the present invention, showing the operation that the installation/uninstallation mechanism locks the holders around the assembly carrier section to be assembled.

In step S53 of using the installation/uninstallation mechanism to lock the holders so as to secure the assembly, the control module drives the holder operation components 623 to lock the respective holders 502, whereby the assembly 20a can be secured on the assembly carrier section 501 to be assembled (as shown in FIG. 27).

Figure 28:
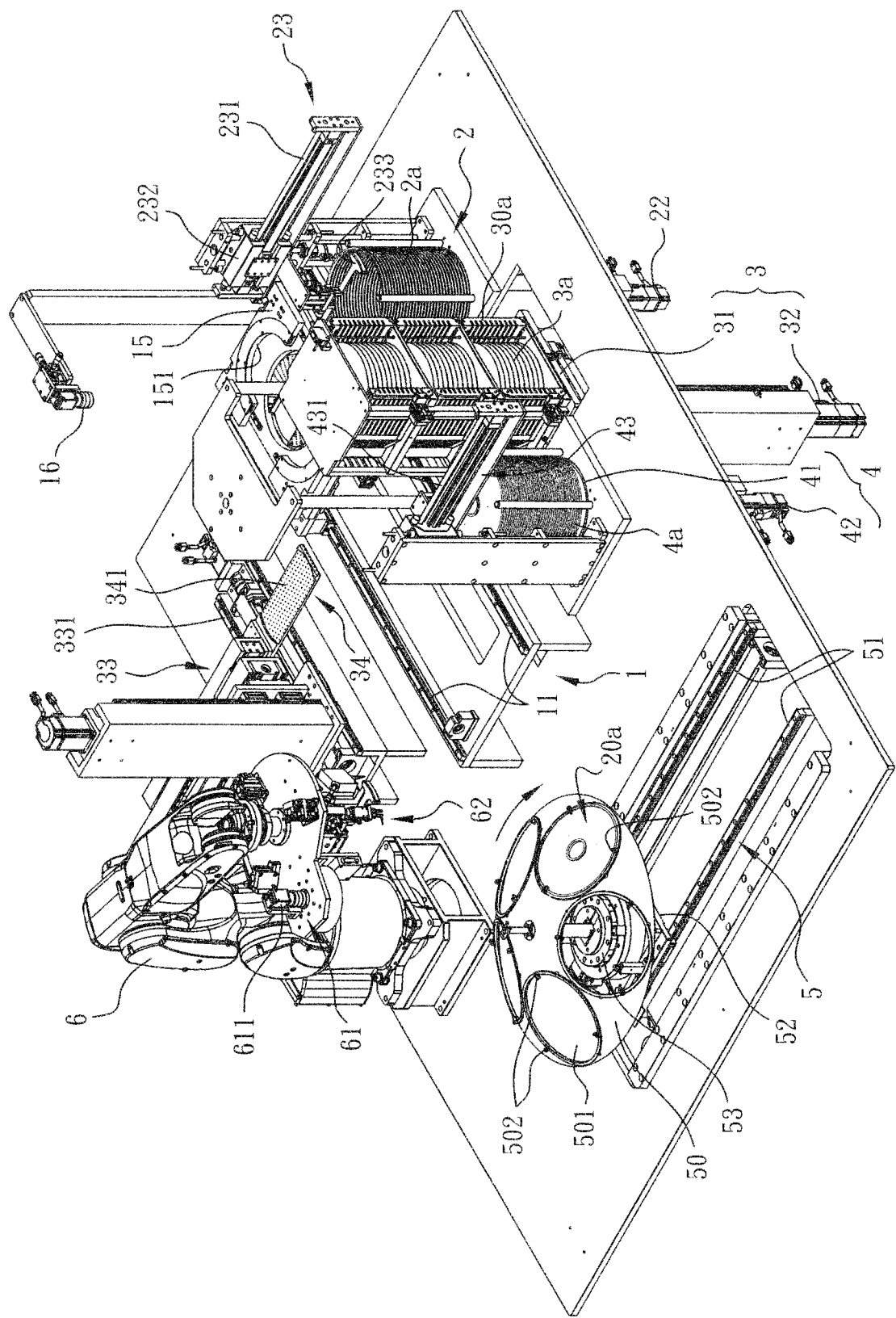
FIG. 28 is a perspective view of the present invention, showing the operation that the carrier disc is pivotally rotated after the installation/uninstallation mechanism is separated from the carrier disc.

In step S54 of making the installation/uninstallation mechanism separate from the assembly and rotating the carrier disc, after the holding components 622 release the assembly 20a, the control module drives the pivotally rotatable assembly 53 to drive the carrier disc 50 to pivotally rotate, whereby the assembly carrier section 501 on which the assembly 20a is secured is pivotally rotated to a lateral position, while another vacant assembly carrier section 501 beside the assembly carrier section 501 is moved to the original position to be assembled to form another assembly carrier section 501 to be assembled (as shown in FIG. 28). Therefore, the above procedures can be repeated so as to respectively secure the assemblies 20a on the assembly carrier sections 501 of the carrier disc 50 to be assembled.

Figure 29:
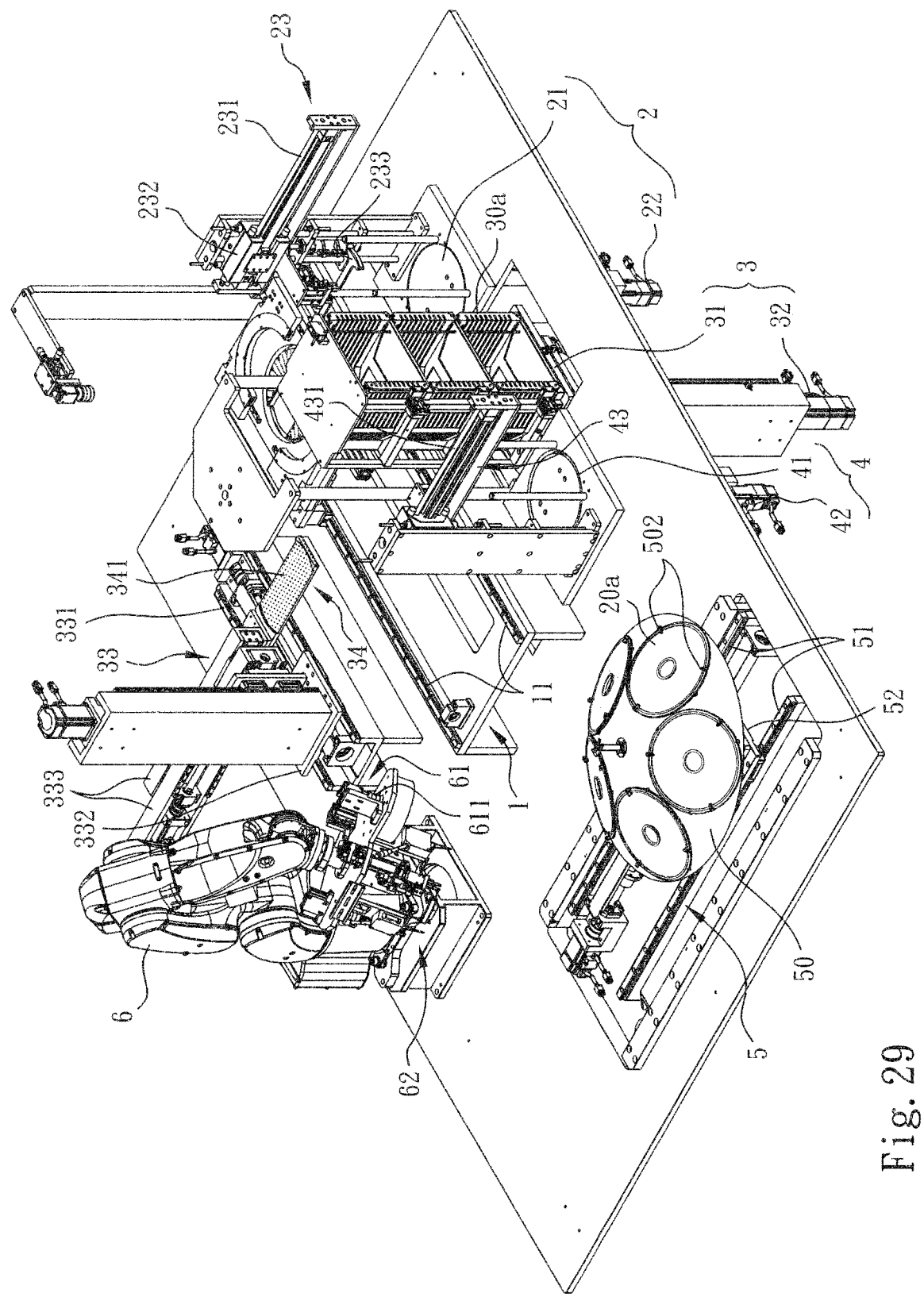
FIG. 29 is a perspective view of the present invention, showing a state that the second seat body moves the carrier disc on which the assembly is placed to an outer side or the carrier disc with the processed wafer is placed on the second seat body.

Finally, after the assemblies 20a are respectively secured on the carrier disc 50, the control module drives the second seat body 52 of the second displacement mechanism 5 to move to one end of the respective second guide rails 51 distal from the first displacement mechanism 1 (as shown in FIG. 29) so as to take off the carrier disc 50 for successive processing operations to the wafers 3a.

Figure 30:
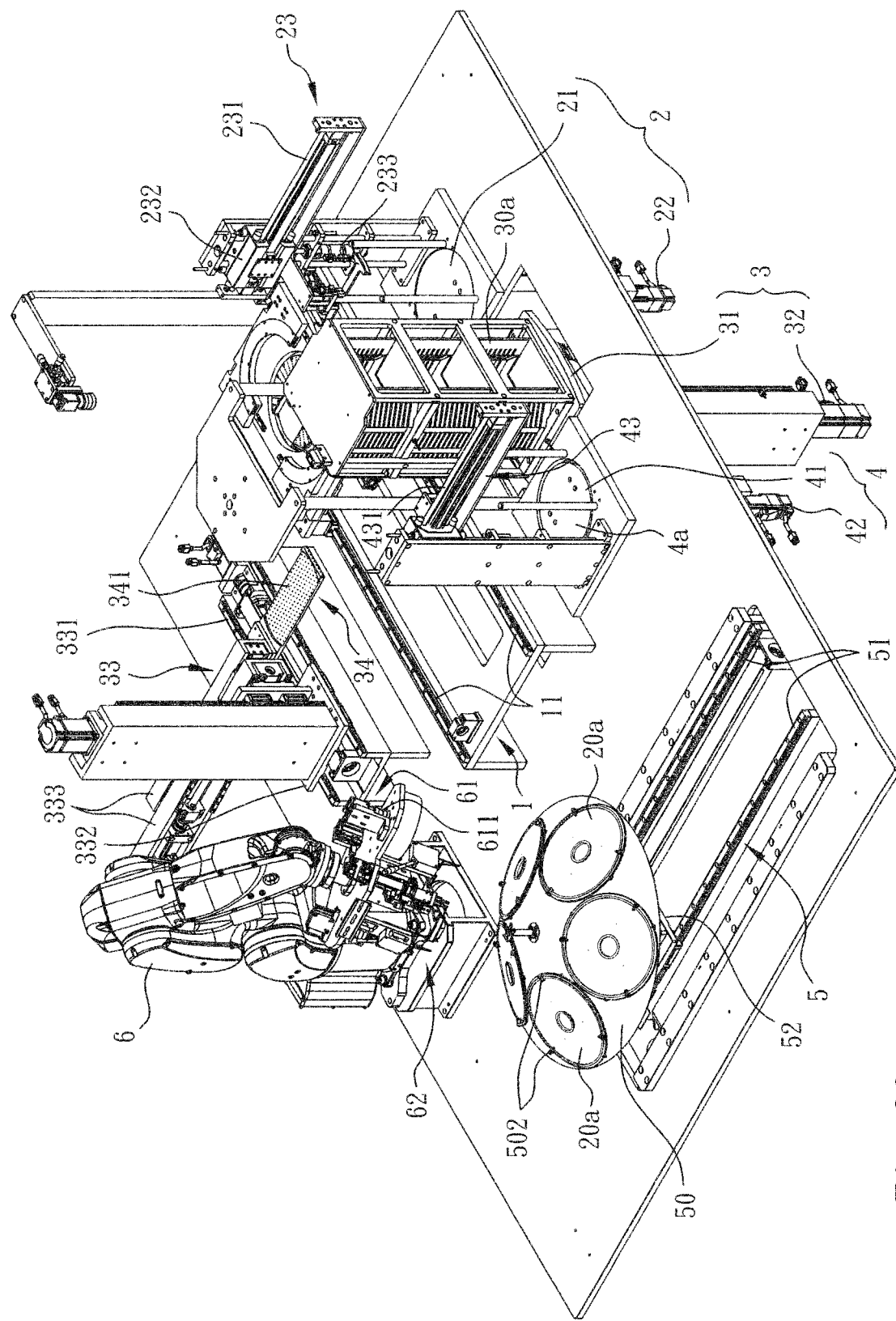
FIG. 30 is a perspective view of the present invention, showing the operation that the second seat body drives the carrier disc to move to a fixed removing operation position.

In step S60 of moving the carrier disc on which the assembly is rested to a fixed operation position, after the respective assemblies 20a (wafers 3a) on the carrier disc 50 are completely processed, the control module drives the second seat body 52 of the second displacement mechanism 5 to move to one end of the respective second guide rails 51 distal from the first displacement mechanism 1 so as to place the carrier disc 50 with the completely processed assemblies 20a (wafers 3a) onto the pivotally rotatable assembly 53 of the second displacement mechanism 5 (as shown in FIG. 29). Then the control module drives the second seat body 52 of the second displacement mechanism 5 to drive the carrier disc 50 to move to a fixed removing operation position near the first displacement mechanism 1 (as shown in FIG. 30).

Figure 31:
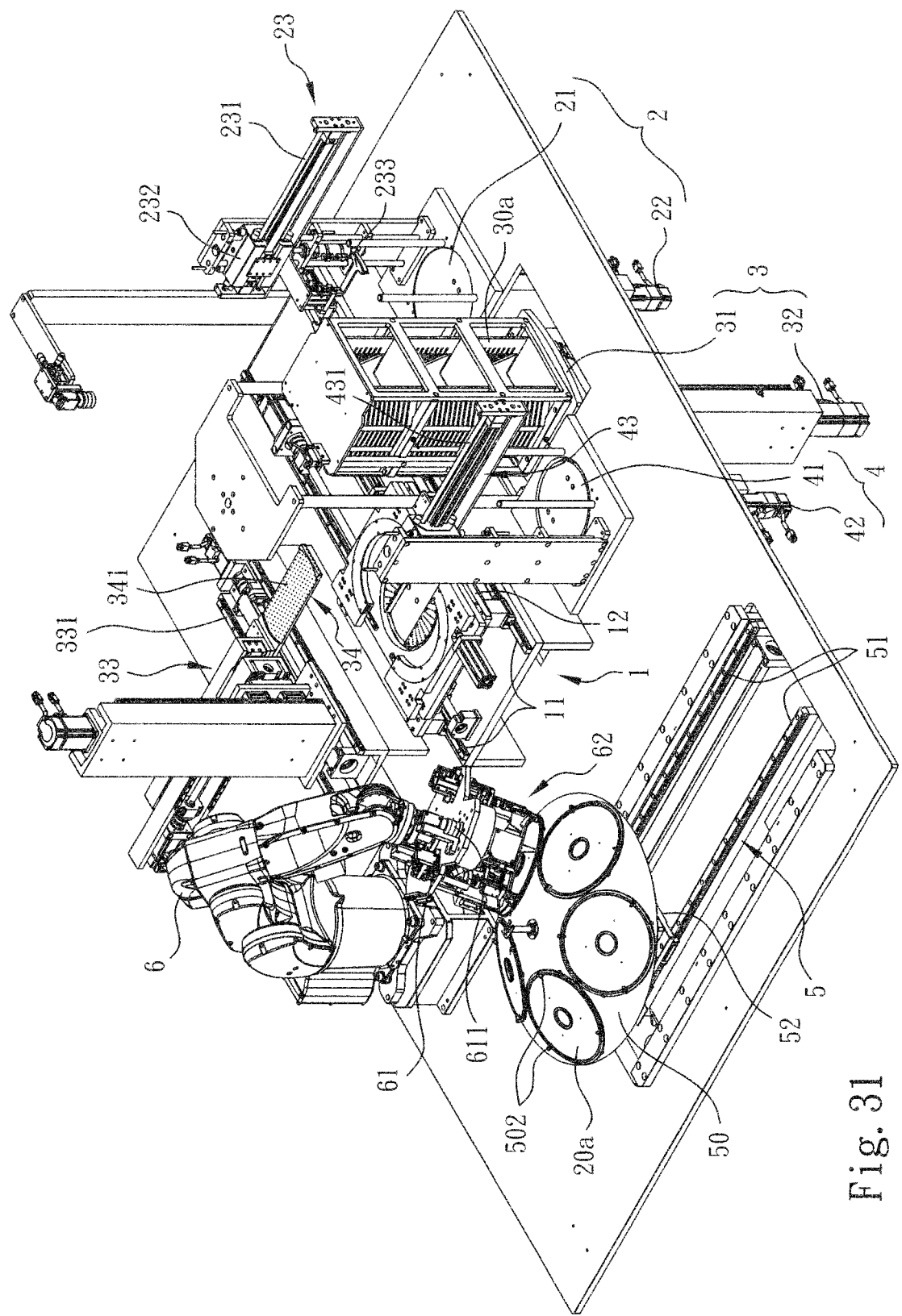
FIG. 31 is a perspective view of the present invention, showing the operation that the installation/uninstallation mechanism drives the rangefinder components to forward correspond to the assembly on the carrier disc to be uninstalled so as to correct the inclination angle of the installation/uninstallation operation face.

In step S61 of using the robotic arm to drive the installation/uninstallation mechanism to approach the carrier disc by a preset installation/uninstallation standard value and using the rangefinder components to measure the distances between the rangefinder components and the circumferences of the assembly to be uninstalled in a position to be removed, the control module drives the installation/uninstallation mechanism 62 on the robotic arm 6 to move to a position to be removed on the carrier disc 50 by the direction and angle of the preset installation/uninstallation standard value and the rangefinder components 621 are used to measure the distances between the rangefinder components 621 and the circumferences of the assemblies 20a to be uninstalled in the position to be removed (as shown in FIG. 31).

In step S62 of using the control module to adjust the position of the installation/uninstallation mechanism via the robotic arm so as to make the measured distances of the respective rangefinder components equal to each other and correct the inclination angle of the installation/uninstallation operation face of the installation/uninstallation mechanism, according to the differences between the distances measured by the rangefinder components 621, (that is, the emission length of the range finding laser beams 6211), the control module drives the installation/uninstallation mechanism 62 on the robotic arm 6 to adjust the position and makes the respective rangefinder components 621 (laser sources) measure the distances (the laser beams 6211) between the rangefinder components 621 and the circumferences of the assemblies 20a to be uninstalled and ensure the distances are equal to each other so as to correct the inclination angle of the installation/uninstallation operation face of the installation/uninstallation mechanism 62 and ensure that the installation/uninstallation operation face is in parallel to the assemblies 20a to be uninstalled. Also, the control module stores the data of the installation/uninstallation operation face after corrected.

Figure 32:
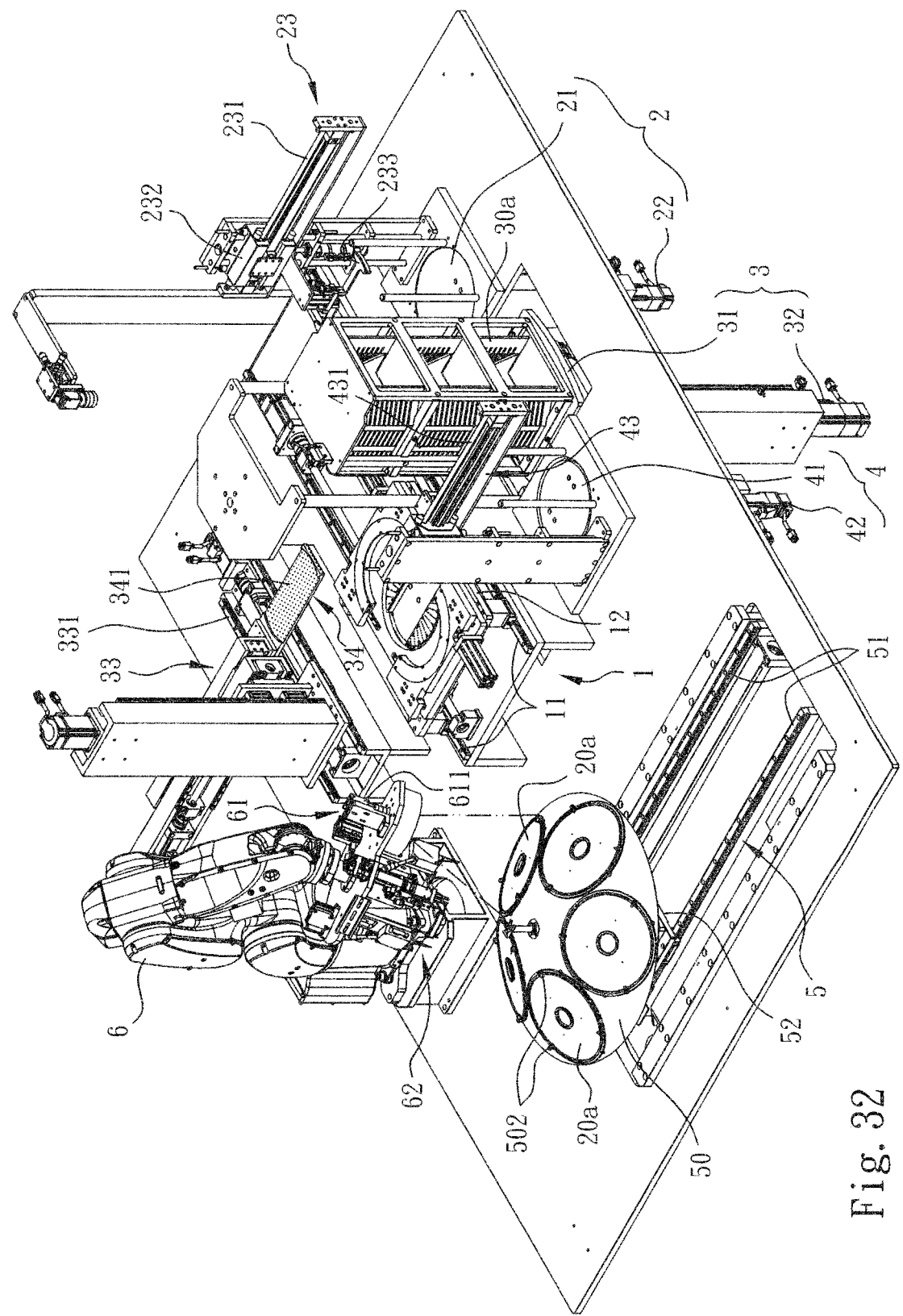
FIG. 32 is a perspective view of the present invention, showing the operation that the image capturing assembly obtains the image of the assembly to be uninstalled so as to correct the position of the image capturing face.

In step S71 of using the robotic arm to drive the image capturing assembly to approach the carrier disc by an inclination angle equal to the inclination angle of the installation/uninstallation operation face after corrected and obtain the images of the positions of the assembly to be uninstalled and the positions of the holders, the control module drives the image capturing assembly 61 on the robotic arm 6 to move to the upper side of the assembly 20*a* to be uninstalled by an inclination angle and direction identical to the inclination angle and direction of the installation/uninstallation operation face after corrected. The image capturing component 611 is used to obtain the images of the circumference of the assembly 20*a* to be uninstalled (as shown in FIG. 32) so as to ensure the position and state of the assembly 20*a* to be uninstalled and the positions and states of the respective holders 502.

In step S72 of using the control module to adjust the position of the image capturing assembly via the robotic arm to make the image capturing assembly truly correspond to the assembly to be uninstalled so as to correct the position of image capturing face of the image capturing assembly and by means of the data of the image capturing face after corrected to correct the installation/uninstallation operation face so as to make the installation/uninstallation operation face forward accurately correspond to the assembly to be uninstalled, according to the differences between the aforesaid obtained image positions of the assembly 20*a* to be uninstalled, the control module drives the image capturing assembly 61 on the robotic arm 6 to adjust the position so as to correct the position of the image capturing face of the image capturing assembly 61 and ensure that the image capturing assembly 61 truly and plainly corresponds to the assembly 20*a* to be uninstalled. In addition, the control module stores the data of the image capturing face after corrected (as shown in FIG. 32).

In a preferred embodiment, positioning marks (not shown, can be cross scales or other marking structures) are disposed on predetermined sections of the circumferences of the holders 502. In addition, relative marks (not shown, can be cross scales or other marking structures) are disposed on the lens of the image capturing component 611 of the image capturing assembly 61 corresponding to the positioning marks of the holders 502. The image capturing assembly 61 can adjust the positions to make the relative marks coincide with the positioning marks. This can achieve the effect of correcting the image capturing face of the image capturing assembly 61.

The image capturing assembly 61 captures images by an inclination angle and direction identical to the inclination angle and direction of the installation/uninstallation operation face after corrected.

Therefore, after the position of the image capturing face is corrected, the control module can calculate according to the corrected position of the image capturing face and store the data of the again corrected position needed by the installation/uninstallation mechanism 62. Accordingly, the control module can directly and quickly again drive the installation/uninstallation mechanism 62 on the robotic arm 6 to move to a position forward accurately corresponding to the assembly 20*a* to be uninstalled.

Figure 33:
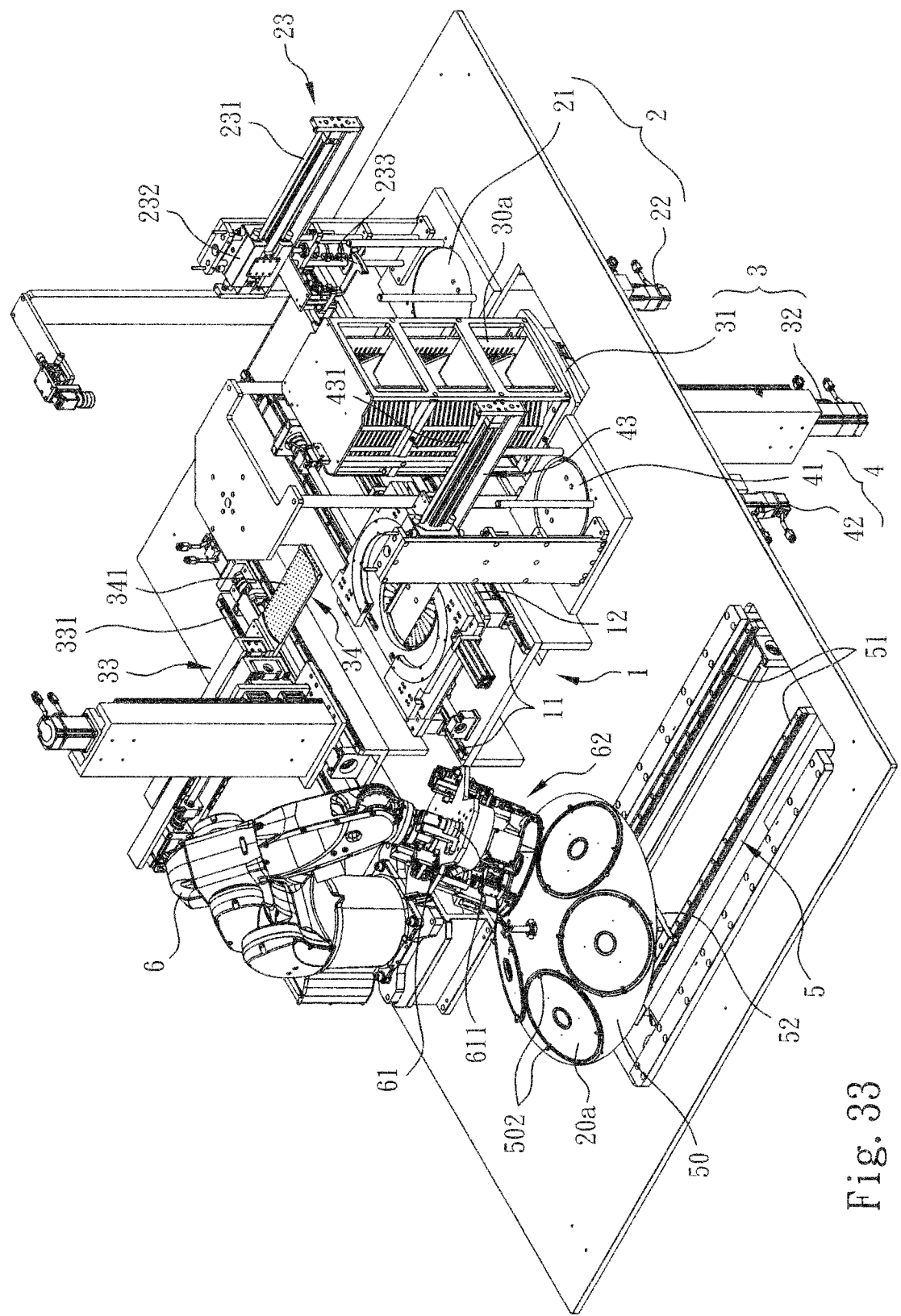
FIG. 33 is a perspective view of the present invention, showing the operation that the installation/uninstallation mechanism unlocks the holders around the assembly to be uninstalled.

In step S81 of using the installation/uninstallation mechanism to unlock the holders, the control module drives the installation/uninstallation mechanism 62 on the robotic arm 6 to move to upper side of the assembly 20*a* to be uninstalled and the holder operation components 623 release the holders 502 (as shown in FIG. 33).

Figure 34:
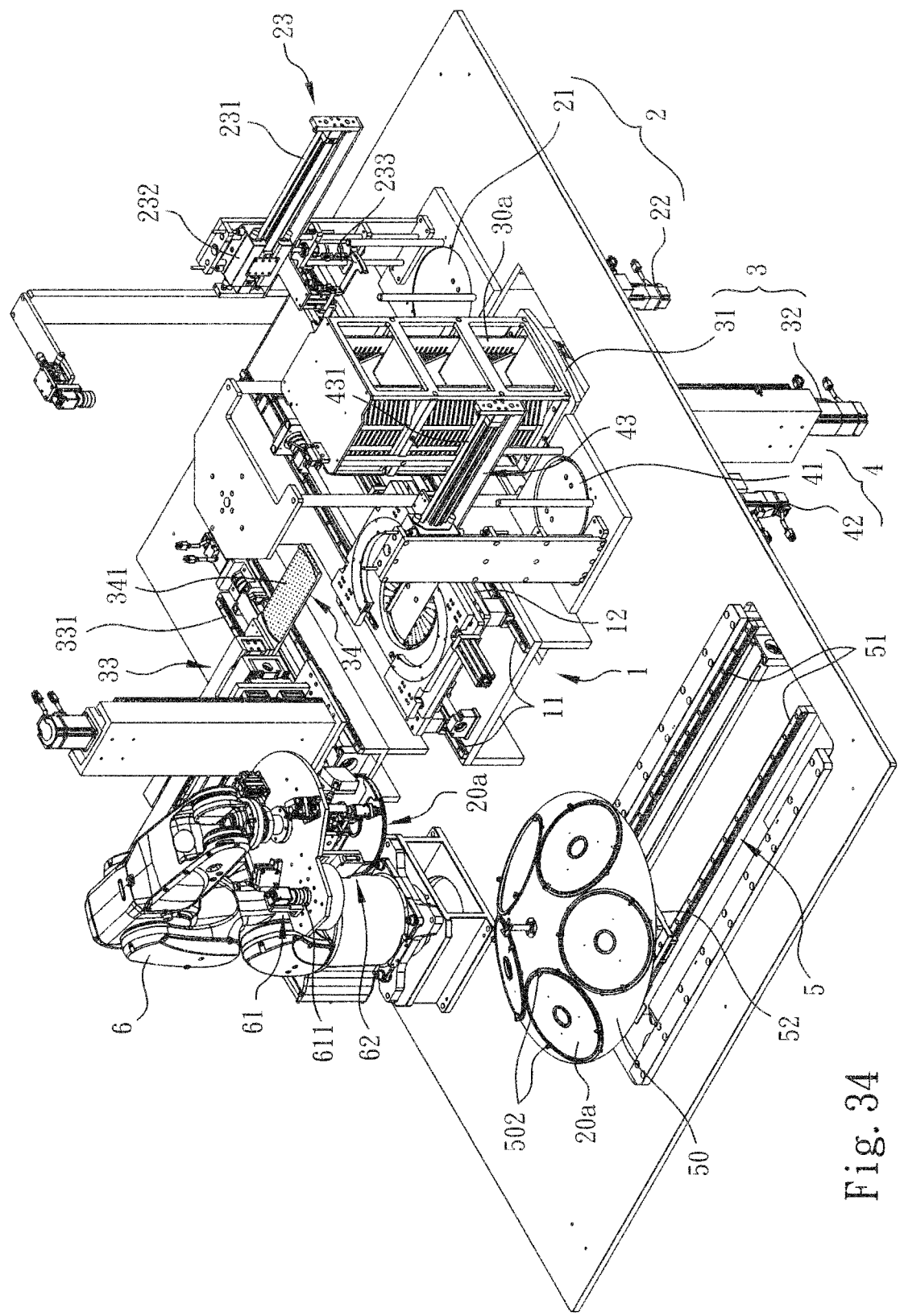
FIG. 34 is a perspective view of the present invention, showing the first operation that the installation/uninstallation mechanism moves the assembly to be uninstalled from the carrier disc to the first seat body.
Figure 35:
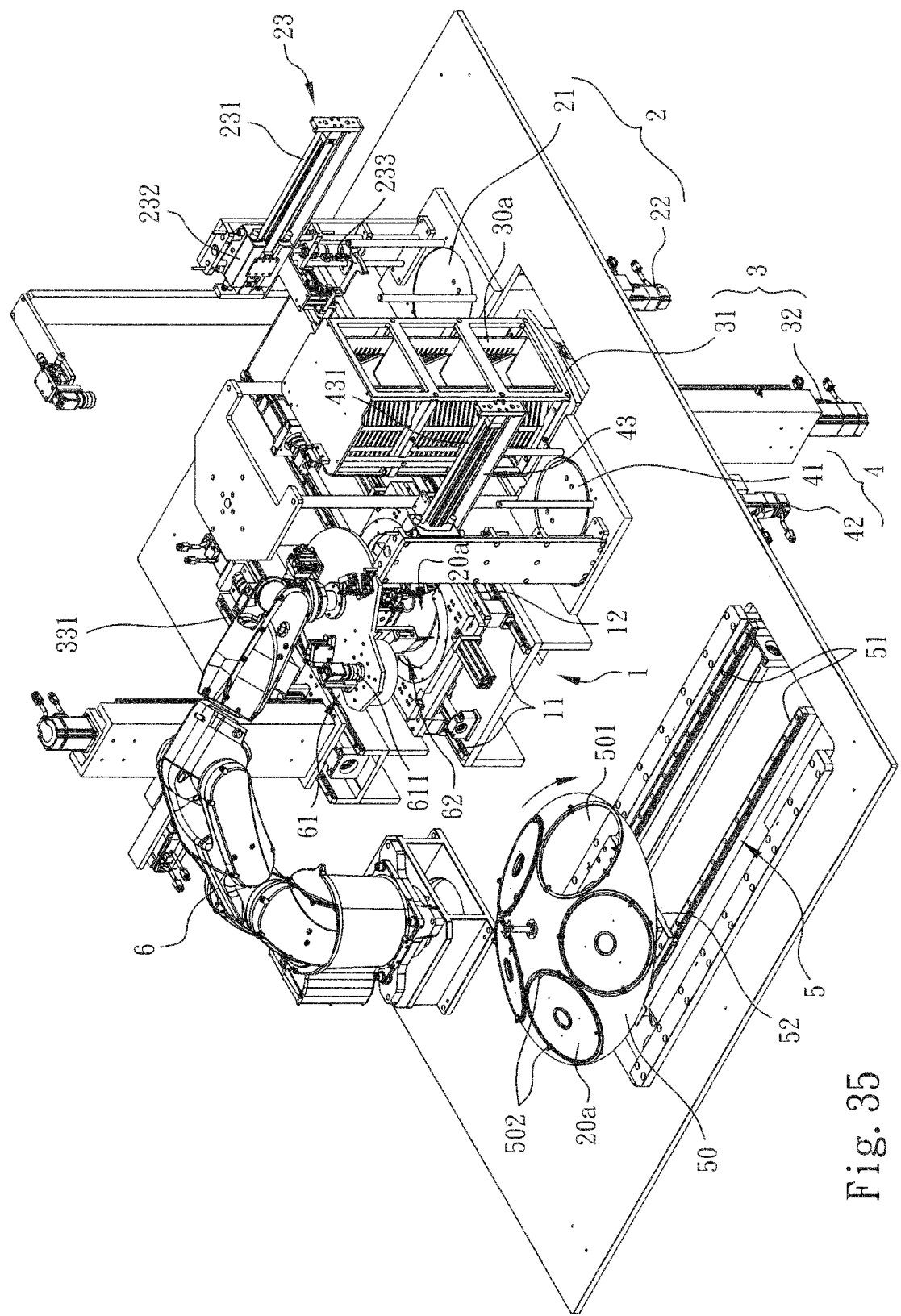
FIG. 35 is a perspective view of the present invention, showing the second operation that the installation/uninstallation mechanism moves the assembly to be uninstalled from the carrier disc to the first seat body.

In step S82 of using the installation/uninstallation mechanism to remove the assembly to be uninstalled onto the first seat body, the control module drives the installation/uninstallation mechanism 62 on the robotic arm 6 to make the holding components 622 hold the assembly 20*a* to be uninstalled. Then the assembly 20*a* to be uninstalled is moved onto the pre-jig uninstallation section 121 (hollow hole) of the first seat body 12 (as shown in FIGS. 34 and 35). At this time, the control module drives the support seat lifting assembly 133 of the first displacement mechanism 1 to drive the support seat 13 to ascend and pass through the pre-jig uninstallation section 121 (hollow hole) to bear the wafer 3*a*. The air-sucking orifices 132 suck air to suck and secure the wafer 3*a* and prevent the wafer 3*a* from being displaced or damaged or broken in the successive moving process.

In step S83 of making the installation/uninstallation mechanism separate the assembly to be uninstalled and rotating the carrier disc, after the holding components 622 remove and release the assembly 20*a* to be uninstalled, the control module drives the pivotally rotatable assembly 53 of the second displacement mechanism 5 to drive the carrier disc 50 to pivotally rotate, whereby the assembly carrier section 501 from which the assembly 20*a* has been removed is pivotally rotated to a lateral position, while the assembly 20*a* on another lateral side is moved to the original position to be removed to form another assembly 20*a* to be uninstalled (as shown in FIG. 35). Therefore, the above procedures can be repeated so as to respectively move the assemblies 20*a* onto the pre-jig uninstallation section 121 of the first seat body 12.

Figure 36:
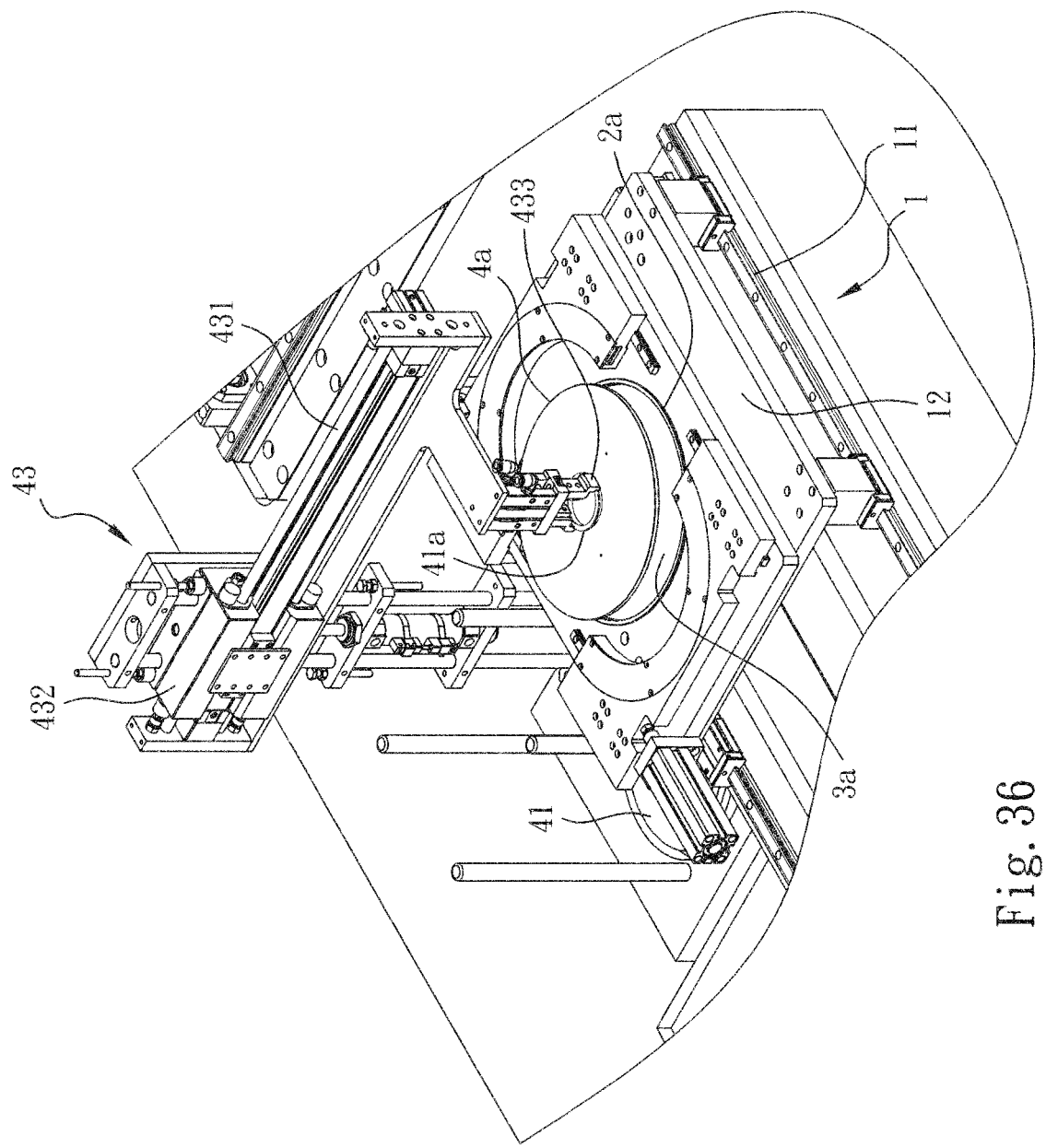
FIG. 36 is a perspective view of the present invention, showing the operation that the mask removing assembly removes the mask.
Figure 37:
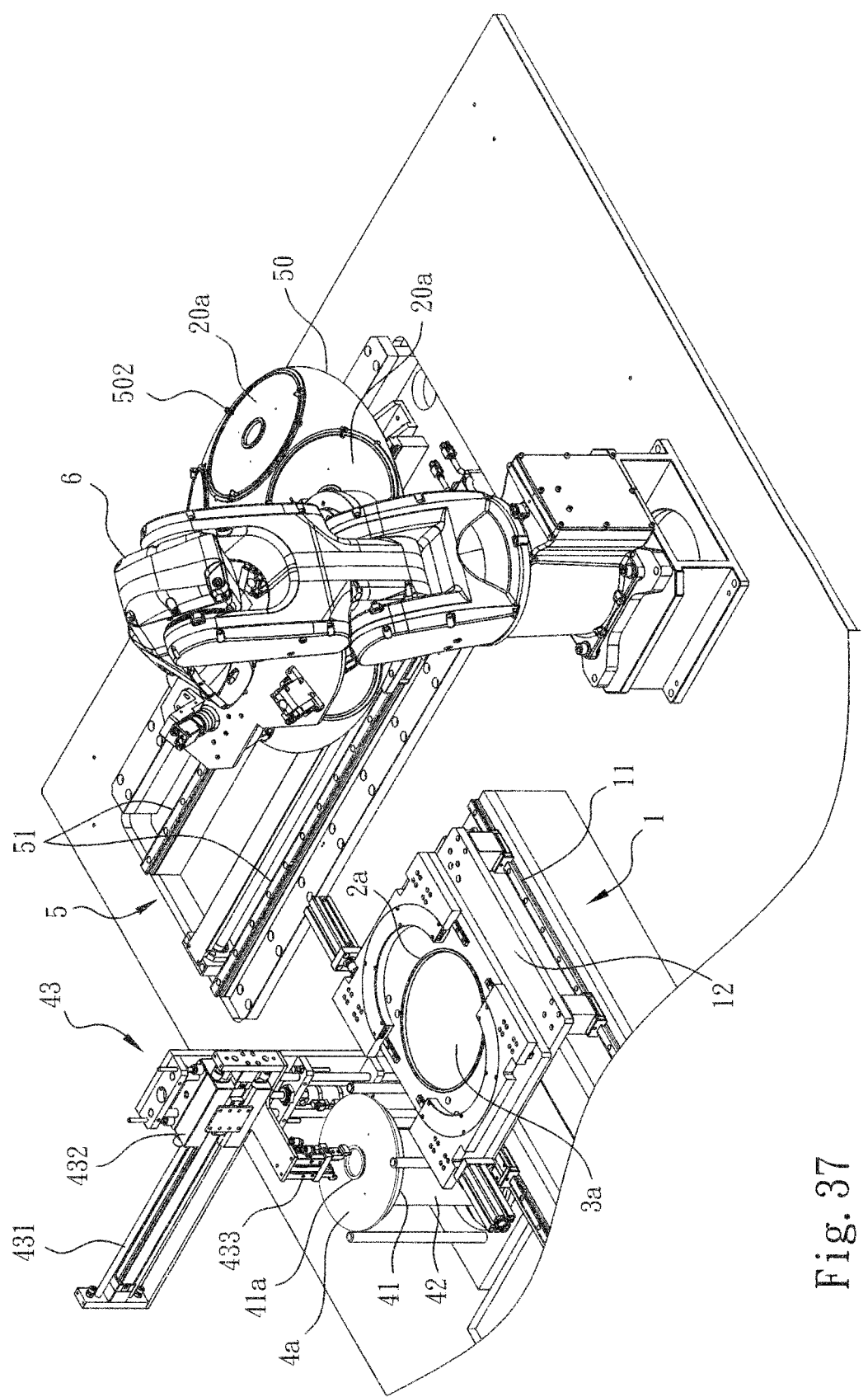
FIG. 37 is a perspective view of the present invention, showing the operation that a set of holding claws of the mask removing assembly is separated from the mask.

In step S91 of using the mask installation/uninstallation mechanism to remove and recover the mask, the control module drives the mask removing assembly 43 of the mask installation/uninstallation mechanism 4 to drive the set of holding claws 433 to approach the upper side of the pre-jig uninstallation section 121 of the first seat body 12. The set of holding claws 433 are used to hold the annular raised section 41*a* of the uppermost mask 4*a* of the assembly 20*a* to be uninstalled (as shown in FIG. 36). Then the mask removing slide seat 432 ascends/descends and the mask removing guide rail 431 is transversely slid to move the mask 4*a* onto the mask rest seat 41. Then the set of holding claws 433 release the annular raised section 41*a* (as shown in FIG. 37) to place the mask 4*a* onto the mask rest seat 41. At this time, the wafer frame 2*a* and the wafer 3*a* remain in the pre-jig uninstallation section 121.

In practice, the mask lifting assembly 42 can cooperatively drive the mask rest seat 41 to ascend/descend, whereby the mask removing assembly 43 can more easily move the mask 4*a* onto the mask rest seat 41.

Figure 38:
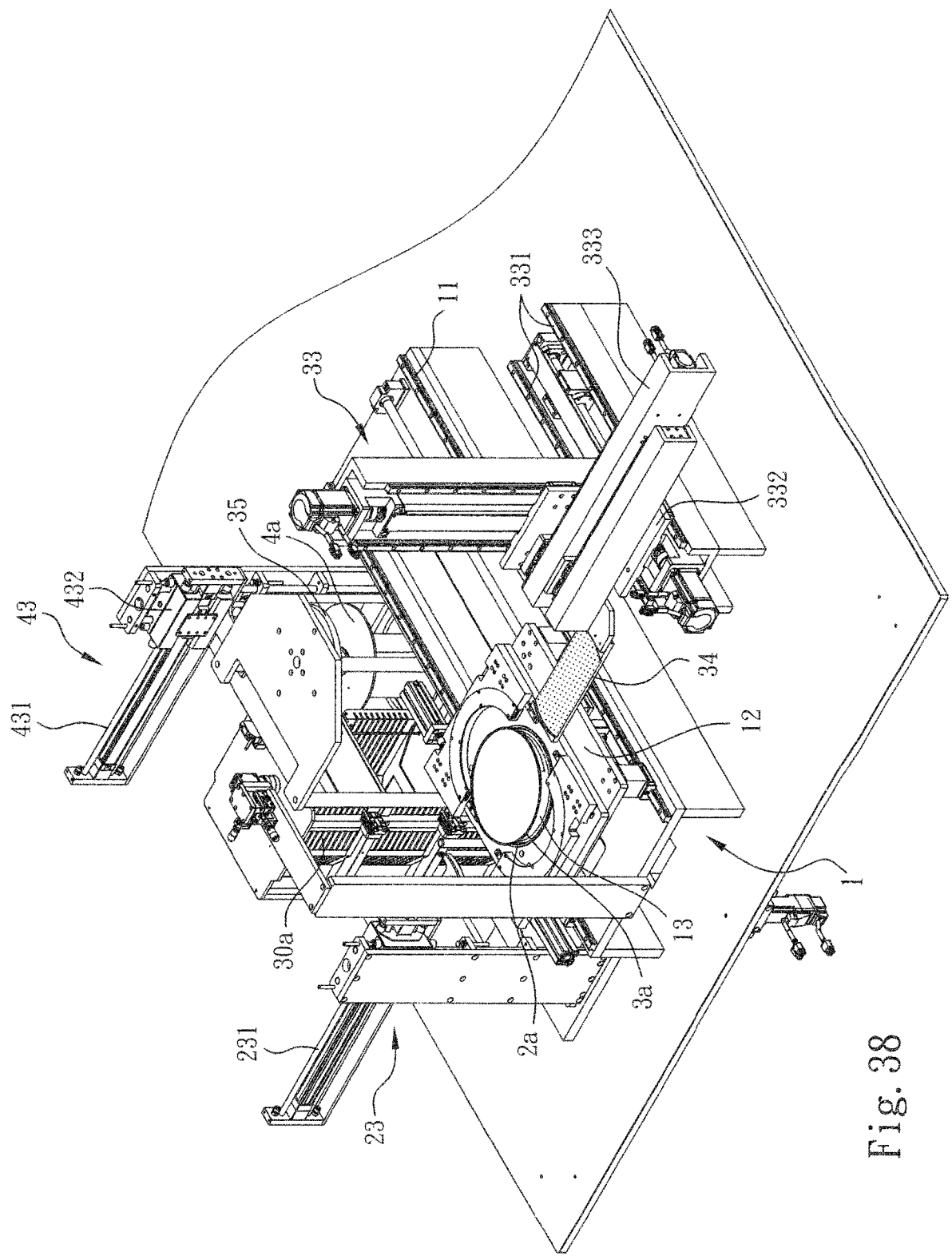
FIG. 38 is a perspective view of the present invention, showing the first operation that the wafer removing assembly removes the wafer.
Figure 39:
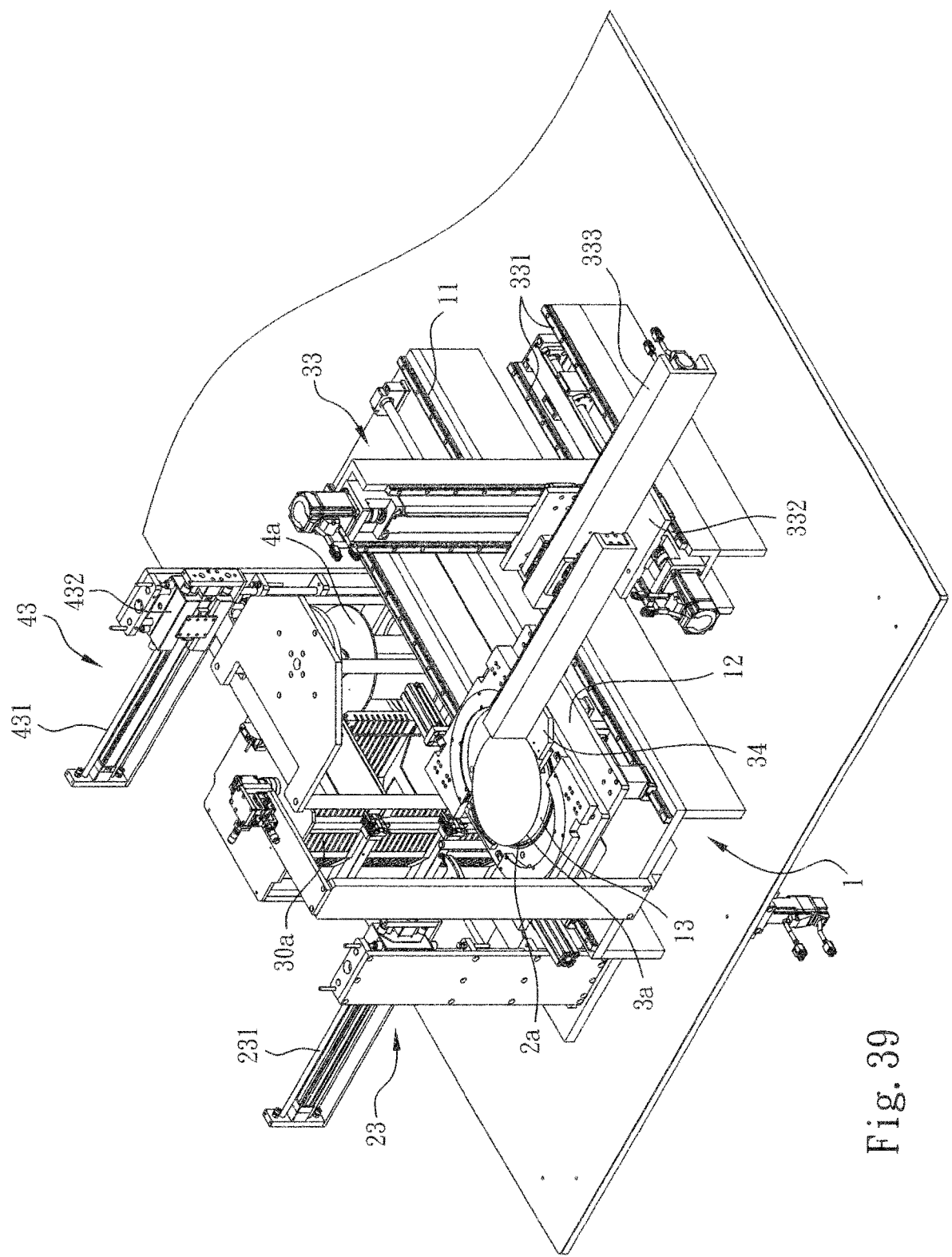
FIG. 39 is a perspective view of the present invention, showing the second operation that the wafer removing assembly removes the wafer.
Figure 40:
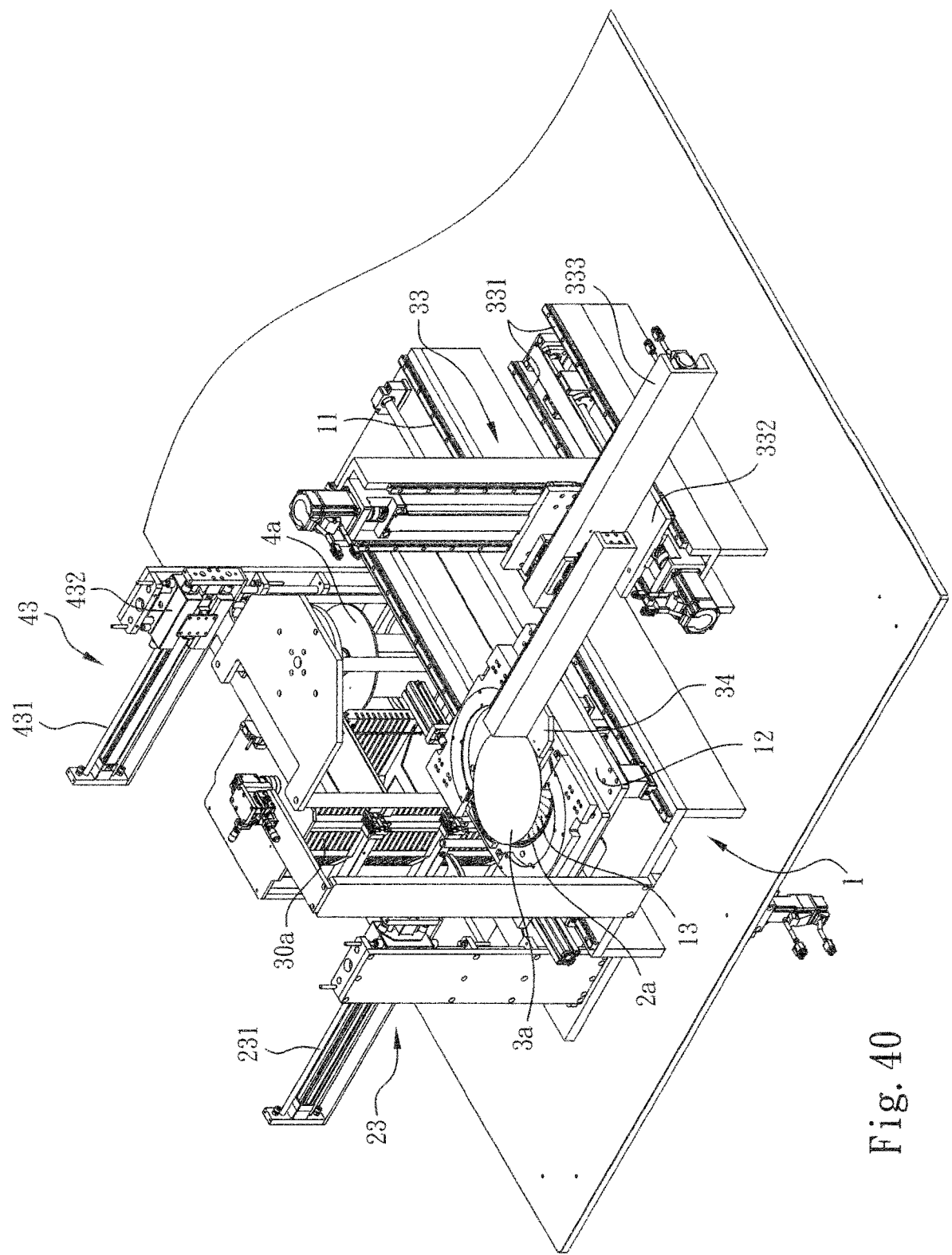
FIG. 40 is a perspective view of the present invention, showing the third operation that the wafer removing assembly removes the wafer.
Figure 41:
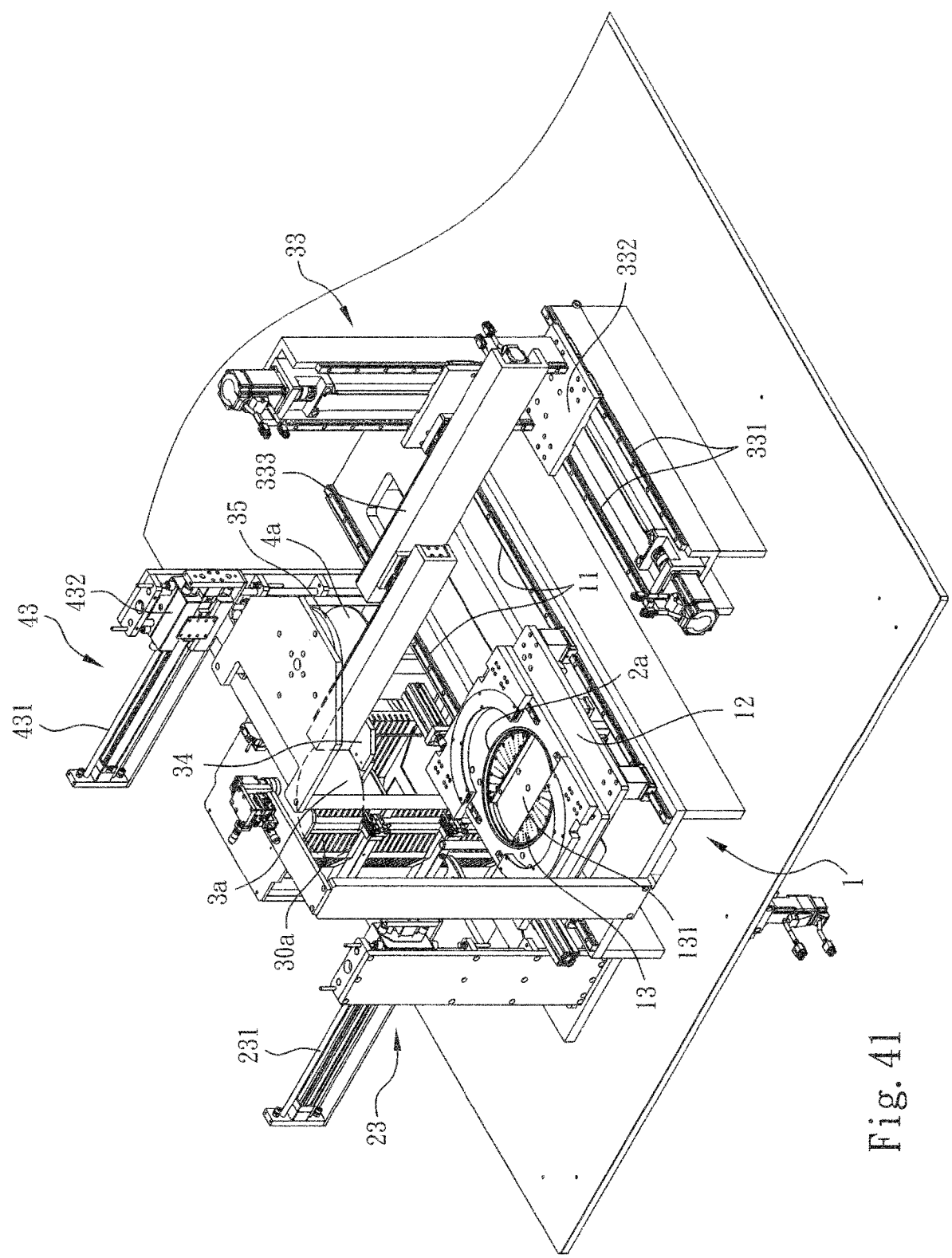
FIG. 41 is a perspective view of the present invention, showing the fourth operation that the wafer removing assembly removes the wafer.

In step S92 of using the wafer installation/uninstallation mechanism to remove and recover the wafer, the first seat body 12 is first moved along the first guide rails 11 to a position near one side of the wafer frame installation/uninstallation mechanism (or the wafer installation/uninstallation mechanism 3) as necessary. Then the control module drives the support seat lifting assembly 133 of the first displacement mechanism 1 to drive the support seat 13 to bear and lift the wafer 3*a*, whereby the channel 131 of the support seat 13 is exposed to outer side (as shown in FIG. 38). At the same time, the control module drives the wafer installation/uninstallation mechanism 3 to drive the wafer removing slide seat 332 of the wafer removing assembly 33 to move. The telescopic assembly 333 cooperatively extends, whereby the wafer bracket 34 extends into the channel 131 of the support seat 13 to bear the wafer 3*a*. Also, the air sucking orifices 341 suck air to suck and secure the wafer 3*a* (as shown in FIG. 39). Then the air-sucking orifices 132 stop sucking air and the support seat lifting assembly 133 drives the support seat 13 to descend and separate from the wafer 3*a* (as shown in FIG. 40). Then the wafer removing slide seat 332 of the wafer removing assembly 33 is moved and the telescopic assembly 333 cooperatively extends, whereby the wafer bracket 34 can stably move the wafer 3a into the wafer cartridge 30a (as shown in FIG. 41). At this time, the wafer frame 2a remains in the pre-jig uninstallation section 121.

In practice, the wafer lifting assembly 32 can cooperatively drive the wafer rest seat 31 to ascend/descend, whereby the wafer bracket 34 can more easily move the wafer 3a into the wafer cartridge 30a in a proper position at a proper height.

Figure 42:
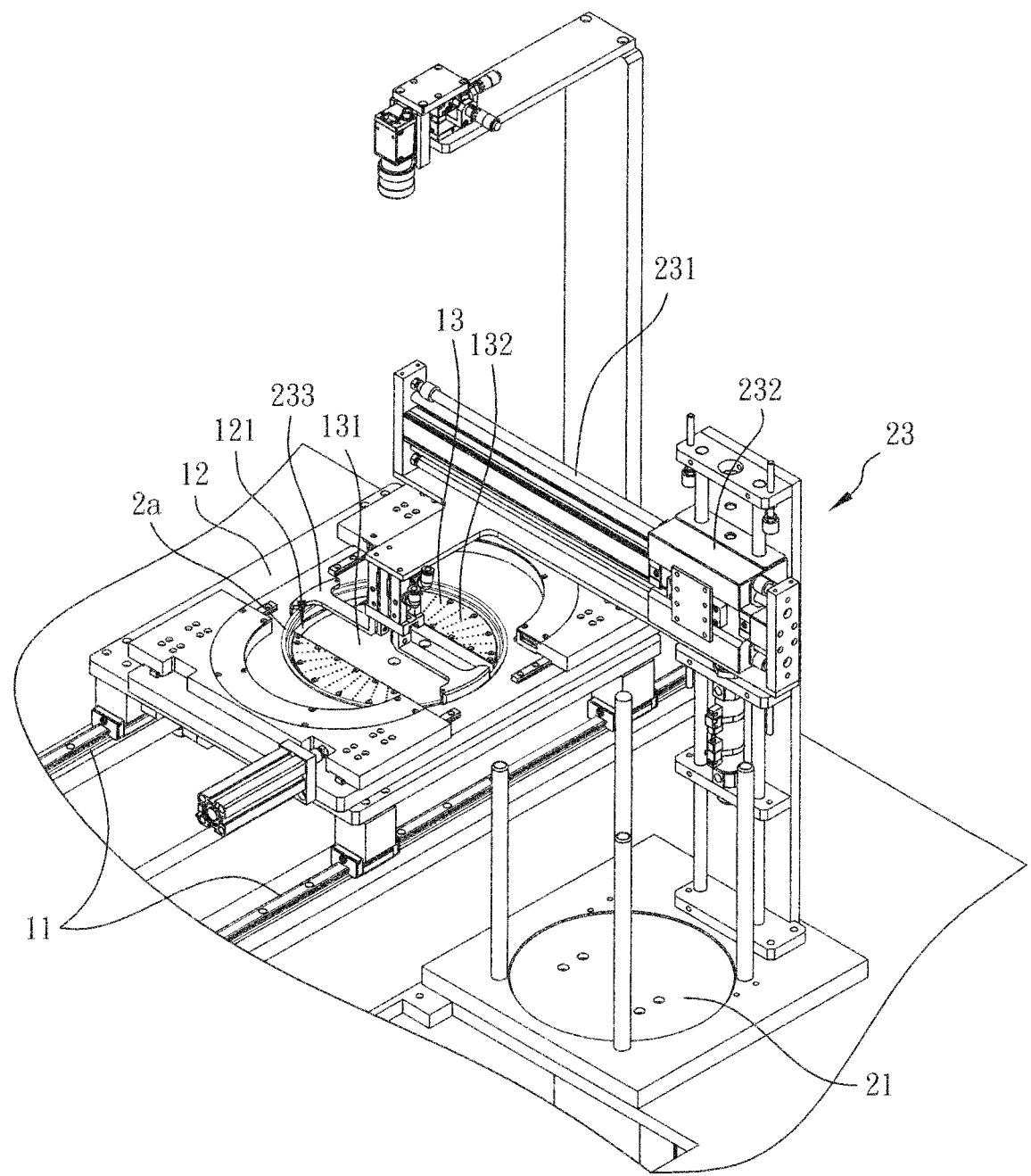
FIG. 42 is a perspective view of the present invention, showing the first operation that the wafer frame removing assembly removes the wafer frame.
Figure 43:
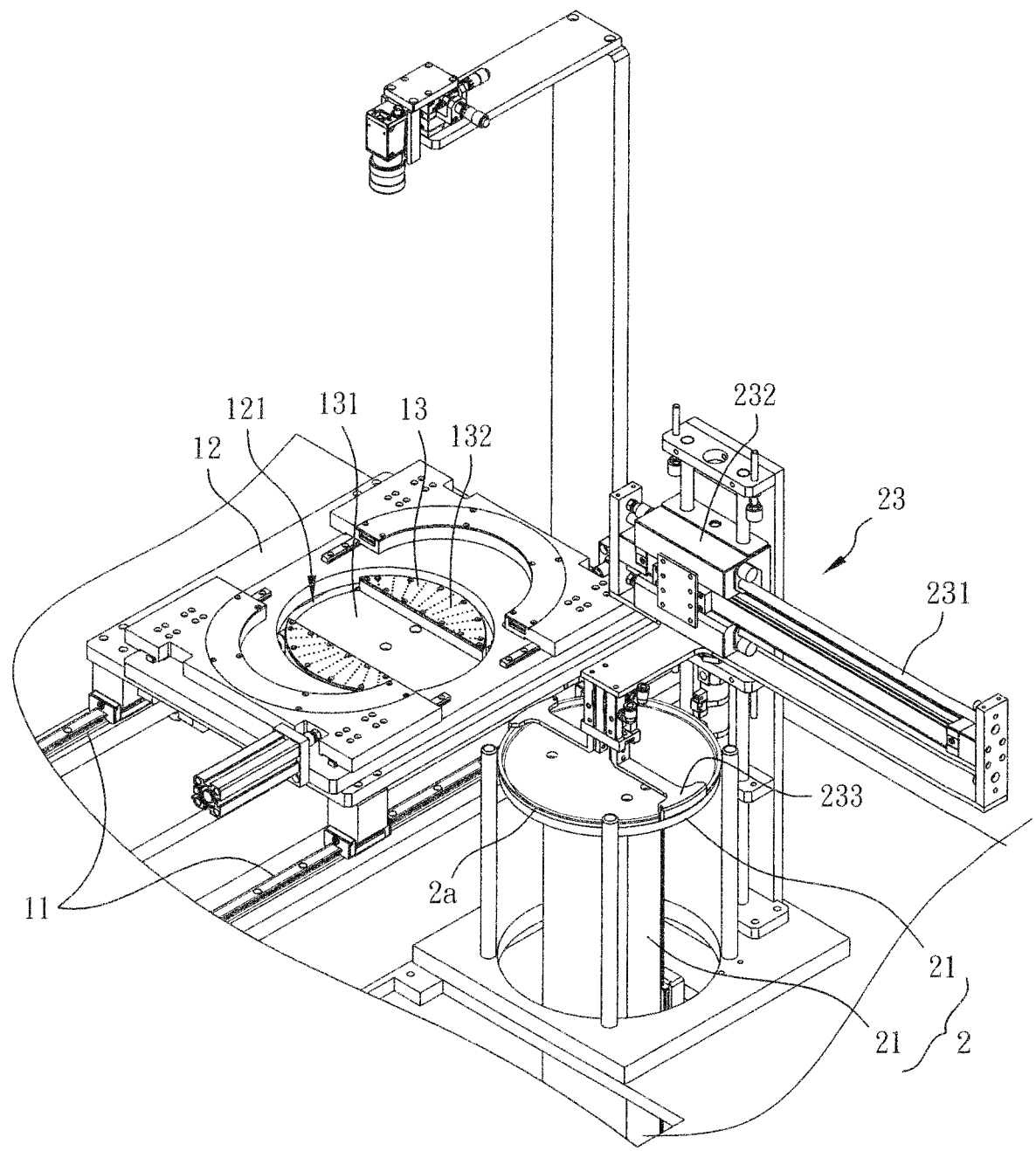
FIG. 43 is a perspective view of the present invention, showing the second operation that the wafer frame removing assembly removes the wafer frame.

In step S93 of using the wafer frame installation/uninstallation mechanism to remove and recover the wafer frame, the control module drives the wafer frame installation/uninstallation mechanism 2 to make the wafer frame removing assembly 23 drive the set of holding components 233 to get close to the upper side of the pre-jig uninstallation section 121 of the first seat body 12. The set of holding components 233 are used to hold the wafer frame 2a on the pre-jig uninstallation section 121 (as shown in FIG. 42). In addition, the wafer frame removing slide seat 232 ascends/descends and the wafer frame removing guide rail 231 is transversely slid to move the wafer frame 2a onto the wafer frame rest seat 21 (as shown in FIG. 43). Then the holding components 233 release the wafer frame 2a to place the wafer frame 2a on the wafer frame rest seat 21.

In practice, the wafer frame lifting assembly 22 can cooperatively drive the wafer frame rest seat 21 to ascend/descend, whereby the wafer frame removing assembly 23 can more easily move the wafer frame 2a onto the wafer frame rest seat 21.

The installation/uninstallation mechanism of the present invention can one by one disassemble the completely processed assemblies 20a on the carrier disc 50 into the masks 4a, completely processed wafers 3a and the wafer frames 2a, which are then respectively removed onto the mask rest seat 41, the wafer rest seat 31 and the wafer frame rest seat 21 to form a mechanized automatic uninstallation recovering system.

In conclusion, the pre-jig wafer carrier disc installation/uninstallation device of the present invention utilizes simple mechanisms and operation to respectively assemble the wafer frame, the wafer and the mask and accurately move and secure the wafer frame, the wafer and the mask on a carrier disc in different positions. Then the completely processed assembly is disassembled into the wafer frame, the wafer and the mask, which are respectively recovered. The pre-jig wafer carrier disc installation/uninstallation device of the present invention is truly inventive and advanced.

The above embodiments are only used to illustrate the present invention, not intended to limit the scope thereof. Many modifications of the above embodiments can be made without departing from the spirit of the present invention.

What is claimed is:

1. A pre-jig wafer carrier disc installation/uninstallation device comprising:
  a first displacement mechanism (1) connected with and drivable by a control module, the first displacement mechanism (1) having a reciprocally movable first seat body (12), a pre-jig uninstallation section (121) being disposed on the first seat body (12);
  a wafer frame installation/uninstallation mechanism (2) disposed on one side of the first displacement mechanism (1), the wafer frame installation/uninstallation mechanism (2) being connected with and drivable by the control module, the wafer frame installation/uninstallation mechanism having a wafer frame rest seat (21) for supporting wafer frames (2a), a wafer frame removing assembly (23) being disposed on one side of the wafer frame rest seat (21), the wafer frame removing assembly (23) serving to take, carry and release the wafer frames (2a), the wafer frame removing assembly (23) being movable between the wafer frame rest seat (21) and the pre-jig uninstallation section (121) of the first seat body (12);
  a wafer installation/uninstallation mechanism (3) disposed on one side of the first displacement mechanism (1), the wafer installation/uninstallation mechanism (3) being connected with and drivable by the control module, the wafer installation/uninstallation mechanism (3) having a wafer rest seat for supporting wafers (3a), a wafer removing assembly (33) being disposed on one side of the wafer rest seat (31), the wafer removing assembly (33) having a wafer bracket (34), the wafer bracket (34) being drivable by the wafer removing assembly (33) to carry the wafers (3a) and move between the wafer rest seat (31) and the pre-jig uninstallation section (121) of the first seat body (12);
  a mask installation/uninstallation mechanism (4) disposed on one side of the first displacement mechanism (1), the mask installation/uninstallation mechanism (4) being connected with and drivable by the control module, the mask installation/uninstallation mechanism (4) having a mask rest seat (41) for supporting masks (4a), a mask removing assembly (43) being disposed on one side of the mask rest seat (41), the mask removing assembly (43) serving to take, carry and release the masks (4a), the mask removing assembly (43) being movable between the mask rest seat (41) and the pre-jig uninstallation section (121) of the first seat body (12);
  a carrier disc (50), at least one assembly carrier section (501) being disposed on a surface of the carrier disc (50), multiple holders (502) being respectively disposed on a circumference of the assembly carrier section (501);
  a robotic arm (6) connected with and drivable by the control module, the robotic arm (6) having a movable end movable between the first seat body (12) and the carrier disc (50), at least one installation/uninstallation mechanism (62) being disposed at the movable end, two holding components (622) being respectively disposed on the installation/uninstallation mechanism (62), which can be oppositely opened and closed to hold an assembly (20a), multiple holder operation components (623) corresponding to the holders (502) for unlocking the holders (502) and multiple rangefinder components (621) for measuring distances being also disposed on the installation/uninstallation mechanism (62); and
  a second displacement mechanism (5) being disposed on one side of the first displacement mechanism (1), the second displacement mechanism (5) having a reciprocally movable second seat body (52), a pivotally rotatable assembly (53) being disposed on the second seat body (52) for supporting the carrier disc (50).

2. The pre-jig wafer carrier disc installation/uninstallation device as claimed in claim 1, wherein an image capturing assembly (61) is additionally disposed at the movable end of the robotic arm (6) for capturing images.

3. The pre-jig wafer carrier disc installation/uninstallation device as claimed in claim 2, wherein a wafer frame lifting assembly (22) is disposed under the wafer frame rest seat (21) for driving the wafer frame rest seat (21) to ascend/descend, the wafer frame removing assembly (23) having wafer frame removing slide seat (232), which can ascend/descend, a reciprocally movable wafer frame removing guide rail (231) being disposed on the wafer frame removing slide seat (232), a set of holding components (233) being disposed on the wafer frame removing guide rail (231) for holding one of the wafer frames (2a), a wafer lifting assembly (32) being disposed under the wafer rest seat (31) for driving the wafer rest seat (31) to ascend/descend, the wafer removing assembly (33) having multiple wafer removing guide rails (331) and a wafer removing slide seat (332) reciprocally movably disposed on the wafer removing guide rails (331), a vertically movable telescopic assembly (333) being disposed on the wafer removing slide seat (332), the wafer bracket (34) being disposed at the movable end of the telescopic assembly (333), a mask lifting assembly (42) being disposed under the mask rest seat (41) for driving the mask rest seat (41) to ascend/descend, the mask removing assembly (43) having a vertically movable mask removing slide seat (432), a transversely reciprocally movable mask removing guide rail (431) being disposed on the mask removing slide seat (432), a set of holding claws (433) being disposed on the mask removing guide rail (431) for holding the masks (4a).

4. An installation method employing the installation/uninstallation device as claimed in claim 2, comprising:
   step P1 of respectively positioning the carrier disc, the wafer frames, the wafers and the masks in fixed positions, a vacant carrier disc (50) being disposed in a fixed predetermined operation (assembling) position and the wafer frames (2a), wafers (3a) and masks (4a) being respectively disposed in a fixed predetermined material supply position;
   step S20 of using the wafer frame installation/uninstallation mechanism to pick and place a wafer frame in a first displacement mechanism, the control module driving the wafer frame installation/uninstallation mechanism (2) to pick a selected wafer frame (2a) from said wafer frames (2a) by removing the selected wafer frame (2a) from the fixed material supply position and place the selected wafer frame (2a) into the pre-jig uninstallation section (121) of the first seat body (12) to be supported thereby;
   step P2 of using the wafer installation/uninstallation mechanism to select a wafer from said wafers and place into the selected wafer frame, the control module driving the wafer installation/uninstallation mechanism (3) to move the selected wafer (3a) onto the first displacement mechanism (1) for correction, then the selected wafer (3a) being placed into the selected wafer frame (2a);
   step S30 of using the mask installation/uninstallation mechanism to select a mask from said masks and place into the selected wafer frame and overlay the selected mask onto the selected wafer to form an assembly, the control module driving the mask installation/uninstallation mechanism (4) to move the selected mask (4a) into the selected wafer frame (2a) and overlay the selected mask (4a) on the selected wafer (3a), whereby the selected wafer frame (2a), the selected wafer (3a) and the selected mask (4a) are stacked to form the assembly (20a), the circumference of the selected wafer (3a) being securely held between the circumferences of the selected wafer frame (2a) and the selected mask (4a) so that the selected wafer (3a) can keep a good plainness in the assembly (20a); and
   step P5 of using the installation/uninstallation mechanism to select and lock the assembly on the assembly carrier section to be assembled, the control module driving the installation/uninstallation mechanism (62) on the robotic arm (6) to select and lock the assembly (20a) on the assembly carrier section (501) to be assembled.

5. The installation method as claimed in claim 4, further comprising:
   step P3 of using the installation/uninstallation mechanism to correct the installation/uninstallation operation face, the control module driving the installation/uninstallation mechanism (62) on the robotic arm (6) to adjust the position and making the respective rangefinder components (621) measure the distances between the rangefinder components (621) and the circumference of the assembly carrier section (501) on the carrier disc (50) in a position to be assembled and in a state to be assembled and ensure the distances are equal to each other, whereby the installation/uninstallation mechanism (62) can forward correspond to the assembly carrier sections (501) to be assembled in parallel thereto (with the same inclination angle) so as to correct the inclination angle of the installation/uninstallation operation face of the installation/uninstallation mechanism (62), the control module storing the data of the installation/uninstallation operation face after corrected; and
   step P4 of using the image capturing assembly to check the image of the circumference of the assembly carrier section on the carrier disc, which is to be assembled and correct the image capturing face, the control module driving the image capturing assembly (61) on the robotic arm (6) to check the image of the circumference of the assembly carrier section (501) to be assembled and the images of the respective holders (502) in accordance with the inclination angle and direction of the installation/uninstallation operation face after corrected and adjust the image capturing assembly (61) to truly correspond to the position of the assembly carrier section (501) to be assembled and the positions of the holders (502) of the assembly carrier section (501) so as to correct the position of the image capturing face of the image capturing assembly (61), the control module storing the data of the image capturing face after corrected, by means of the data of the image capturing face after corrected, the control module further correcting the relative position of the installation/uninstallation operation face so as to make the installation/uninstallation operation face accurately correspond to the position of the assembly carrier section (501) to be assembled and the positions of the holders (502) of the assembly carrier section (501).

6. An uninstallation method employing the installation/uninstallation device as claimed in claim 2, comprising:
   step S60 of moving the carrier disc on which an assembly is rested to a fixed operation position, the assembly (20a) being disposed and secured on a carrier disc (50) by multiple holders (502), the carrier disc (50) being moved to a predetermined fixed removing operation position;
   step P8 of using the installation/uninstallation mechanism to remove the assembly to be uninstalled onto the first displacement mechanism, the control module driving the installation/uninstallation mechanism (62) on the robotic arm (6) to remove the assembly (20a) on the carrier disc (50) to be uninstalled onto the pre-jig uninstallation section (121) of the first seat body (12);
   step S91 of using the mask installation/uninstallation mechanism to remove and recover a selected mask, the control module driving the mask removing assembly (43) of the mask installation/uninstallation mechanism 4 to approach upper side of the pre-jig uninstallation section (121) of the first seat body (12), an uppermost mask (4a) of the assembly (20a) to be uninstalled being moved onto the mask rest seat (41);

step S92 of using the wafer installation/uninstallation mechanism to remove and recover a selected wafer, the control module driving the wafer installation/uninstallation mechanism (3) to drive the wafer bracket (34) of the wafer removing assembly (33) so as to move the selected wafer (3a) onto the wafer rest seat (31); and step S93 of using the wafer frame installation/uninstallation mechanism to remove and recover a selected wafer frame, the control module driving the wafer frame removing assembly (23) of the wafer frame installation/uninstallation mechanism (2) to approach upper side of the pre-jig uninstallation section (121) of the first seat body (12) and move the wafer frame (2a) onto the wafer frame rest seat (21).

7. The uninstallation method as claimed in claim 6, after step S60 of moving the carrier disc on which the assembly is rested to a fixed operation position, further comprising:

step P6 of using the installation/uninstallation mechanism to correct the installation/uninstallation operation face, the control module driving the installation/uninstallation mechanism (62) on the robotic arm (6) to adjust the position and making the respective rangefinder components (621) measure the distances between the rangefinder components (621) and the circumference of the assembly (20a) on the carrier disc (50) to be uninstalled in a position to be removed and ensure the distances are equal to each other, whereby a preset installation/uninstallation operation face of the installation/uninstallation mechanism (62) can forward correspond to the assembly (20a) to be uninstalled in parallel so as to correct the inclination angle of the installation/uninstallation operation face of the installation/uninstallation mechanism (62), the control module storing the data of the installation/uninstallation operation face after corrected; and step P7 of using the image capturing assembly to check the image of the assembly on the carrier disc to be uninstalled and correct the image capturing face, the control module driving an image capturing assembly (61) on the robotic arm (6) to check the images of the assembly (20a) to be uninstalled and the images of the respective holders (502) in accordance with the inclination angle and direction of the installation/uninstallation operation face after corrected and adjust the image capturing assembly (61), whereby a preset image capturing face of the image capturing assembly (61) truly corresponds to the position of the assembly (20a) to be uninstalled and the positions of the holders (502) of the assembly (20a) so as to correct the position of the image capturing face of the image capturing assembly (61), the control module storing the data of the image capturing face after corrected, by means of the data of the image capturing face after corrected, the control module further correcting the relative position of the installation/uninstallation operation face so as to make the installation/uninstallation operation face accurately correspond to the position of the assembly (20a) to be uninstalled and the positions of the holders (502) of the assembly (20a).

8. The pre-jig wafer carrier disc installation/uninstallation device as claimed in claim 1, wherein the pre-jig uninstallation section (121) is a hollow hole, a support seat (13) being disposed in hollow hole, a channel (131) being formed on a top face of the support seat (13), multiple air-sucking orifices (132) being arranged on two sides of the channel (131) for sucking air, a support seat lifting assembly (133) being disposed under a bottom section of the support seat (13) to drive the support seat (13) to ascend/descend, the first seat body (1) being disposed on multiple first guide rails (11) extending in parallel to each other, multiple oppositely reciprocally movable holding slide seats (15) being disposed on a top face of the first seat body (11) around the pre-jig uninstallation section (121), each holding slide seat (15) having a poor-light surface on top side, a recessed arcuate section (151) being disposed on one side of each holding slide seat (15), which side is directed to the pre-jig uninstallation section (121), an image capturing unit (16) being disposed above one side of the first guide rails (11) for capturing images, an air nozzle (35) being disposed above the wafer rest seat (31), the air nozzle (35) having an air jet hole (351) for downward jetting air, multiple air sucking orifices (341) being disposed on a top face of the wafer bracket (34) for sucking air.

9. The pre-jig wafer carrier disc installation/uninstallation device as claimed in claim 1, wherein a wafer frame lifting assembly (22) is disposed under the wafer frame rest seat (21) for driving the wafer frame rest seat (21) to ascend/descend, the wafer frame removing assembly (23) having wafer frame removing slide seat (232), which can ascend/descend, a reciprocally movable wafer frame removing guide rail (231) being disposed on the wafer frame removing slide seat (232), a set of holding components (233) being disposed on the wafer frame removing guide rail (231) for holding one of the wafer frames (2a), a wafer lifting assembly (32) being disposed under the wafer rest seat (31) for driving the wafer rest seat (31) to ascend/descend, the wafer removing assembly (33) having multiple wafer removing guide rails (331) and a wafer removing slide seat (332) reciprocally movably disposed on the wafer removing guide rails (331), a vertically movable telescopic assembly (333) being disposed on the wafer removing slide seat (332), the wafer bracket (34) being disposed at the movable end of the telescopic assembly (333), a mask lifting assembly (42) being disposed under the mask rest seat (41) for driving the mask rest seat (41) to ascend/descend, the mask removing assembly (43) having a vertically movable mask removing slide seat (432), a transversely reciprocally movable mask removing guide rail (431) being disposed on the mask removing slide seat (432), a set of holding claws (433) being disposed on the mask removing guide rail (431) for holding the masks (4a).

10. An installation method employing the installation/uninstallation device as claimed in claim 1, comprising:

step P1 of respectively positioning the carrier disc, the wafer frames, the wafers and the masks in fixed positions, a vacant carrier disc (50) being disposed in a fixed predetermined operation (assembling) position and the wafer frames (2a), wafers (3a) and masks (4a) being respectively disposed in a fixed predetermined material supply position;

step S20 of using the wafer frame installation/uninstallation mechanism to pick and place a wafer frame in a first displacement mechanism, the control module driving the wafer frame installation/uninstallation mechanism (2) to pick a selected wafer frame (2a) from said wafer frames (2a) by removing the selected wafer frame (2a) from the fixed material supply position and place the selected wafer frame (2*a*) into the pre-jig uninstallation section (121) of the first seat body (12) to be supported thereby;

step P2 of using the wafer installation/uninstallation mechanism to select a wafer from said wafers and place into the selected wafer frame, the control module driving the wafer installation/uninstallation mechanism (3) to move the selected wafer (3*a*) onto the first displacement mechanism (1) for correction, then the selected wafer (3*a*) being placed into the selected wafer frame (2*a*);

step S30 of using the mask installation/uninstallation mechanism to select a mask from said masks and place into the selected wafer frame and overlay the selected mask onto the selected wafer to form an assembly, the control module driving the mask installation/uninstallation mechanism (4) to move the selected mask (4*a*) into the selected wafer frame (2*a*) and overlay the selected mask (4*a*) on the selected wafer (3*a*), whereby the selected wafer frame (2*a*), the selected wafer (3*a*) and the selected mask (4*a*) are stacked to form the assembly (20*a*), the circumference of the selected wafer (3*a*) being securely held between the circumferences of the selected wafer frame (2*a*) and the selected mask (4*a*) so that the selected wafer (3*a*) can keep a good plainness in the assembly (20*a*); and step P5 of using the installation/uninstallation mechanism to select and lock the assembly on the assembly carrier section to be assembled, the control module driving the installation/uninstallation mechanism (62) on the robotic arm (6) to select and lock the assembly (20*a*) on the assembly carrier section (501) to be assembled.

11. The installation method as claimed in claim 10, further comprising:

step P3 of using the installation/uninstallation mechanism to correct the installation/uninstallation operation face, the control module driving the installation/uninstallation mechanism (62) on the robotic arm (6) to adjust the position and making the respective rangefinder components (621) measure the distances between the rangefinder components (621) and the circumference of the assembly carrier section (501) on the carrier disc (50) in a position to be assembled and in a state to be assembled and ensure the distances are equal to each other, whereby the installation/uninstallation mechanism (62) can forward correspond to the assembly carrier sections (501) to be assembled in parallel thereto (with the same inclination angle) so as to correct the inclination angle of the installation/uninstallation operation face of the installation/uninstallation mechanism (62), the control module storing the data of the installation/uninstallation operation face after corrected; and step P4 of using the image capturing assembly to check the image of the circumference of the assembly carrier section on the carrier disc, which is to be assembled and correct the image capturing face, the control module driving the image capturing assembly (61) on the robotic arm (6) to check the image of the circumference of the assembly carrier section (501) to be assembled and the images of the respective holders (502) in accordance with the inclination angle and direction of the installation/uninstallation operation face after corrected and adjust the image capturing assembly (61) to truly correspond to the position of the assembly carrier section (501) to be assembled and the positions of the holders (502) of the assembly carrier section (501) so as to correct the position of the image capturing face of the image capturing assembly (61), the control module storing the data of the image capturing face after corrected, by means of the data of the image capturing face after corrected, the control module further correcting the relative position of the installation/uninstallation operation face so as to make the installation/uninstallation operation face accurately correspond to the position of the assembly carrier section (501) to be assembled and the positions of the holders (502) of the assembly carrier section (501).

12. The installation method as claimed in claim 11, wherein step P3 of using the installation/uninstallation mechanism to correct the installation/uninstallation operation face includes:

step S31 of using the robotic arm to drive the installation/uninstallation mechanism to approach the carrier disc by a preset installation/uninstallation standard value and using the rangefinder components to measure the distances between the rangefinder components and the circumferences of the assembly carrier sections to be assembled, the control module driving the installation/uninstallation mechanism (62) on the robotic arm (6) to move to upper side the carrier disc (50) by the direction and angle of the preset installation/uninstallation standard value and the rangefinder components (621) being used to measure the distances between the rangefinder components (621) and the circumference of the assembly carrier section (501) to be assembled; and step S32 of using the control module to adjust the position of the installation/uninstallation mechanism so as to make the measured distances of the respective rangefinder components equal to each other and correct the inclination angle of the installation/uninstallation operation face of the installation/uninstallation mechanism, the control module driving the installation/uninstallation mechanism (62) on the robotic arm (6) to adjust the position and making the respective rangefinder components (621) measure the distances between the rangefinder components (621) and the circumference of the assembly carrier section (501) to be assembled and ensure the distances are equal to each other so as to ensure that the installation/uninstallation operation face of the installation/uninstallation mechanism (62) forward corresponds to the assembly carrier section (501) to be assembled in parallel to each other so as to correct the inclination angle of the installation/uninstallation operation face of the installation/uninstallation mechanism (62), the control module storing the data of the installation/uninstallation operation face after corrected, step P4 of using the image capturing assembly to check the image of the circumference of the assembly carrier section on the carrier disc, which is to be assembled and correct the image capturing face including:

step S41 of using the robotic arm to drive the image capturing assembly to approach the carrier disc by an inclination angle equal to the inclination angle of the installation/uninstallation operation face after corrected and obtain the images of the positions of the assembly carrier sections to be assembled and the positions of the holders, the control module driving the image capturing assembly (61) on the robotic arm (6) to move to the upper side of the assembly carrier section (501) to be assembled by an inclination angle and direction identical to the inclination angle and direction of the installation/uninstallation operation face after corrected, the image capturing assembly (61) being used to obtain the image of the circumference of the assembly carrier section (501) to be assembled so as to ensure the position of the assembly carrier section (501) to be assembled and the positions of the respective holders (502); and step S42 of using the control module to adjust the position of the image capturing assembly to make the image capturing assembly truly correspond to the assembly carrier sections to be assembled so as to correct the position of image capturing face of the image capturing assembly and by means of the data of the image capturing face after corrected to correct the installation/uninstallation operation face so as to make the installation/uninstallation operation face forward accurately correspond to the assembly carrier sections to be assembled, the control module driving the image capturing assembly (61) on the robotic arm (6) to adjust the positions so as to ensure that the image capturing assembly (61) keeps truly corresponding to the assembly carrier section (501) to be assembled and the respective holders (502) so as to correct the position of the image capturing face of the image capturing assembly (61), the control module storing the data of the image capturing face after corrected and calculating the data of the corrected position of the installation/uninstallation mechanism so that the robotic arm (6) can again drive the installation/uninstallation mechanism (62) to move a position forward, accurately and plainly corresponding to the assembly carrier section (501) to be assembled.

13. The installation method as claimed in claim 10, wherein step P5 of using the installation/uninstallation mechanism to remove and lock the assembly on the assembly carrier section to be assembled includes:

step S51 of using the installation/uninstallation mechanism to unlock the holders, the control module driving the installation/uninstallation mechanism (62) on the robotic arm (6) to move to the upper side of the assembly carrier section (501) to be assembled and use the holder operation components (623) to release the respective holders (502);

step S52 of using the installation/uninstallation mechanism to remove the assembly onto the assembly carrier section to be assembled, the control module driving the installation/uninstallation mechanism (62) on the robotic arm (6) to move to upper side of the pre-jig uninstallation section (121) of the first seat body (12), the holding components (622) being used to hold the assembly (20*a*) and move the assembly (20*a*) onto the assembly carrier section (501) to be assembled; and step S53 of using the installation/uninstallation mechanism to lock the holders so as to secure the assembly, the control module driving the holder operation components (623) to lock the respective holders (502), whereby the assembly (20*a*) can be secured on the assembly carrier section (501) to be assembled.

14. The installation method as claimed in claim 13, further comprising step S54 of making the installation/uninstallation mechanism separate from the assembly and rotating the carrier disc after step S53 of using the installation/uninstallation mechanism to lock the holders so as to secure the assembly, after the holding components (622) release the assembly (20*a*), the control module driving the pivotally rotatable assembly (53) to drive the carrier disc (50) to pivotally rotate, whereby the assembly carrier section (501) on which the assembly (20*a*) is secured is pivotally rotated to a lateral position, while another vacant assembly carrier section (501) beside the assembly carrier section (501) is moved to the original position to be assembled to form another assembly carrier section (501) to be assembled.

15. The installation method as claimed in claim 10, wherein step P2 of using the wafer installation/uninstallation mechanism to select a wafer from said wafers and place into the selected wafer frame includes:

step S21 of using the wafer installation/uninstallation mechanism to carry and move the selected wafer and flatten the wafer in the moving process, the control module driving the wafer removing assembly (33) to drive the wafer bracket (34) to bear the selected wafer (3*a*) from the wafer rest seat (31), the selected wafer (3*a*) getting close to an air nozzle (35) disposed above the wafer rest seat (31), air being jetted from an air jet hole (351) of the air nozzle (35) to blow the selected wafer (3*a*) so as to flatten the selected wafer (3*a*), whereby the selected wafer (3*a*) can stably keep on the wafer bracket (34) in a true position;

step S22 of using the wafer installation/uninstallation mechanism to move the selected wafer onto the first displacement mechanism and correct the selected wafer, the wafer bracket (34) moving the selected wafer (3*a*) to upper side of the pre-jig uninstallation section (121) of the first seat body (12), an image capturing unit (16) being used to obtain the image of the selected wafer (3*a*) so as to check whether the selected wafer (3*a*) is positioned in a true position, two holding slide seats (15) having poor-light surfaces being cooperatively moved toward each other, whereby the two recessed arcuate sections (151) preset on the two holding slide seats (15) are combined to form a circular hole corresponding to the pre-jig uninstallation section (121), then the control module driving the wafer removing assembly (33) to drive the wafer bracket (34) to correct the position, whereby the selected wafer (3*a*) is corrected and positioned in a true position corresponding to the center of the wafer frame (2*a*); and step S23 of using the first displacement mechanism to move the selected wafer into the selected wafer frame, the two holding slide seats (15) being separated and a support seat lifting assembly (133) driving a support seat (13) to ascend, whereby the wafer bracket (34) in the channel (131) disposed on the support seat (13) is separated from the selected wafer (3*a*), then the wafer removing assembly (33) driving the wafer bracket (34) to move away from the upper side of the first seat body (12), then the support seat lifting assembly (133) driving the support seat (13) to descend to move the selected wafer (3*a*) downward into the selected wafer frame (2*a*).

16. An uninstallation method employing the installation/uninstallation device as claimed in claim 1, comprising:

step S60 of moving the carrier disc on which an assembly is rested to a fixed operation position, the assembly (20*a*) being disposed and secured on a carrier disc (50) by multiple holders (502), the carrier disc (50) being moved to a predetermined fixed removing operation position;

step P8 of using the installation/uninstallation mechanism to remove the assembly to be uninstalled onto the first displacement mechanism, the control module driving the installation/uninstallation mechanism (62) on the robotic arm (6) to remove the assembly (20*a*) on the carrier disc (50) to be uninstalled onto the pre-jig uninstallation section (121) of the first seat body (12);

step S91 of using the mask installation/uninstallation mechanism to remove and recover the selected mask, the control module driving the mask removing assembly (43) of the mask installation/uninstallation mechanism (4) to approach upper side of the pre-jig uninstallation section (121) of the first seat body (12), an uppermost mask (4a) of the assembly (20a) to be uninstalled being moved onto the mask rest seat (41);

step S92 of using the wafer installation/uninstallation mechanism to remove and recover a selected wafer, the control module driving the wafer installation/uninstallation mechanism (3) to drive the wafer bracket (34) of the wafer removing assembly (33) so as to move the selected wafer (3a) onto the wafer rest seat (31); and step S93 of using the wafer frame installation/uninstallation mechanism to remove and recover a selected wafer frame, the control module driving the wafer frame removing assembly (23) of the wafer frame installation/uninstallation mechanism (2) to approach upper side of the pre-jig uninstallation section (121) of the first seat body (12) and move the selected wafer frame (2a) onto the wafer frame rest seat (21).

17. The uninstallation method as claimed in claim 16, after step S60 of moving the carrier disc on which the assembly is rested to a fixed operation position, further comprising:

step P6 of using the installation/uninstallation mechanism to correct the installation/uninstallation operation face, the control module driving the installation/uninstallation mechanism (62) on the robotic arm (6) to adjust the position and making the respective rangefinder components (621) measure the distances between the rangefinder components (621) and the circumference of the assembly (20a) on the carrier disc (50) to be uninstalled in a position to be removed and ensure the distances are equal to each other, whereby a preset installation/uninstallation operation face of the installation/uninstallation mechanism (62) can forward correspond to the assembly (20a) to be uninstalled in parallel so as to correct the inclination angle of the installation/uninstallation operation face of the installation/uninstallation mechanism (62), the control module storing the data of the installation/uninstallation operation face after corrected; and step P7 of using the image capturing assembly to check the image of the assembly on the carrier disc to be uninstalled and correct the image capturing face, the control module driving an image capturing assembly (61) on the robotic arm (6) to check the images of the assembly (20a) to be uninstalled and the images of the respective holders (502) in accordance with the inclination angle and direction of the installation/uninstallation operation face after corrected and adjust the image capturing assembly (61), whereby a preset image capturing face of the image capturing assembly (61) truly corresponds to the position of the assembly (20a) to be uninstalled and the positions of the holders (502) of the assembly (20a) so as to correct the position of the image capturing face of the image capturing assembly (61), the control module storing the data of the image capturing face after corrected, by means of the data of the image capturing face after corrected, the control module further correcting the relative position of the installation/uninstallation operation face so as to make the installation/uninstallation operation face accurately correspond to the position of the assembly (20a) to be uninstalled and the positions of the holders (502) of the assembly (20a).

18. The uninstallation method as claimed in claim 16, wherein step P8 of using the installation/uninstallation mechanism to remove the assembly to be uninstalled onto the first displacement mechanism includes:

step S81 of using the installation/uninstallation mechanism to unlock the holders, the control module driving the installation/uninstallation mechanism (62) on the robotic arm (6) to move to upper side of the assembly (20a) to be uninstalled and the holder operation components (623) releasing the holders (502); and step S82 of using the installation/uninstallation mechanism to remove the assembly to be uninstalled onto the first seat body, the control module driving the installation/uninstallation mechanism (62) on the robotic arm (6) to make the holding components (622) hold the assembly (20a) to be uninstalled, then the assembly (20a) to be uninstalled being moved onto the pre-jig uninstallation section (121) of the first seat body (12).

19. The uninstallation method as claimed in claim 18, after step S82 of using the installation/uninstallation mechanism to remove the assembly to be uninstalled onto the first seat body, further comprising step S83 of making the installation/uninstallation mechanism separate the assembly to be uninstalled and rotating the carrier disc, after the holding components (622) release the assembly (20a) to be uninstalled, the control module driving the pivotally rotatable assembly (53) to drive the carrier disc (50) to pivotally rotate, whereby the section of the carrier disc (50) from which the assembly (20a) has been removed is pivotally rotated to a lateral position, while the assembly (20a) on another lateral side is moved to the position to be removed to form another assembly (20a) to be uninstalled.

20. The uninstallation method as claimed in claim 16, wherein in step S60 of moving the carrier disc on which the assembly is rested to a fixed operation position, the carrier disc (50) is placed on the second seat body (52) of the second displacement mechanism (5) at one end distal from the first displacement mechanism (1), the control module driving the second seat body (52) of the second displacement mechanism (5) to drive the carrier disc (50) to move to a fixed removing operation position near the first displacement mechanism (1).

21. The uninstallation method as claimed in claim 16, wherein in step S92 of using the wafer installation/uninstallation mechanism to remove and recover the wafer, before the wafer bracket (34) removes the selected wafer (3a), the control module driving a support seat lifting assembly (133) of the first displacement mechanism (1) to drive a support seat (13) to bear and lift the selected wafer (3a) in the pre-jig uninstallation section (121), the air-sucking orifices (132) preset on the support seat (13) sucking and securing the selected wafer (3a) and a channel (131) on the support seat (13) being exposed to outer side, whereby the control module can conveniently drive the wafer removing assembly (33) of the wafer installation/uninstallation mechanism (3) to make the wafer bracket (34) extend into the channel (131) of the support seat (13), the air sucking orifices (341) preset on the wafer bracket (34) sucking the selected wafer (3a), while the air-sucking orifices (132) stopping sucking air, the support seat lifting assembly (133) driving the support seat (13) to descend, whereby the wafer bracket 34 bears and removes the selected wafer (3a).

* * * * *